(12) United States Patent
Ishizuya et al.

(10) Patent No.: US 7,002,730 B2
(45) Date of Patent: Feb. 21, 2006

(54) MIRROR DEVICE, OPTICAL SWITCH, THIN FILM ELASTIC STRUCTURE, AND THIN ELASTIC STRUCTURE PRODUCING METHOD

(75) Inventors: Tohru Ishizuya, Tokyo (JP); Keiichi Akagawa, Kamakura (JP)

(73) Assignee: Nikon Corporation, Tokyo (JP)

( * ) Notice: Subject to any disclaimer, the term of this patent is extended or adjusted under 35 U.S.C. 154(b) by 109 days.

(21) Appl. No.: 10/473,532

(22) PCT Filed: Apr. 18, 2002

(86) PCT No.: PCT/JP02/03858

§ 371 (c)(1),
(2), (4) Date: Sep. 29, 2003

(87) PCT Pub. No.: WO02/086586

PCT Pub. Date: Oct. 31, 2002

(65) Prior Publication Data

US 2004/0114259 A1 Jun. 17, 2004

(30) Foreign Application Priority Data

Apr. 19, 2001 (JP) .............................. 2001-120440
Feb. 8, 2002 (JP) .............................. 2002-031615

(51) Int. Cl.
*G02B 26/08* (2006.01)
*G02F 1/29* (2006.01)
(52) U.S. Cl. ...................... 359/298; 359/224
(58) Field of Classification Search ................ 359/290, 359/291, 298, 223, 224; 310/309; 257/415
See application file for complete search history.

(56) References Cited

U.S. PATENT DOCUMENTS

| 5,920,421 | A  | * | 7/1999 | Choi .......................... 359/291 |
| 6,267,605 | B1 | * | 7/2001 | Biegelsen .................... 439/81 |
| 6,337,760 | B1 | * | 1/2002 | Huibers et al. ............. 359/291 |
| 6,366,414 | B1 |   | 4/2002 | Aksyuk et al. |
| 6,381,381 | B1 |   | 4/2002 | Takeda et al. |
| 6,504,643 | B1 | * | 1/2003 | Peeters et al. ............. 359/290 |

(Continued)

FOREIGN PATENT DOCUMENTS

EP  0 949 527 A1  10/1999

(Continued)

*Primary Examiner*—Mark A. Robinson
(74) *Attorney, Agent, or Firm*—Frishauf, Holtz, Goodman & Chick, P.C.

(57) ABSTRACT

The mirror device has a mirror 2, and a supporting mechanism which elastically supports the mirror 2 on a substrate 1 in a state in which the mirror floats from the substrate 1, so that the mirror can be inclined in an arbitrary direction. The supporting mechanism has three supporting parts 3A, 3B and 3C that mechanically connect the substrate 1 and mirror 2. Each of the supporting parts 3A, 3B and 3C has one or more plate spring parts 5 that are constructed from a thin film consisting of one or more layers. One end portion of each plate spring part 5 is connected to the substrate 1 via a leg part 9 which has a rising part that rises from the substrate 1. The other end portion of the plate spring part 5 is mechanically connected to the mirror 2 via a connecting part which has a rising part that rises from this other end portion. The mirror 2 is supported on the substrate 1 only via the plate spring part 5 of the respective 3A, 3B and 3C. As a result, compactness and mass production characteristics can be greatly improved while maintaining superior optical characteristics.

7 Claims, 32 Drawing Sheets

U.S. PATENT DOCUMENTS

| | | | |
|---|---|---|---|
| 6,522,445 B1 * | 2/2003 | Kleytman | 359/224 |
| 6,532,093 B1 | 3/2003 | Sun et al. | |
| 6,785,039 B1 * | 8/2004 | Wendland, Jr. | 359/290 |

FOREIGN PATENT DOCUMENTS

| | | |
|---|---|---|
| EP | 1 041 036 A1 | 10/2000 |
| JP | 07-084196 A | 3/1995 |
| JP | 08-320441 A | 12/1996 |
| JP | 11-183810 A | 7/1999 |
| JP | 2001-009798 A | 1/2001 |
| WO | WO 95/20827 A1 | 8/1995 |

* cited by examiner

MIRROR DEVICE, OPTICAL SWITCH, THIN FILM ELASTIC STRUCTURE, AND THIN ELASTIC STRUCTURE PRODUCING METHOD This application is a U.S. National Phase Application under 35 U.S.C. 371 of International Application PCT/JP02/03858, filed Apr. 18, 2002.

TECHNICAL FIELD

The present invention relates to a thin-film elastic structural body and a method for manufacturing the same, and to a mirror device and an optical switch using this thin-film elastic structural body

BACKGROUND ART

The importance of optical switches used to switch optical paths has increased with the development of optical communication technology in recent years. Optical switches include mechanical-type optical switches which have movable parts such as mirrors and electronic-type optical switches which utilize the electro-optical effect, etc. Mechanical-type optical switches are superior to electronic-type optical switches in terms of optical characteristics such as insertion loss and crosstalk, and are superior in terms of essential basic characteristics. However, mechanical-type optical switches are conspicuously inferior to electronic-type optical switches in terms of compactness and mass production characteristics.

With the development of MEMS (micro-electro-mechanical system) technology in recent years, however, mechanical-type optical switches which utilize this technology to improve the degree of integration and mass production characteristics have been proposed.

Conventional mechanical-type optical switches utilizing such MEMS technology use the same principle as that of the switch disclosed in Japanese Patent Application Kokoku No. S56-36401 as the optical path switching principle; in such switches, mirrors capable of a linear motion that allows the mirrors to advance into the optical paths and withdraw from the optical paths are disposed in the form of a two-dimensional matrix. Specifically, such optical switches are constructed from a substrate on which M×N mirrors are disposed, M optical input optical fibers that are disposed along one side of the substrate, and N optical output optical fibers that are disposed along another side of the substrate that is perpendicular to the above-mentioned first side of the substrate. The M×N mirrors are disposed on the substrate in the form of a two-dimensional matrix so that the mirrors are capable of linear motion in the normal direction of the substrate, thus allowing the mirrors to advance and withdraw with respect to the intersection points between the emission light paths of the M optical input optical fibers and the incident light paths of the N optical output optical fibers.

However, in the case of conventional mechanical-type optical switches using the above-mentioned MEMS technology, M×N mirrors disposed in the form of a two-dimensional matrix are required in order to switch light from the M optical input optical fibers to the N optical output optical fibers, so that the number of mirrors is increased. For example, if the light from 1,000 optical input optical fibers is to be switched to 1,000 optical output optical fibers, 1,000,000 mirrors must be disposed on the surface of the substrate in the form of a two-dimensional matrix. Accordingly, although compactness and mass production characteristics have been improved (compared to earlier mechanical-type switches) by the utilization of MEMS technology in the above-mentioned conventional mechanical-type optical switches, this improvement has not always been sufficient.

DISCLOSURE OF THE INVENTION

The present invention was devised in light of such facts; one object of the present invention is to provide an optical switch which makes it possible to achieve an even greater improvement in compactness and mass production characteristics compared to the above-mentioned conventional optical switches, while maintaining superior optical characteristics by switching the optical paths utilizing mirrors.

Furthermore, another object of the present invention is to provide a mirror device and a thin-film elastic structural body that are suited for such an optical switch, etc., and a method for manufacturing such a thin-film elastic structural body.

The mirror device constituting the first invention of the present application is a mirror device which comprises a substrate, mirrors, and a supporting mechanism that elastically supports the above-mentioned mirrors with respect to the above-mentioned substrate so that the mirrors float from the above-mentioned substrate and so that the mirrors can be inclined in an arbitrary direction, and in which the above-mentioned mirrors are inclined with respect to the above-mentioned substrate in a direction and by an amount of inclination corresponding to a supplied driving signal; in this mirror device, the above-mentioned supporting mechanism has one or more supporting parts which mechanically connect the above-mentioned substrate and the above-mentioned mirrors, each of the above-mentioned supporting parts has one or more plate spring parts constructed from a thin film of one or more layers, one end portion of at least one of the above-mentioned one or more plate spring parts of each of the above-mentioned supporting parts is mechanically connected to the above-mentioned substrate via a leg part which has a rising part that rises from the above-mentioned substrate, and the above-mentioned mirrors are supported on the above-mentioned substrate only via the above-mentioned one or more plate spring parts of each of the above-mentioned supporting parts.

In this first invention, the supporting mechanism which elastically supports the mirrors on the above-mentioned substrate so that the mirrors can be inclined in any desired direction in a state in which the mirrors float from the above-mentioned substrate has the above-mentioned structure utilizing plate spring parts constructed from thin films. Accordingly, the structure is simple, and can be simply manufactured using film formation techniques used in semiconductor manufacturing processes, etc. Furthermore, since one end portion of at least one plate spring part is mechanically connected to the substrate via a leg part which has a rising part, the height of each mirror (i.e., the distance between the mirror and the substrate) can be gained by means of the leg part. Accordingly, even if the mirrors are relatively large, the angle at which the mirrors can be inclined can be set as a relatively large angle.

First of all, in the above-mentioned first invention, the above-mentioned leg part can be constructed from a thin film consisting of one or more layers in at least one of the supporting parts among the above-mentioned one or more supporting parts. In this case, since the leg part is constructed from a thin film, manufacture of the leg part is easy; furthermore, there is a degree of freedom in elastic deformation even in the vicinity of the leg part (though this degree of freedom is small), so that the stress applied to the locations of mechanical connections between the respective parts can be reduced.

Second, in the above-mentioned first invention, one end portion of at least one plate spring part among the above-mentioned one or more plate spring parts can be mechanically connected to the above-mentioned mirror via a connecting part which has a rising part that rises from the above-mentioned end portion in at least one supporting part among the above-mentioned one or more supporting parts. In this case, since one end portion of at least one plate spring part is mechanically connected to the mirror via a connecting part which has a rising part that rises from this end portion, height of the mirror can be gained by means of this connecting part as well. Accordingly, even if the mirrors are relatively large, the angle at which the mirrors can be inclined can be set as a relatively large angle. In this second case, the above-mentioned connecting part can be constructed from a thin film consisting of one or more layers. In this case, since the connecting part that has a rising part (the connecting part with the mirror) is constructed from a thin film, manufacture is easy; furthermore, there is a degree of freedom in elastic deformation even in the vicinity of this connecting part (though this degree of freedom is small), so that the stress applied to the locations of mechanical connections between the respective parts can be reduced.

Third, in the above-mentioned first invention, the above-mentioned plate spring part which has one end portion mechanically connected to the above-mentioned substrate via the above-mentioned leg part in at least one supporting part among the above-mentioned one or more supporting parts may bend toward the opposite side from the above-mentioned substrate, at least in a state in which the above-mentioned driving signal is not supplied. In this case, since the above-mentioned plate spring part that is mechanically connected to the substrate via the leg part is bent toward the opposite side from the substrate, height of the mirror can be gained by means of this bending as well. Accordingly, even if the mirrors are relatively large, the angle at which the mirrors can be inclined can be increased even further.

Fourth, in the above-mentioned first invention, each of the above-mentioned one or more plate spring parts can be constructed in the form of a straight line or curved line in a plan view seen from the normal direction of the plane of the above-mentioned substrate in at least one supporting part among the above-mentioned one or more supporting parts. Thus, the plate spring parts can be constructed with either a rectilinear shape of curvilinear shape as seen in a plan view.

Furthermore, in the above-mentioned first invention, the above-mentioned first through fourth items may be arbitrarily combined.

The mirror device constituting the second invention of the present application is a mirror device which comprises a substrate, mirrors, and a supporting mechanism that elastically supports the above-mentioned mirrors with respect to the above-mentioned substrate so that the mirrors float from the above-mentioned substrate and so that the mirrors can be inclined in an arbitrary direction, and in which the above-mentioned mirrors are inclined with respect to the above-mentioned substrate in a direction and by an amount of inclination corresponding to a supplied driving signal; in this mirror device, the above-mentioned supporting mechanism has one or more supporting parts that mechanically connect the above-mentioned substrate and the above-mentioned mirrors, each of the above-mentioned supporting parts has a plurality of plate spring parts constructed from a thin film consisting of one or more layers, two or more of the plate spring parts among the above-mentioned plurality of plate spring parts of each of the above-mentioned supporting parts are mechanically connected to each other in series, and one end portion of the plate spring part corresponding to one end portion of the mechanical connection route formed by the above-mentioned two or more plate spring parts of each of the above-mentioned supporting parts is mechanically connected to the above-mentioned substrate via a leg part which has a rising part that rises from the above-mentioned substrate.

In this second invention, advantages similar to those of the above-mentioned first invention are obtained. Furthermore, in this second invention, since two or more of the plate spring parts in the supporting parts are mechanically connected to each other in series, the end portions of the two or more plate spring parts are successively connected so that a structure which forms a single mechanical connection route overall is realized, so that elastic support characteristics that appropriately combine the characteristics of the respective plate springs can be obtained on the whole, and so that the degree of freedom of design in obtaining the desired elastic support characteristics is increased. Furthermore, other plate spring parts may be appropriately mechanically connected in parallel with respect to the plate spring parts that are mechanically connected in series.

The mirror device constituting the third invention of the present application is the above-mentioned second invention, wherein the above-mentioned mirrors are supported on the above-mentioned substrate only via the above-mentioned plurality of plate spring parts of each of the above-mentioned supporting parts.

In this third invention, since the mirrors are supported on the substrate only via the plate spring parts, separate supporting means for supporting the mirrors on the substrate other than the mechanical connection route between the mirrors and substrate between which the plate spring parts are interposed are unnecessary, which is desirable.

The mirror device constituting the fourth invention of the present application is the above-mentioned second or third invention, wherein the above-mentioned leg parts are constructed from a thin film consisting of one or more layers in at least one supporting part among the above-mentioned one or more supporting parts.

In this fourth invention, since the leg parts are constructed from thin films, manufacture of the leg parts is easy; furthermore, there is a degree of freedom in elastic deformation even in the vicinity of the leg parts (though this degree of freedom is small), so that the stress applied to the locations of mechanical connections between the respective parts can be reduced.

The mirror device constituting the fifth invention of the present application is any of the above-mentioned second through fourth inventions, wherein one end portion of the plate spring part corresponding to the other end portion of the mechanical connection route formed by the above-mentioned two or more plate spring parts in at least one supporting part among the above-mentioned one or more supporting parts is mechanically connected to the above-mentioned mirror via a connecting part which has a rising part that rises from the above-mentioned end portion.

In this fifth invention, since one end portion of at least one plate spring part is mechanically connected to the mirror via a connecting part which has a rising part that rises from this end portion, height of the mirror can be gained by means of this connecting part as well. Accordingly, even if the mirrors are relatively large, the angle at which the mirrors can be inclined can be increased even further.

The mirror device constituting the sixth invention of the present application is any of the above-mentioned second through fifth inventions, wherein the mutual mechanical connection between the end portions of at least one pair of plate spring parts among the mechanical connections between the end portions of the above-mentioned two or more spring plate parts in at least one supporting part among the above-mentioned one or more supporting parts is accomplished by the end portion of the plate spring part on the side of the above-mentioned substrate being mechanically connected to the end portion of the plate spring part on the side of the above-mentioned mirror via a connecting part which has a rising part that rises from this end portion on the side of the above-mentioned substrate.

In this sixth invention, since the mutual mechanical connection between the end portions of at least one pair of plate spring parts is accomplished by the end portion of the plate spring part on the side of the substrate being mechanically connected to the end portion of the plate spring part on the side of the mirror via a connecting part which has a rising part that rises from this end portion on the side of the substrate, height of the mirror can also be gained by means of this connecting part. Accordingly, even if the mirrors are relatively large, the angle at which the mirrors can be inclined can be increased even further.

The mirror device of the seventh invention of the present application is the above-mentioned fifth or sixth invention, wherein the above-mentioned connecting part is constructed from a thin film consisting of one or more layers.

In this seventh invention, since the connecting part which has a rising part (the connecting part with the mirror and/or between the plate spring parts) is constructed from a thin film, manufacture of the connecting part is easy; furthermore, there is a degree of freedom in elastic deformation even in the vicinity of this connecting part (though this degree of freedom is small), so that the stress applied to the locations of mechanical connections between the respective parts can be reduced.

The mirror device constituting the eighth invention of the present application is any of the second through seventh inventions, wherein the above-mentioned plate spring part which has one end portion mechanically connected to the above-mentioned substrate via the above-mentioned leg part in at least one supporting part among the above-mentioned one or more supporting parts is bent toward the opposite side from the above-mentioned substrate at least in a state in which the above-mentioned driving signal is not supplied.

In this eighth invention, since the above-mentioned plate spring part which is mechanically connected to the substrate via the leg part is bent toward the opposite side from the substrate, height of the mirror can also be gained as a result of this bending. Accordingly, even if the mirrors are relatively large, the angle at which the mirrors can be inclined can be increased even further.

The mirror device constituting the ninth invention of the present application is the above-mentioned eighth invention, wherein at least one plate spring part among the above-mentioned two or more plate spring parts in at least one of the above-mentioned supporting parts is bent toward the above-mentioned substrate at least in a state in which the above-mentioned driving signal is not supplied.

In the above-mentioned eighth invention, the above-mentioned plate spring part which is mechanically connected to the substrate via the leg part is bent toward the opposite side from the substrate; accordingly, for example, if all of the other spring plate parts that are connected in series to this plate spring part are not bent, or are bent toward the opposite side from the substrate, then the end portion of the plate spring part that is to be connected to the mirror is inclined greatly with respect to the plane of the substrate. In this case, the stress that is applied to the location of the mechanical connection between the end portion of this plate spring part and the mirror is increased, which is undesirable. On the other hand, if at least one plate spring part is bent toward the substrate, the end portion of the plate spring part that is to be connected to the mirror can be oriented so that this end portion is parallel or close to parallel with the plane of the substrate, so that the above-mentioned stress can be reduced.

The mirror device constituting the tenth invention of the present application is any of the above-mentioned second through ninth inventions, wherein the shape formed by the above-mentioned two or more plate spring parts overall in at least one supporting part among the above-mentioned one or more supporting parts is a shallow "V" shape, or a shape consisting of connected shallow "V" shapes, i.e., a zig-zag shape, as seen in a side view of the overall assembly from the same direction, or as seen in side views from appropriate specified directions for each portion of the assembly.

In this tenth invention, a structure resembling that of a so-called pantagraph can be realized, so that the stress applied to the locations of connections between the respective parts can be reduced.

The mirror device constituting the eleventh invention of the present application is any of the second through ninth inventions, wherein each of the above-mentioned two or more plate spring parts in at least one supporting part among the above-mentioned one or more supporting parts is constructed in a linear shape as seen in a plan view from the normal direction of the plane of the above-mentioned substrate, the shape formed by the above-mentioned two or more plate spring parts overall in the above-mentioned (at least one) supporting part is a shallow "V" shape or a shape consisting of connected shallow "V" shapes, as seen in a side view of the overall assembly from the same direction, or as seen in side views from appropriate specified directions for each portion of the assembly, and the respective parts that form a shallow "V" shape in the above-mentioned side view in the above-mentioned two or more plate spring parts in the above-mentioned (at least one) supporting part respectively form linear shapes as seen in a plan view from the normal direction of the plane of the above-mentioned substrate.

This eleventh invention shows one example of a case in which the structure of the above-mentioned tenth invention is realized using spring plate parts that are linear in a plan view.

The mirror device constituting the twelfth invention of the present application is the above-mentioned tenth or eleventh invention, wherein the respective bending directions and lengths of the above-mentioned two or more plate spring parts are set so that in at least one of the above-mentioned supporting parts, one end portion of the plate spring part, this end portion being mechanically connected to the above-mentioned mirror, and the end portion of the plate spring part corresponding to the turning point of the above-mentioned side-view shape formed by the above-mentioned two or more plate spring parts in the above-mentioned (at least one) supporting part, are substantially parallel to the plane of the above-mentioned substrate.

If the bending directions and lengths of each of the two or more plate spring parts are set as in this twelfth invention, the stress that is applied to the locations of mechanical connections between the respective parts can be reduced even further.

The mirror device constituting the thirteenth invention of the present application is any of the above-mentioned second through ninth inventions, wherein the shape formed overall by the above-mentioned two or more plate spring parts in at least one supporting part among the above-mentioned one or more supporting parts is a spiral shape which constitutes an arbitrary shape as seen in a plan view from the normal direction of the plane of the above-mentioned substrate. This thirteenth invention shows one example of the overall shape formed by the plate spring parts that are mechanically connected in series.

The mirror device constituting the fourteenth invention of the present application is any of the above-mentioned second through thirteenth inventions, wherein in at least one supporting part among the above-mentioned one or more supporting parts, one end portion of the plate spring part, this end portion being mechanically connected to the above-mentioned substrate via the above-mentioned leg part, and one end portion of the plate spring part, this end portion being mechanically connected to the above-mentioned mirror, are positioned in substantially the same position in a plan view seen from the normal direction of the plane of the above-mentioned substrate.

In this fourteenth invention, since one end portion and the other end portion of the mechanical connection route formed by the two or more plate spring parts that are mechanically connected in series are positioned in substantially the same position as seen in a plan view, the stress that is applied to the locations of the mechanical connections between the respective parts can be reduced even further.

The mirror device constituting the fifteenth invention of the present application is any of the above-mentioned second through fourteenth inventions, wherein in at least one supporting part among the above-mentioned one or more supporting parts, the bending directions and lengths of each of the above-mentioned two or more plate spring parts are set so that the end portion of the plate spring part, this end portion being mechanically connected to the above-mentioned mirror, is substantially parallel to the plane of the above-mentioned substrate.

In this fifteenth invention, since the end portion of the plate spring part in which this end portion is mechanically connected to the above-mentioned mirror is substantially parallel to the plane of the above-mentioned substrate, the stress that is applied to the location of the mechanical connection between the end portion of this plate spring part and the mirror can be reduced.

The mirror device constituting the sixteenth invention of the present application is any of the above-mentioned first through fifteenth inventions, wherein at least one supporting part among the above-mentioned one or more supporting parts supports the above-mentioned substrate side of the above-mentioned mirror.

In this sixteenth invention, since the supporting part supports the substrate side of the mirror, the structure is simple, and height of the mirror can be gained. Of course, in the above-mentioned first through fifteenth inventions, the supporting part may also support the opposite side of the mirror from the substrate. In this case, the supporting part supports the mirror in a suspended state.

The mirror device constituting the seventeenth invention of the present application is any of the above-mentioned first through sixteenth inventions, wherein at least one supporting part among the above-mentioned one or more supporting parts is disposed in a position which is such that at least the major portion of the supporting mechanism is hidden by the above-mentioned mirror in a plan view in which the above-mentioned substrate is seen from the side of the above-mentioned mirror.

In this seventeenth invention, since the supporting part is disposed in a position which is such that the major portion of the supporting mechanism is hidden by the mirror in a plan view, the area on the substrate occupied by the supporting mechanism and mirror can be reduced, so that the mirror device can be made more compact. Especially in cases where a plurality of elements consisting of mirrors and supporting mechanisms are disposed in one dimension or two dimensions as in the twentieth invention (described later), the degree of integration of these elements can be increased, so that the mirror device can be made more compact.

The mirror device constituting the eighteenth invention of the present application is any of the above-mentioned first through seventeenth inventions, wherein the number of the above-mentioned one or more supporting parts is N (with N being an integer of 3 or greater), and these N supporting parts respectively support areas in the vicinity of N locations on the above-mentioned mirror that form angles of 360°/N on a circle with a specified radius centered on the center of the above-mentioned mirror.

If the number of supporting parts is set at three or greater, and the support locations of the mirror by these supporting parts are set as in this eighteenth invention, the mirror can be supported more stably so that the mirror can be inclined in an arbitrary direction, which is desirable.

The mirror device constituting the nineteenth invention of the present application is any of the above-mentioned first through seventeenth inventions, wherein the number of the above-mentioned one or more supporting parts is one or two, and the above-mentioned mirror can be inclined in an arbitrary direction by the flexing and torsion of the above-mentioned plate spring parts of the above-mentioned one or two supporting parts.

In this nineteenth invention, since the number of supporting parts is small, the structure is simpler.

In any of the above-mentioned first through nineteenth inventions, the above-mentioned mirrors may be driven by (for example) an electrostatic force, magnetic force or Lorenzo force generated by the above-mentioned driving signals. Furthermore, some other driving systems may also be used. For example, a driving system utilizing the deformation caused by thermal expansion of at least two superimposed layers of different substances that have different coefficients of expansion may be employed. In this case, for example, heat for the above-mentioned deformation can be provided by the absorption of light or by passing an electric current through an electrical resistance part, and the amount of irradiating light or the amount of electric current that is passed through can be used as a driving signal.

The mirror device constituting the twentieth invention of the present application is any of the above-mentioned first through nineteenth inventions, wherein in at least one supporting part among the above-mentioned one or more supporting parts, at least one plate spring part among the above-mentioned one or more plate spring parts or the above-mentioned plurality of plate spring parts has an electrode part which causes an electrostatic force corresponding to the above-mentioned driving signal to act on this plate spring part.

In this twentieth invention, an electrostatic force which acts on the plate spring part can be used as the driving force that drives the mirror.

The mirror device constituting the twenty-first invention of the present application is any of the above-mentioned first through twentieth inventions, wherein in at least one supporting part among the above-mentioned one or more supporting parts, at least one plate spring part among the above-mentioned one or more plate spring parts or the above-mentioned plurality of plate spring parts has an electrode part which causes an electrostatic force corresponding to the above-mentioned driving signal to act on this plate spring part, and an electrode part which generates the above-mentioned electrostatic force between itself and the above-mentioned electrode part of the above-mentioned (at least one) plate spring part is also used as the above-mentioned mirror, or is disposed on the above-mentioned mirror.

In this twenty-first invention, an electrostatic force that acts between the plate spring part and the mirror can be used as the driving force that drives the mirror.

The mirror device constituting the twenty-second invention of the present application is any of the above-mentioned first through twenty-first inventions, wherein in at least one supporting part among the above-mentioned one or more supporting parts, at least one plate spring part among the above-mentioned one or more plate spring parts or the above-mentioned plurality of plate spring parts has an electrode part which causes an electrostatic force corresponding to the above-mentioned driving signal to act on this plate spring part, and an electrode part which generates the above-mentioned electrostatic force between itself and the above-mentioned electrode part of the above-mentioned (at least one) plate spring part is also used as the above-mentioned substrate, or is fastened to the above-mentioned substrate.

In this twenty-second invention, an electrostatic force that acts between the plate spring part and the substrate, etc., can be used as the driving force that drives the mirror.

The mirror device constituting the twenty-third invention of the present application is any of the above-mentioned first through twenty-second inventions, wherein in at least one supporting part among the above-mentioned one or more supporting parts, the end portions of at least one pair of plate spring parts among the above-mentioned one or more plate spring parts or the above-mentioned plurality of plate spring parts are mechanically connected to each other and face each other, the above-mentioned (at least one) pair of plate spring parts respectively have electrode parts that are used to cause an electrostatic force corresponding to the above-mentioned driving signal to act on these plate spring parts, and an electrostatic force corresponding to the above-mentioned driving signal is caused to act between the above-mentioned electrode of one of the plate spring parts of the above-mentioned (at least one) pair of plate spring parts and the above-mentioned electrode part of the other plate spring part of the above-mentioned (at least one) pair of plate spring parts.

In this twenty-third invention, an electrostatic force acting between the plate spring parts can be used as the driving force that drives the mirror.

The mirror device constituting the twenty-fourth invention of the present application is any of the above-mentioned first through twenty-third inventions, wherein in at least one supporting part among the above-mentioned one or more supporting parts, the end portions of at least one pair of plate spring parts among the above-mentioned one or more plate spring parts or the above-mentioned plurality of plate spring parts are mechanically connected to each other and face each other, the above-mentioned (at least one) pair of plate spring parts respectively have electrode parts that are used to cause an electrostatic force corresponding to the above-mentioned driving signal to act on these plate spring parts, a plate-form part is mechanically connected to the end portions of the above-mentioned (at least one) pair of plate spring parts that are mechanically connected to each other, and is interposed between one of the above-mentioned plate spring parts and the other plate spring part, and the above-mentioned plate-form part has electrode parts which are used to cause an electrostatic force corresponding to the above-mentioned driving signal to act between one of these electrode parts and the above-mentioned electrode part of one of the plate spring parts of the above-mentioned (at least one) pair of plate spring parts, and which are used to cause an electrostatic force corresponding to the above-mentioned driving signal to act between the other of these electrode parts and the above-mentioned electrode part of the other plate spring part of the above-mentioned (at least one) pair of plate spring parts.

In this twenty-fourth invention, an electrostatic force which acts between the plate spring parts can be used; furthermore, the electrostatic force that respectively acts on the pair of facing plate spring parts can be increased by interposing the plate-form part.

The mirror device constituting the twenty-fifth invention of the present application is any of the above-mentioned first through twenty-fourth inventions, wherein the above-mentioned mirror and the above-mentioned supporting mechanism are formed as a single element, a plurality of these elements are installed, and these elements are disposed in a one-dimensional or two-dimensional configuration.

In this twenty-fifth invention, a plurality of light signals or light beams can be independently deflected by desired amounts in desired directions.

The optical switch constituting the twenty-sixth invention of the present application is an optical switch in which light that is emitted from one or more optical input parts is caused to enter certain optical output parts among a plurality of optical output parts, wherein the optical switch contains the mirror device of any of the above-mentioned first through twenty-fifth inventions, and the light that is emitted from the above-mentioned one or more optical input parts is caused to enter certain optical output parts among the above-mentioned plurality of optical output parts after being reflected by the mirror of the above-mentioned mirror device.

In this twenty-sixth invention, since the mirror device of one of the above-mentioned first through twenty-fifth inventions is used, switching to numerous output light paths can be accomplished using a number of mirrors that is the same as the number of input light paths; for example, 1,000 input light paths can be switched to 1,000 output light paths using 1,000 mirrors. Accordingly, in the above-mentioned twenty-first invention, a small number of mirrors is sufficient, so that compactness and mass production characteristics can be greatly improved compared to a mechanical-type optical switch using the above-mentioned conventional MEMS technique. Of course, since the light paths are switched using mirrors, optical characteristics such as insertion loss and crosstalk are superior compared to those of an electronic-type optical switch.

The thin-film elastic structural body constituting the twenty-seventh invention of the present application is a thin-film elastic structural body which has a plurality of plate spring parts constructed from thin films consisting of one or more layers, and in which the above-mentioned plurality of plate spring parts are mechanically connected so that a single elastic body is formed on the whole, wherein one end portion of at least one plate spring part among the above-mentioned plurality of plate spring parts is mechanically connected to a substrate via a leg part which has a rising part that rises from this substrate, one end portion of at least one plate spring part among the above-mentioned plurality of plate spring parts is mechanically connected to one end portion of at least one other plate spring part via a connecting part which has a rising part that rises from this end portion of the first plate spring part, at least one plate spring part among the above-mentioned plurality of plate spring parts is bent toward the opposite side from the above-mentioned substrate, and at least one plate spring part among the above-mentioned plurality of plate spring parts is bent toward the above-mentioned substrate.

The thin-film elastic structural body of the twenty-eighth invention of the present application is the above-mentioned twenty-seventh invention, wherein the shape formed by the above-mentioned plurality of plate spring parts overall is a shallow "V" shape, or a shape consisting of connected shallow "V" shapes, i.e., a zig-zag shape, as seen in a side view of the overall assembly from the same direction, or as seen in side views from appropriate specified directions for each portion of the assembly.

The thin-film elastic structural body constituting the twenty-ninth invention of the present application is the above-mentioned twenty-seventh or twenty-eighth invention, wherein the shape formed by the above-mentioned plurality of plate spring parts overall is a spiral shape which constitutes an arbitrary shape as seen in a plan view from the normal direction of the plane of the above-mentioned substrate.

The thin-film elastic structural bodies of the above-mentioned twenty-seventh through twenty-ninth inventions can be appropriately used in the above-mentioned mirror device constituting the present invention. Of course, the use of the thin-film elastic structural bodies of the above-mentioned twenty-seventh through twenty-ninth inventions is not limited to this application; these structural bodies can also be used in various other types of MEMS.

The manufacturing method constituting the thirtieth invention of the present application is a manufacturing method for manufacturing the thin-film elastic structural body of any of the above-mentioned twenty-seventh through twenty-ninth inventions, wherein this method comprises a step in which a thin film consisting of one or more layers that is used to form at least one plate spring part among the above-mentioned plurality of plate spring parts is formed on a sacrificial layer that is formed on a substrate, and in which the above-mentioned thin film is formed under conditions which are such that this thin film bends when the sacrificial layer surrounding this thin film is removed, and a step in which the above-mentioned sacrificial layer is removed.

In this thirtieth invention, bent plate spring parts can easily be manufactured, so that the thin-film elastic structural bodies constituting the above-mentioned twenty-seventh through twenty-ninth inventions can easily be manufactured.

BRIEF DESCRIPTION OF THE DRAWINGS

FIG. 11 is a schematic sectional view which shows in model form a unit element of a mirror device constituting a seventh embodiment of the present invention.

FIG. 12 is an arrow view along line E–F in FIG. 11.

BEST MODE FOR CARRYING OUT THE INVENTION

Below, preferred embodiments of the thin-film elastic structural body and method for manufacturing the same, and of the mirror device and optical switch using the same provided by the present invention will be described with reference to the figures.

[First Embodiment]

Figure 1:
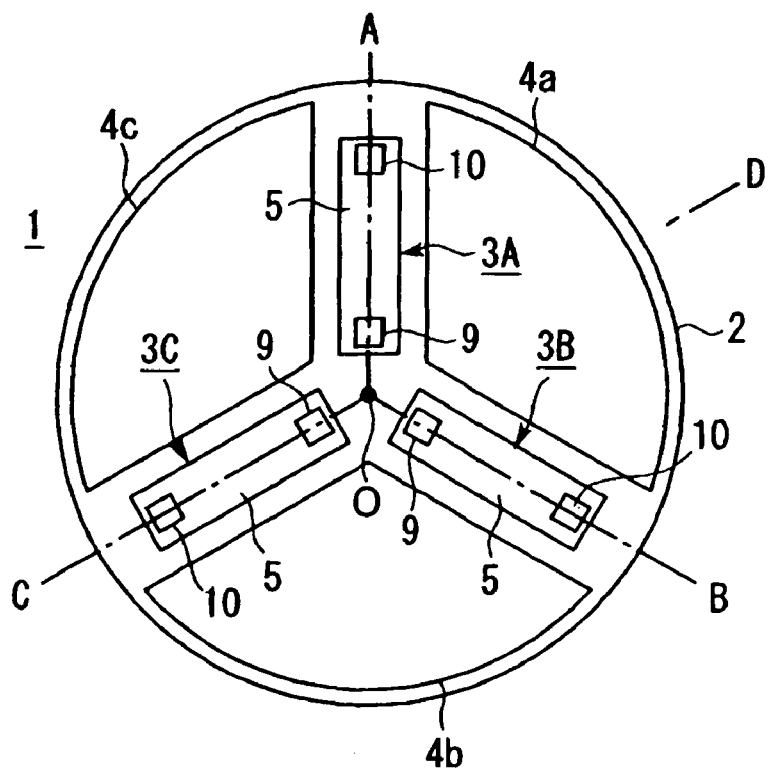
FIG. 1 is a schematic plan view which shows in model form a unit element of a mirror device constituting a first embodiment of the present invention.
Figure 2:
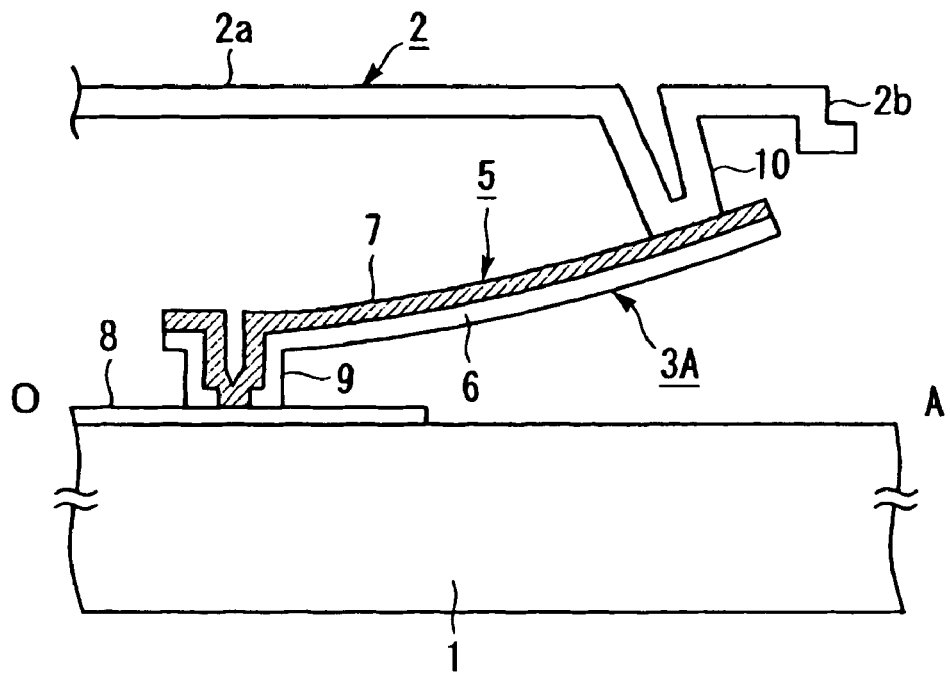
FIG. 2 is a schematic sectional view along line O–A in FIG. 1.
Figure 3:
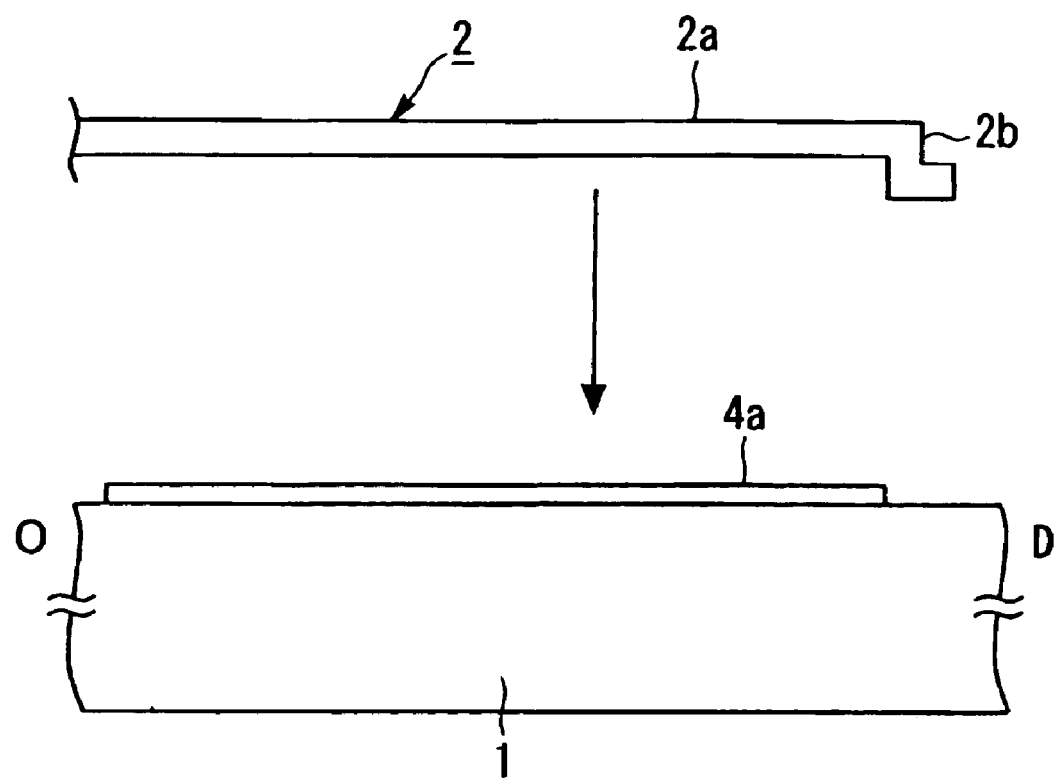
FIG. 3 is a schematic sectional view along line O–D in FIG. 1.

FIG. 1 is a schematic plan view which shows in model form a unit element of a mirror device constituting a first embodiment of the present invention. In FIG. 1, lines that would ordinarily be shown as broken lines (hidden lines) are also shown as solid lines. This is also true of the respective plan views shown later. FIG. 2 is a schematic sectional view along line O–A in FIG. 1. FIG. 3 is a schematic sectional view along line O–D shown in FIG. 1. Although this is not shown in the figures, the schematic sectional view along line O–B in FIG. 1 and the schematic sectional view along line O–C in FIG. 1 are the same as FIG. 2. Furthermore, in the following description, "vertical" is the direction shown in FIG. 2. The arrow shown in FIG. 3 indicates an electrostatic force.

The mirror device constituting this embodiment comprises a substrate 1 (the plane of this substrate is parallel to the plane of the paper in FIG. 1) such as an Si substrate or glass substrate which is used as a substrate, a mirror 2, and a supporting mechanism which elastically supports the mirror 2 with respect to the substrate 1 so that the mirror 2 can be inclined in an arbitrary direction in a state in which the mirror 2 floats from the substrate 1. This mirror device is constructed so that the mirror 2 can be inclined with respect to the substrate 1 in a direction and by an amount of inclination corresponding to a driving signal that is supplied. In the present embodiment, furthermore, the substrate 1 has electrical insulating properties. Of course, in cases where the substrate 1 possesses conductivity, an insulating film may be formed on the upper surface of the substrate.

In the present embodiment, the mirror 2 is constructed in the form of a circular disk by a single-layer Al film, and a dropping part 2b is formed along the entire circumference of the flat-plate-form circular disk part 2a. O in FIG. 1 indicates the center of the mirror 2. Since the strength of the circular disk part 2a is reinforced by this dropping part 2b, the thickness of the circular disk part 2a can be reduced so that the weight is reduced, while ensuring the flatness of the circular disk part 2a. A rising part may be similarly formed instead of the dropping part 2b. Of course, in the present invention, it is not absolutely necessary to form such a dropping part 2b or rising part. Furthermore, the material of the mirror 2 is not limited to an Al film; some other material may be used, or the mirror 2 may be constructed from a film consisting of two or more layers of different materials. Furthermore, the shape of the mirror 2 is not limited to a circular shape; for example, the mirror may also have a rectangular shape.

In the present embodiment, the mirror 2 also acts as a movable-side common electrode which applies an electrostatic force as a driving force that is used to incline the mirror 2. Of course, in cases where (for example) the mirror 2 is constructed from a lower-side insulating film (SiN film, etc.) and an upper-side Al film, three electrodes may be formed independently from each other on the undersurface of the mirror 2 so that these electrodes respectively face electrodes 4a, 4b and 4c (described later) on the substrate 1.

In the present embodiment, the above-mentioned support mechanism is constructed from three supporting parts 3A, 3B and 3C which mechanically connect the substrate 1 and the mirror 2. These supporting parts 3A through 3C have the same structure; here, therefore, only the supporting part 3A will be described.

The supporting part 3A has one plate spring part 5. The plate spring part 5 is constructed from a two-layer thin film in which a lower-side SiN film 6 and an upper-side Al film 7 are laminated. The material and number of layers of the plate spring part 5 are not limited to this material and number of layers; it is sufficient if the number of layers is one or greater. As is shown in FIG. 1, the plate spring part 5 is constructed in a rectilinear shape as seen in a plan view from the normal direction of the plane of the substrate 1. Furthermore, as is shown in FIG. 2, the plate spring part 5 is bent upward (toward the opposite side from the substrate 1), at least in a state in which the above-mentioned driving signal is not supplied. Furthermore, FIGS. 2 and 3 show a state in which no driving signal is supplied. The plate spring part 5 need not necessarily be bent upward; however, if the plate spring part 5 is bent upward as in the present embodiment, height of the mirror 2 can be gained, which is desirable.

As is shown in FIGS. 1 and 2, one end portion of the plate spring part 5 is mechanically connected to the substrate 1 via a leg part 9 which has a rising part that rises from the substrate 1 via a wiring pattern 8 (omitted from FIG. 1) consisting of an Al film that is formed on the surface of the substrate 1. In the present embodiment, the leg part 9 is constructed by extending "as is" the SiN film 6 and Al film 7 that constitute the plate spring part 5. The Al film 7 is also used as wiring that electrically connects the mirror 2 (which is also used as an electrode) to the wiring pattern 8, and is electrically connected to the wiring pattern 8 in the leg part 9 via an opening formed in the SiN film 6. In the present embodiment, furthermore, the wiring patterns 8 of the respective supporting parts 3A through 3C are electrically connected in common.

Furthermore, as is shown in FIGS. 1 and 2, the other end portion of the plate spring part 5 is mechanically connected to the underside of the mirror 2 (located on the side of the substrate 1) via a connecting part 10 which has a rising part that rises from this other end portion. In the present embodiment, the connecting part 10 is constructed by extending "as is" the Al film that constitutes the mirror 2. Accordingly, the mirror 2 which is also used as an electrode is electrically connected to the wiring pattern 8 via the following path: connecting part 10→Al film 7 of the plate spring part 5→Al film 7 of the leg part 9. Furthermore, it goes without saying that the connecting part 10 may also be constructed using a separate material from the mirror 2.

In the present embodiment, as is seen from the above description, the mirror 2 is supported on the substrate 1 only via the plate spring parts 5 of the respective supporting parts 3A through 3C. Furthermore, the respective supporting parts 3A through 3C support the underside of the mirror 2 (located on the side of the substrate 1). Each of the supporting parts 3A through 3C constitutes a thin-film elastic structural body.

In the present embodiment, as is shown in FIG. 1, all of the supporting parts 3A through 3C are disposed in positions which are such that the supporting parts are hidden by the mirror 2 as seen in a plan view in which the substrate 1 is viewed from the side of the mirror 2. Furthermore, the supporting parts 3A through 3C are disposed so that the respective plate spring parts 5 of these supporting parts extend in the radial direction of the mirror 2 as seen in a plan view. Moreover, the respective connecting parts 10 of the three supporting parts 3A through 3C are respectively disposed in three positions which form angles of 120° (=360°/3) on a circle of a specified radius centered on the center O of the mirror 2. Specifically, the three supporting parts 3A through 3C respectively support three locations on the mirror 2 that form angles of 120° (=360°/3) on a circle of a specified radius centered on the center O of the mirror 2. Accordingly, the mirror 2 is elastically supported in a stable manner so that the mirror 2 can be inclined in an arbitrary direction. In the present embodiment, the supporting parts 3A through 3C are disposed so that the leg parts 9 are on the side of the center O of the mirror 2, and so that the connecting parts 10 are on the side of the outer circumference of the mirror 2; however, the positions of the leg parts 9 and the positions of the connecting parts 10 may also be reversed.

Three electrodes 4a, 4b and 4c consisting of Al films are formed beneath the mirror 2 on the substrate 1 in a state in which these electrodes are electrically insulated from each other about the normal line of the plane of the substrate 1 passing through the center O. Voltages of arbitrary levels can be applied to these electrodes 4a through 4c independently of each other via respective wiring patterns (not shown in the figures) between the electrodes and the wiring pattern 8 (i.e., the mirror 2 acting as an electrode). In the present embodiment, the mirror 2 is grounded via the wiring pattern 8, and arbitrary potentials with the mirror 2 as a reference can be independently applied to the respective electrodes 4a through 4c. An electrostatic force of a magnitude corresponding to the levels of the potentials that are applied to the respective electrodes 4a through 4c acts between the respective electrodes 4a through 4c and the electrode counter portion of the mirror 2. Accordingly, the potential levels (based on the mirror 2 as a reference) that are applied to the respective electrodes 4a through 4c act as the above-mentioned driving signals that determine the direction of inclination and the amount of inclination of the mirror 2. A driving circuit which generates these driving signals in accordance with control signals from the outside may also be mounted on the substrate 1.

Thus, in the present embodiment, the mirror 2 is driven by an electrostatic force that is generated by driving signals. Of course, the present invention may also be constructed so that the mirror 2 is driven by a magnetic force or Lorenzo force. Furthermore, in the present embodiment, the plate spring parts 5 have at least two layers (in concrete terms, an SiN layer 6 and an Al layer 7) in which different materials that have different coefficients of expansion are superimposed. The SiN Film 6 absorbs visible light and infrared light, and generates heat. Consequently, if the plate spring parts 5 are irradiated with infrared light or visible light, the plate spring parts 5 flex in accordance with the amount of irradiation via the substrate 1 (for example, if the substrate 1 is an Si substrate, infrared light passes through the substrate 1, and if the substrate 1 is a glass substrate, visible light passes through the substrate 1). Accordingly, the respective plate spring parts 5 can be used as actuators for causing the inclination of the mirror 2, using the above-mentioned infrared light or visible light as driving signals. These points are also true in regard to the respective embodiments and modifications described below.

In the mirror device constituting the present embodiment (although this is not shown in the figures), the mirror 2, the above-mentioned supporting mechanism (supporting parts 3A through 3C) and the electrodes 4a through 4c are taken as one element, and the mirror device has a plurality of these elements, which are disposed in two dimensions. Of course, these elements may also be disposed in one dimension, and the mirror device may consist of a single element. These points are also true in regard to the respective embodiments and modifications described below.

Figure 4:
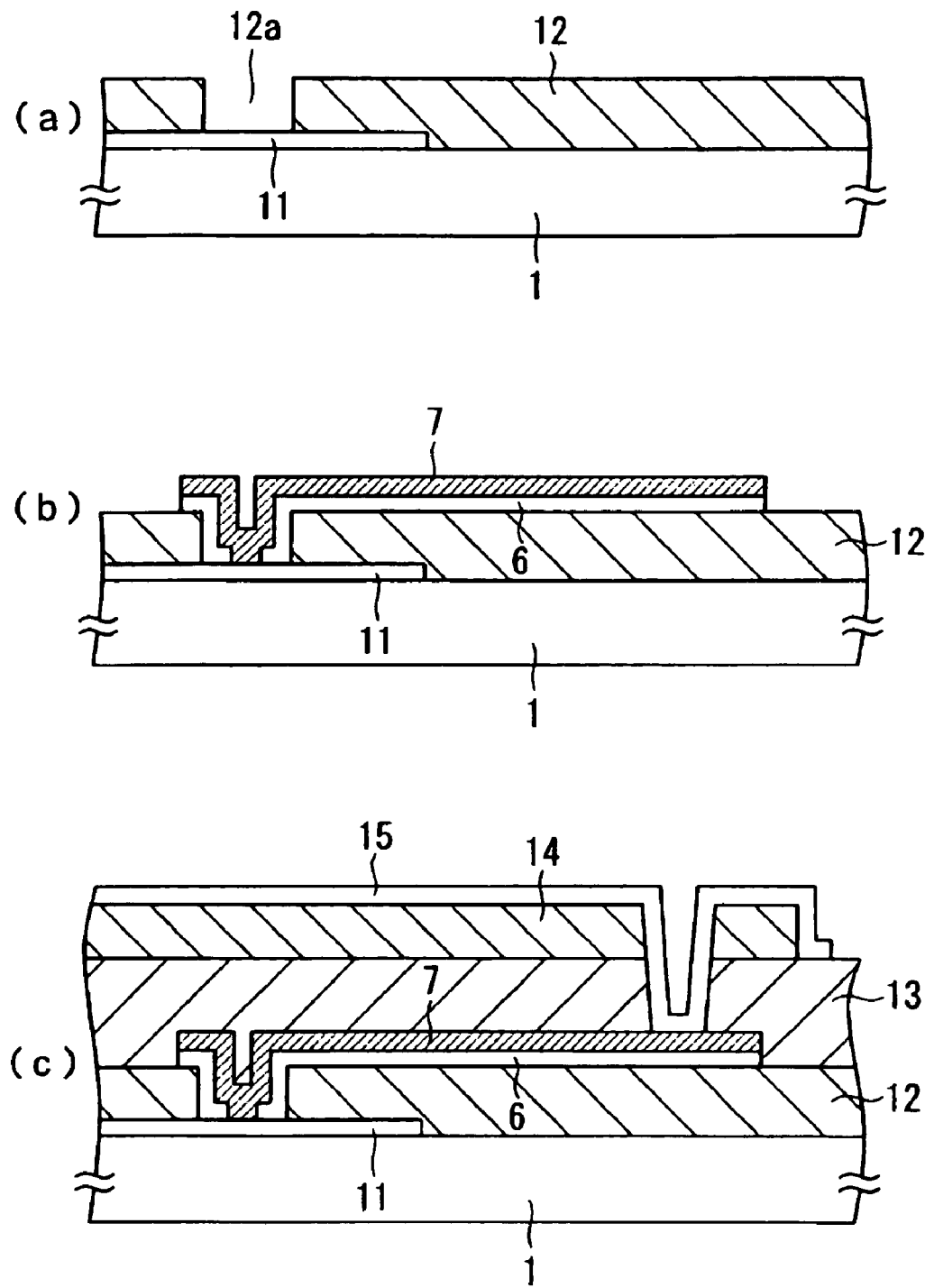
FIG. 4 shows schematic sectional views which illustrate in model form the respective steps of a method for manufacturing the mirror device constituting the first embodiment of the present invention.

Next, one example of a method for manufacturing a mirror device constituting an embodiment of the present invention will be described with reference to FIG. 4. FIG. 4 shows schematic sectional views which illustrate in model form the respective steps of this manufacturing method; these sectional views correspond to FIG. 2.

First, as is shown in FIG. 4(a), an Al film 11 which is used to form electrodes 4a through 4c, a wiring pattern 8 and other wiring patterns is deposited on the surface of a substrate 1 such as an Si substrate or glass substrate by vacuum evaporation, etc. Afterward, this film is patterned by a photolithographic etching method, so that the respective shapes of the above-mentioned parts are obtained. Next, a resist 12 which constitutes a sacrificial layer is applied by coating to the entire surface of the substrate in this state, and openings 12a corresponding to the contact parts of the leg parts 9 are formed in this resist 12 by photolithography (FIG. 4(a)).

Next, after an SiN film 6 used to form one layer of the plate spring parts 5 and leg parts 9 is deposited by a P-CVD method, etc., this film is patterned by a photolithographic etching method so that the shapes of the plate spring parts 5 and leg parts 9 are obtained. In this case, openings are formed in the contact parts of the leg parts 9. Next, after an Al film 7 which is used to form the other layer of the plate spring parts 5 and leg parts 9 is deposited by vacuum evaporation, etc., this film is patterned by a photolithographic etching method, so that the shapes of the plate spring parts 5 and leg parts 9 are obtained (FIG. 4(b)).

The entire surface of the substrate in this state is covered with a polyimide film 13 used as a sacrificial layer by a spin-coating method, etc., and openings corresponding to the contact parts of the connecting parts 10 are formed by a photolithographic etching method. Next, the substrate in this state is coated with a resist 14 which is used as a sacrificial layer, and portions of the resist 14 (including the openings corresponding to the contact parts of the connecting parts 10) are removed by photolithography, so that only the portion of the resist 14 that corresponds to the circular disk part 2a of the mirror 2 remains in island form. Subsequently, after an Al film 15 used to form the mirror 2 and connecting parts 10 is deposited by vacuum evaporation, etc., this film is patterned by a photolithographic etching method, so that the shape of the mirror 2 is obtained (FIG. 4(c)). In this case, the region that is left by the patterning of the Al film 15 overlaps with the resist 14, and is set at a size that is larger than the size of the resist 14, so that the dropping part 2b of the mirror 2 is formed.

Finally, the substrate in this state is split into respective chips by dicing, etc., and all of the sacrificial layers, i.e., the resists 12 and 14 and the polyimide film 13 are removed by an ashing method, etc. As a result, the mirror device shown in FIGS. 1 through 3 is completed.

As was described above, the formation of the films 6 and 7 is performed under conditions which are such that the above-mentioned plate spring parts 5 are caused to bend upward by the stress of film formation when the resists 12 and 14 and the polyimide film 13 are removed. Furthermore, even in cases where the plate spring parts 5 are constructed from a single-layer thin film, if a film of the same material is formed twice with the film formation conditions varied, the plate spring parts 5 can be caused to bend upward even though these plate spring parts 5 ultimately consist of a single-layer film.

In the present embodiment, the above-mentioned supporting mechanism (comprising the supporting parts 3A through 3C) has the above-mentioned structure utilizing plate spring parts 5 that are constructed from a thin film; accordingly, the structure is simple, and can be simply manufactured using the film formation techniques of a semiconductor manufacturing process, etc., as was described above.

Furthermore, in the present embodiment, one end portion of each of the plate spring parts 5 is connected to the substrate 1 via a leg part 9 which has a rising part; accordingly, height of the mirror 2 can be gained by means of the leg parts 9. Moreover, since the other end portion of each plate spring part 5 is mechanically connected to the mirror 2 via a connecting part 10 which has a rising part that rises from this end portion, height of the mirror 2 can also be gained by means of these connecting parts 10. Furthermore, since the plate spring parts 5 are bent upward, height of the mirror 2 can be gained as a result of this bending as well. The degree of bending can be set according to the conditions of formation of the above-mentioned films 6 and 7. The height of the mirror 2 can be freely set by adjusting the degree of this bending and the length of the plate spring parts 5. Accordingly, even if the mirror 2 is relatively large (e.g., even in the case of a mirror diameter of approximately 1 mm), the height of the mirror 2 can be set at (for example) approximately 200 μm, so that the angle at which the mirror 2 can be inclined can be set as a relatively large angle.

Furthermore, in the present embodiment, since all of the supporting parts 3A through 3C are disposed in positions which are such that the supporting parts are hidden by the mirror 2 as seen in a plan view in which the substrate 1 is viewed from the side of the mirror 2, the area on the substrate occupied by the supporting parts 3A through 3C and mirror can be reduced, so that the degree of integration of elements disposed in two dimensions can be increased, thus making it possible to obtain a compact mirror device.

[Second Embodiment]

Figure 5:
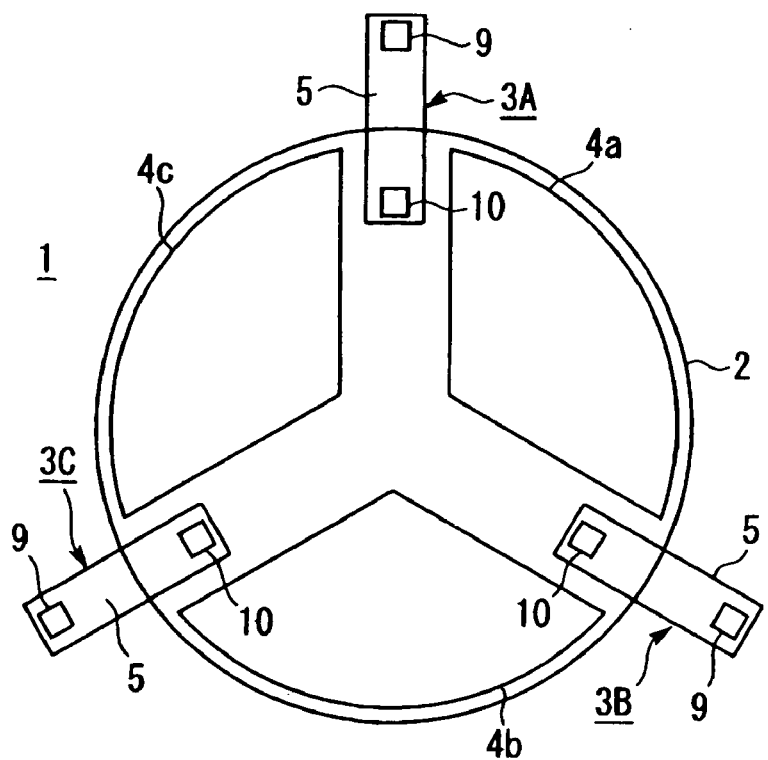
FIG. 5 is a schematic plan view which shows in model form a unit element of a mirror device constituting a second embodiment of the present invention.

FIG. 5 is a schematic plan view which shows in model form a unit element of a mirror device constituting a second embodiment of the present invention; this figure corresponds to FIG. 1. In FIG. 5, elements which are the same as elements in FIGS. 1 through 3, or which correspond to such elements, are labeled with the same symbols, and a redundant description is omitted.

The present embodiment differs from the above-mentioned first embodiment only in that the supporting parts 3A through 3C are disposed in positions which are such that portions of these supporting parts are hidden by the mirror 2 as seen in a plan view in which the substrate 1 is viewed from the side of the mirror 2. In the present embodiment, the degree of integration of the elements is slightly lower than in the above-mentioned first embodiment; in other respects, however, advantages similar to those of the above-mentioned first embodiment can also be obtained in this embodiment.

[Third Embodiment]

Figure 6:
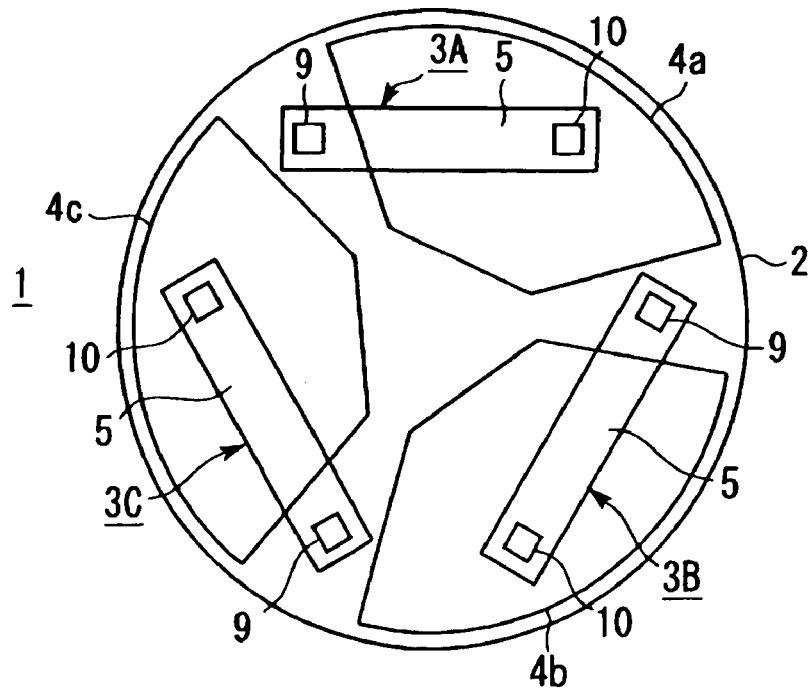
FIG. 6 is a schematic plan view which shows in model form a unit element of a mirror device constituting a third embodiment of the present invention.

FIG. 6 is a schematic plan view which shows in model form a unit element of a mirror device constituting a third embodiment of the present invention; this figure corresponds to FIG. 1. In FIG. 6, elements which are the same as elements in FIGS. 1 through 3, or which correspond to such elements, are labeled with the same symbols, and a redundant description is omitted.

The present embodiment differs from the above-mentioned first embodiment only in that the supporting parts 3A through 3C are disposed so that the plate spring parts 5 of these supporting parts extend substantially in the tangential direction of the mirror 2. Advantages similar to those of the above-mentioned first embodiment can also be obtained in this embodiment.

[Fourth Embodiment]

Figure 7:
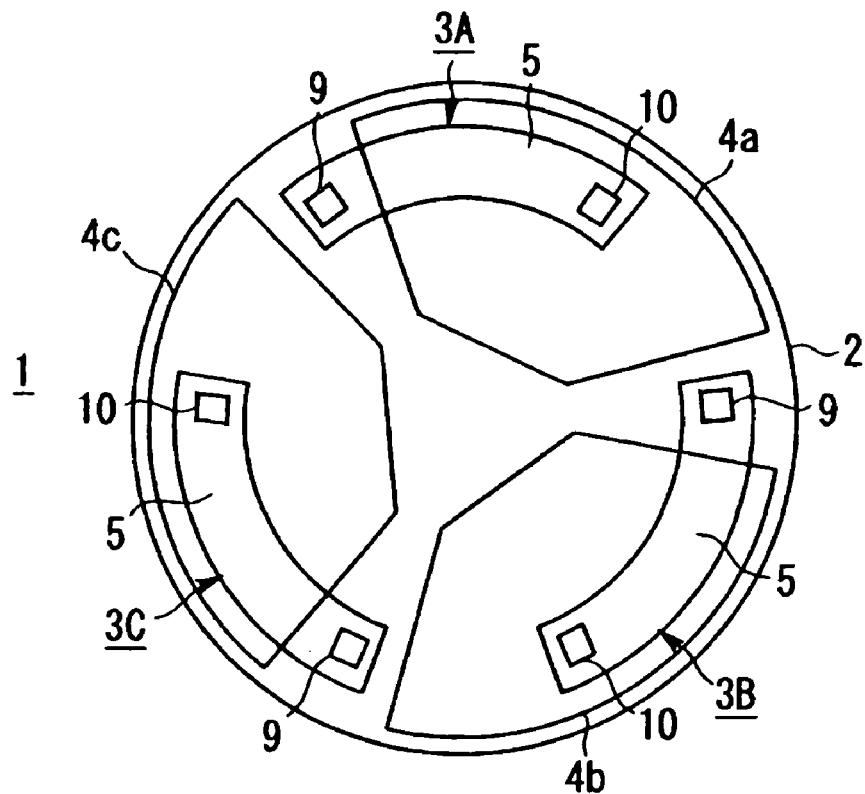
FIG. 7 is a schematic plan view which shows in model form a unit element of a mirror device constituting a fourth embodiment of the present invention.

FIG. 7 is a schematic plan view which shows in model form a unit element of a mirror device constituting a fourth embodiment of the present invention; this figure corresponds to FIG. 1. In FIG. 7, elements which are the same as elements in FIGS. 1 through 3, or which correspond to such elements, are labeled with the same symbols, and a redundant description is omitted.

The present embodiment differs from the above-mentioned first embodiment only in that the plate spring parts 5 of the supporting parts 3A through 3C are constructed with a curvilinear shape as seen in a plan view from the normal direction of the plane of the substrate 1, and in that the supporting parts 3A through 3C are disposed so that the plate spring parts 5 of these supporting parts extend substantially in the tangential direction of the mirror 2. Advantages similar to those of the above-mentioned first embodiment can also be obtained in this embodiment.

[Fifth Embodiment]

Figure 8:
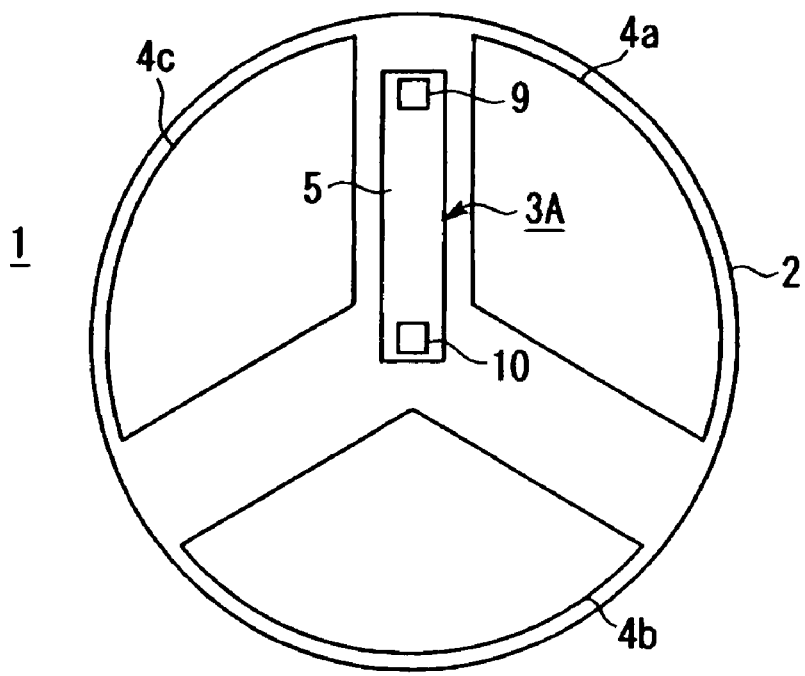
FIG. 8 is a schematic plan view which shows in model form a unit element of a mirror device constituting a fifth embodiment of the present invention.

FIG. 8 is a schematic plan view which shows in model form a unit element of a mirror device constituting a fifth embodiment of the present invention; this figure corresponds to FIG. 1. In FIG. 8, elements which are the same as elements in FIGS. 1 through 3, or which correspond to such elements, are labeled with the same symbols, and a redundant description is omitted.

The present embodiment differs from the above-mentioned first embodiment only in that the supporting parts 3B and 3C are removed, so that the supporting mechanism is constructed from only one supporting part 3A, and the supporting part 3A supports a portion of the mirror 2 located in the vicinity of the center of the mirror 2.

In the present embodiment, the mirror 2 can be inclined in any desired direction by the flexing and torsion of the plate spring part 5 of the supporting part 3A. Basically, advantages similar to those of the above-mentioned first embodiment can also be obtained in this embodiment.

[Sixth Embodiment]

Figure 9:
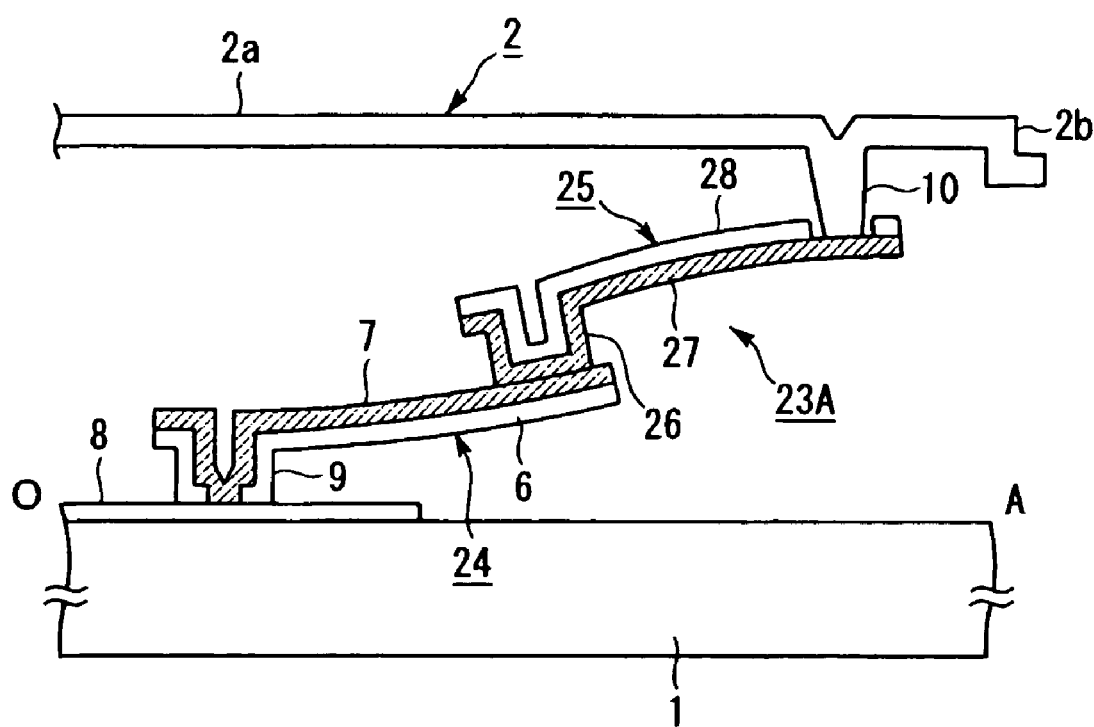
FIG. 9 is a schematic sectional view which shows in model form a unit element of a mirror device constituting a sixth embodiment of the present invention.

FIG. 9 is a schematic sectional view which shows in model form a unit element of a mirror device constituting a sixth embodiment of the present invention; this figure corresponds to FIG. 2. In FIG. 9, elements which are the same as elements in FIGS. 1 through 3, or which correspond to such elements, are labeled with the same symbols, and a redundant description is omitted.

The present embodiment differs from the above-mentioned first embodiment only in that the supporting part 3A shown in FIG. 1 is replaced by the supporting part 23A shown in FIG. 9, and the supporting parts 3B and 3C shown in FIG. 1 are respectively replaced by supporting parts (not shown in the figures) that have the same structure as the supporting part 23A shown in FIG. 9. The supporting part 23A constitutes a thin-film elastic structural body.

While the supporting part 3A shown in FIGS. 1 and 2 has only one plate spring part 5, the supporting part 23A shown in FIG. 9 has two plate spring parts 24 and 25 which are mechanically connected to each other in series. Each of the plate spring parts 24 and 25 is constructed with a rectilinear shape as seen in a plan view from the normal direction of the plane of the substrate 1.

One end portion of the plate spring part 24 that corresponds to one end portion of the mechanical connection route formed by the two plate spring parts 24 and 25 is mechanically connected to the substrate 1 via a leg part 9 which has a rising part that rises from the substrate 1 via a wiring pattern 8 formed on the substrate 1. One end portion of the plate spring part 25 corresponding to the other end portion of the mechanical connection route formed by the two plate spring parts 24 and 25 is mechanically connected to the mirror 2 via a connecting part 10 which has a rising part that rises from this portion. In the present embodiment, the other end portion of the plate spring part 25 is mechanically connected to the other end portion of the plate spring part 24 so that the plate spring part 25 is added to the plate spring part 24 as an extension in the direction of length of the plate spring part 24 in a rectilinear shape. The mechanical connection of the end portions of these plate spring parts 24 and 25 to each other is accomplished by mechanically connecting the end portion of the plate spring a part 25 on the side of the substrate 1 to the end portion of the plate spring part 24 on the side of the mirror 2 via a connecting part 26 which has a rising part that rises from this end portion of the plate spring part 25.

As in the case of the plate spring part 5 shown in FIG. 2, the plate spring part 24 is constructed from a two-layer thin film in which a lower-side SiN film 6 and an upper-side Al film 7 are laminated. The leg part 9 is constructed by extending "as is" the SiN film 6 and Al film 7 that constitute the plate spring part 24.

Meanwhile, the plate spring part 25 is constructed from a two-layer thin film in which the positions of the two layers in the vertical direction are the opposite of those in the plate spring part 24, so that a lower-side Al film 27 and upper-side SiN film 28 are laminated. The connecting part 26 is constructed by extending "as is" the Al film 27 and SiN film 28 that constitute the plate spring part 25. The connecting part 10 is electrically connected to the Al film 27 via an opening formed in the film 28. The mirror 2 which also acts as an electrode is electrically connected to the wiring pattern 8 via the following path: connecting part 10→Al film 27 of the plate spring part 25→Al film 27 of the connecting part 26→Al film 7 of the plate spring part 24→Al film 7 of the leg part 9.

As is shown in FIG. 9, the plate spring part 24 is bent upward (toward the opposite side from the substrate 1), at least in a state in which the above-mentioned driving signal is not supplied. Furthermore, FIG. 9 shows a state in which no driving signal is supplied. On the other hand, the plate spring part 25 is bent downward (toward the substrate 1) in the opposite direction from the plate spring part 24, at least in a state in which the above-mentioned driving signal is not supplied. In the present embodiment, the degrees of bending and lengths of the plate spring parts 24 and 25 are the same; as a result, the end portion of the plate spring part 25, this end portion being mechanically connected to the mirror 2 via the connecting part 10, is substantially parallel to the plane of the substrate 1. Of course, the above-mentioned end portion of the plate spring part 25 can also be oriented substantially parallel to the plane of the substrate 1 by means of some other setting.

Figure 10:
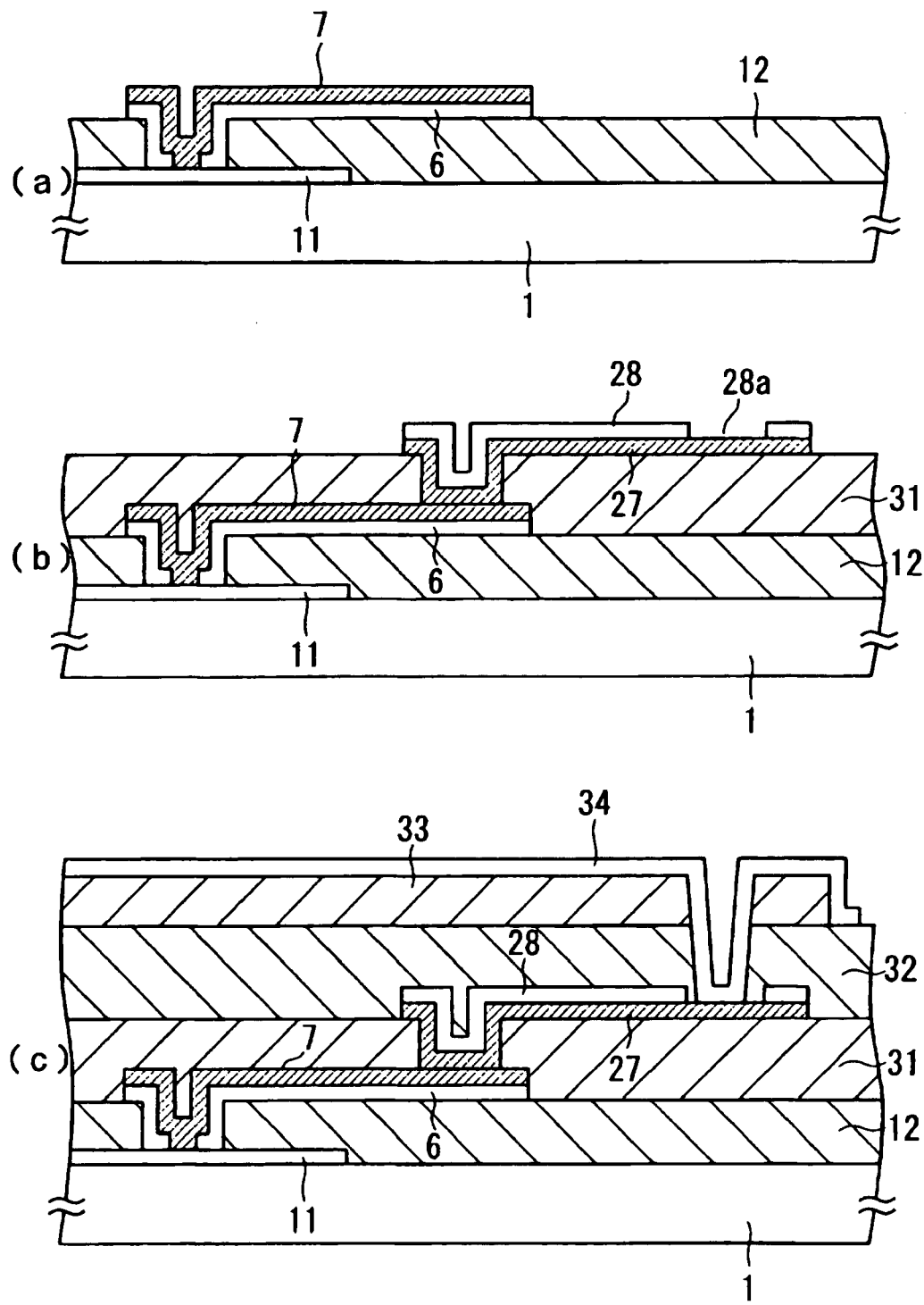
FIG. 10 is a schematic sectional view which shows in model form the respective steps of a method for manufacturing the mirror device constituting the sixth embodiment of the present invention.
Figure 1:
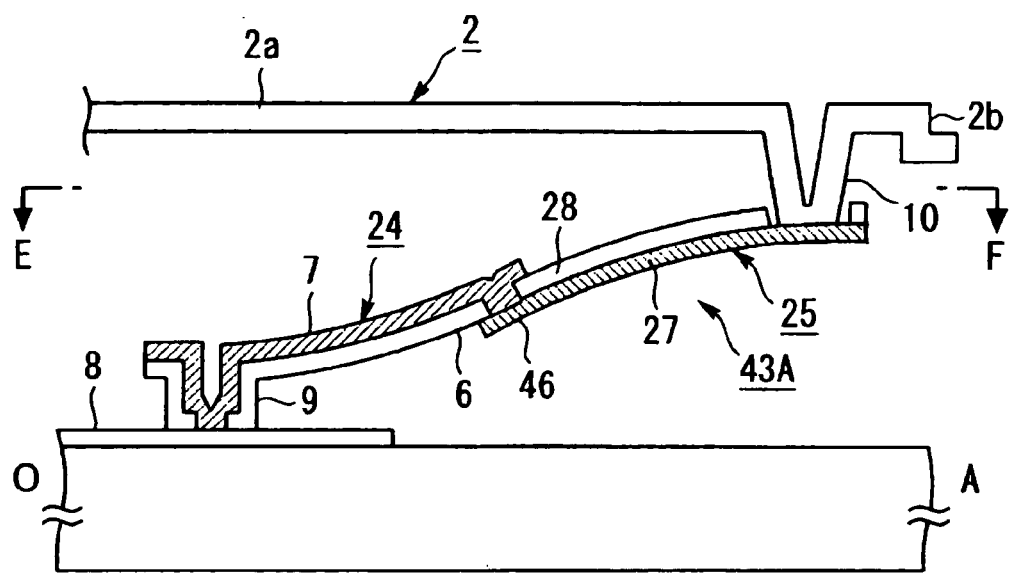
Figure 1:
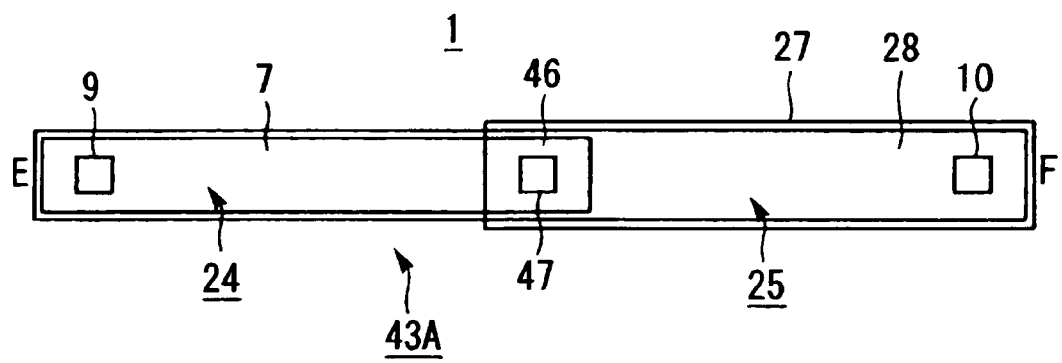

Next, one example of a method for manufacturing the mirror device of the present embodiment will be described with reference to FIG. 10. FIG. 10 shows schematic sectional views which illustrate in model form the respective steps of this manufacturing method; these figures correspond to FIG. 9. In FIG. 10, elements which are the same as elements in FIG. 4, or which correspond to elements in FIG. 4, are labeled with the same symbols, and a redundant description is omitted.

First, the same steps as the steps up to FIG. 4(b) of the manufacturing method described with reference to FIG. 4 are performed (FIG. 10(a)). However, the shape of the plate spring part 24 is obtained when the films 6 and 7 are patterned.

The entire surface of the substrate in this state is covered with a polyimide film 31 as a sacrificial layer by a spin-coating method, etc., and an opening corresponding to the contact part of the connecting part 26 is formed by a photolithographic etching process. Next, after an Al film 27 which is used to form one layer of the plate spring part 25 and connecting part 26 is deposited by vacuum evaporation, etc., this film is patterned by a photolithographic etching process so that the shapes of the plate spring part 25 and connecting part 26 are obtained. Next, after an SiN film 28 which is used to form the other layer of the plate spring part 25 and connecting part 26 is deposited by a P-CVD process, etc., this film is patterned by a photolithographic etching process so that the shapes of the plate spring part 25 and connecting part 26 are obtained (FIG. 10(*b*)). In this case, an opening 28*a* is formed in the SiN film 28 in a location corresponding to the contact part of the connecting part 10.

Next, the entire surface of the substrate in this state is coated with a resist 32 that forms a sacrificial layer, and an opening corresponding to the contact part of the connecting part 10 is formed in this resist 32 by photolithography. Next, the entire surface of the substrate in this state is covered with a polyimide film 33 as a sacrificial layer by spin-coating, etc., and portions of the polyimide film 33 (including the portion of the opening corresponding to the contact part of the connecting part 10) are removed by a photolithographic etching process, so that only the portion of the polyimide film 33 corresponding to the circular disk part 2*a* of the mirror 2 is left in island form. Subsequently, after an Al film 34 that is used to form the mirror 2 and connecting part 10 is deposited by vacuum evaporation, etc., this film is patterned by a photolithographic etching process so that the shape of the mirror 2 is obtained (FIG. 10(*c*)). In this case, the region that is left by the patterning of the Al film 34 overlaps with the polyimide film 33, and is set at a size that is larger than the size of the polyimide film 33, so that the dropping part 2*b* of the mirror 2 is formed.

Finally, the substrate in this state is split into respective chips by dicing, etc., and all of the sacrificial layers, i.e., the resists 12 and 32 and the polyimide films 31 and 33, are removed by an ashing method, etc. As a result, the mirror device shown in FIG. 9 is completed.

As was described above, the formation of the films 6 and 7 is performed under conditions which are such that the plate spring part 24 is caused to bend upward by the stress of film formation when the resists 12 and 32 and the polyimide films 31 and 33 are removed. Furthermore, as was described above, the formation of the films 27 and 28 is performed under conditions which are such that the plate spring part 25 is caused to bend downward by the stress of film formation when the resists 12 and 32 and the polyimide film 31 and 33 are removed. Since the lengths of the plate spring parts 24 and 25 are the same (as was described above), the film formation conditions of the films 6 and 28 are set as the same conditions, and the film formation conditions of the films 7 and 27 are set as the same conditions. As a result, the degrees of bending of the plate spring parts 24 and 25 can be made the same.

Basically, advantages similar to those of the above-mentioned first embodiment can also be obtained in the present embodiment. Furthermore, in the present embodiment, since the end portions of the plate spring parts 24 and 25 are mechanically connected to each other via the connecting part 26 which has a rising part, height of the mirror 2 can also be gained by means of this connection. Accordingly, even if the mirror 2 is relatively large, the angle at which the mirror can be inclined can be increased even further. In the present embodiment, furthermore, since the end portion of the plate spring part 25 which is connected to the mirror 2 via the connecting part 10 is substantially parallel to the plane of the substrate 1, the stress that is applied to the connecting part 10 can be reduced.

Furthermore, when the supporting part 3A shown in FIG. 1 is replaced by the supporting part 23A shown in FIG. 9, the positions of the leg part 9 and connecting part 10 may be reversed; similarly, when the supporting parts 3B and 3C shown in FIG. 1 are respectively replaced by supporting parts that have the same structure as the supporting part 23A shown in FIG. 9, the positions of the leg parts 9 and connecting parts 10 may be reversed. Moreover, the supporting parts 3A through 3C shown in FIG. 5, the supporting parts 3A through 3C shown in FIG. 6, and the supporting part 3A shown in FIG. 8, may also be replaced by the supporting part 23A shown in FIG. 9 or by supporting parts which have the same structure as this supporting part 23A.

[Seventh Embodiment]

FIG. 11 is a schematic sectional view which shows in model form a unit element of a mirror device constituting a seventh embodiment of the present invention. This figure corresponds to FIGS. 2 and 9. FIG. 12 is an arrow view along line E–F in FIG. 11. In FIGS. 11 and 12, elements that are the same as in FIGS. 1 through 3 and FIG. 9, or that correspond to elements in FIGS. 1 through 3 and FIG. 9, are labeled with the same symbols, and a redundant description is omitted.

The present embodiment differs from the above-mentioned first embodiment only in that the supporting part 3A shown in FIG. 1 is replaced by the supporting part 43A shown in FIGS. 11 and 12, and in that the supporting parts 3B and 3C shown in FIG. 1 are respectively replaced by supporting parts (not shown in the figures) that have the same structure as the supporting part 43A shown in FIGS. 11 and 12. The supporting part 43A constitutes a thin-film elastic structural body.

The supporting part 43A shown in FIGS. 11 and 12 differs from the supporting part 23A shown in FIG. 9 only in that the end portions of the plate spring parts 24 and 25 are connected to each other by a connecting part 46 that does not have a rising part, in that the lower-side SiN film 6 of the plate spring part 24 and the upper-side SiN film 28 of the plate spring part 25 are replaced by a single continuous SiN film, and in that an opening used for the electrical connection of the Al films 7 and 27 in the connecting part 46 is formed in this single continuous SiN film. The connecting part 46 consists of the location of this opening and the portions where the above-mentioned continuous SiN film and Al films 7 and 27 overlap.

Figure 13:
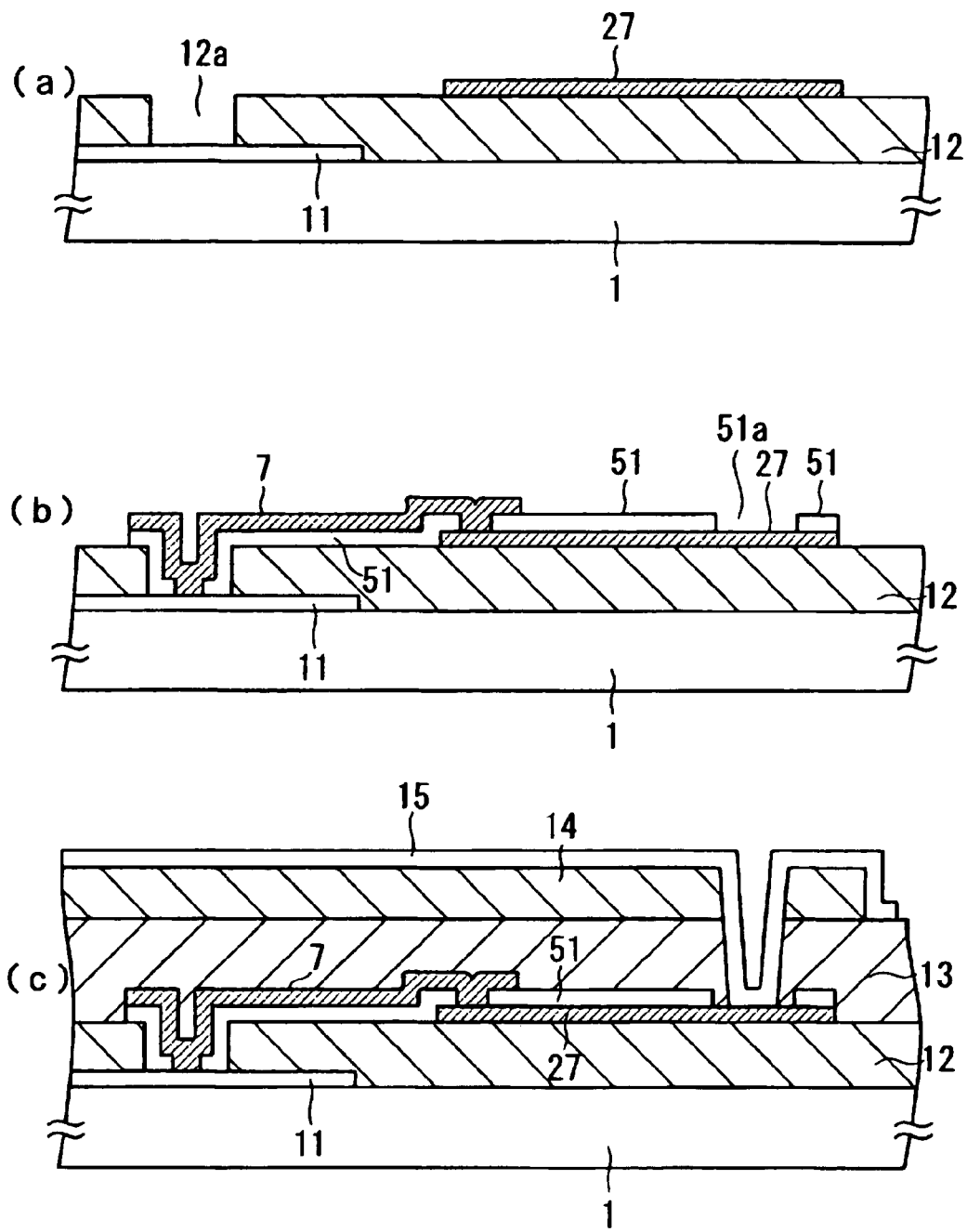
FIG. 13 is a schematic sectional view which shows in model form the respective steps of a method for manufacturing the mirror device constituting the seventh embodiment of the present invention.

Next, one example of a method for manufacturing the mirror device constituting the present embodiment will be described with reference to FIG. 13. FIG. 13 shows schematic sectional views which illustrate in model form the respective steps of this manufacturing method. This figure corresponds to FIG. 11. In FIG. 13, elements that are the same as elements in FIGS. 4 and 10, or that correspond to elements in FIGS. 4 and 10, are labeled with the same symbols.

First, as is shown in FIG. 13(*a*), after an Al film 11 which is used to form electrodes 4*a* through 4*c*, a wiring pattern 8 and other wiring pattern is deposited by vacuum evaporation, etc., on a substrate 1 such as an Si substrate or glass substrate, this film is patterned by a photolithographic etching process so that the shapes of these parts are obtained. Next, the entire surface of the substrate in this state is coated with a resist 12 which acts as a sacrificial layer, and an opening 12*a* corresponding to the contact part of the leg part 9 is formed in this resist 12 by photolithography. Subsequently, after an Al film 27 which is used to form the lower-side layers of the plate spring part 25 and connecting part 46 is deposited by vacuum evaporation, etc., this film is patterned by a photolithographic etching process so that the shapes of the plate spring part 25 and connecting part 46 are obtained (FIG. 13(*a*)).

Next, after an SiN film 51 which is used to form one layer of the leg part 9, the lower-side layer of the plate spring part 24, the intermediate layer of the connecting part 46 and the upper-side layer of the plate spring part 25 is deposited by a P-CVD method, etc., this film is patterned by a photolithographic etching process so that the shapes of these parts are obtained. In this case, the opening 47 and an opening 51a (in a location corresponding to the contact part of the connecting part 10) are formed in the SiN film 51. Next, after an Al film 7 which is used to form the other layer of the leg part 9, the upper-side layer of the plate spring part 24 and the upper-side layer of the connecting part 46 is deposited by vacuum evaporation, etc., this film is patterned by a photolithographic etching process so that the shapes of these parts are obtained (FIG. 13(b)).

The entire surface of the substrate in this state is covered with a polyimide film 13 as a sacrificial layer by spin-coating, etc., and an opening corresponding to the contact part of the connecting part 10 is formed by a photolithographic etching process. Next, the substrate in this state is coated with a resist 14 which acts as a sacrificial layer, and portions of the resist 14 (including the portion of the opening corresponding to the contact part of the connecting part 10) are removed by photolithography, so that only the portion of the resist 14 corresponding to the circular disk part 2a of the mirror 2 is left in island form. Subsequently, after an Al film 15 which is used to form the mirror 2 and connecting part 10 is deposited by vacuum evaporation, etc., this film is patterned by a photolithographic etching process so that the shape of the mirror 2 is obtained (FIG. 13(c)). In this case, the region that is left by the patterning of the Al film 15 overlaps with the resist 14, and is set at a size that is larger than the size of the resist 14, so that the dropping part 2b of the mirror 2 is formed.

Finally, the substrate in this state is split into chips by dicing, etc., and all of the sacrificial layers, i.e., the resists 12 and 14 and the polyimide film 13, are removed by ashing, etc.. As a result, the mirror device shown in FIGS. 11 and 12 is completed.

The formation of the film 7, film 51 and film 27 is performed under conditions which are such that the plate spring part 24 is caused to bend upward by the stress of film formation, and which are such that the plate spring part 25 is caused to bend downward by the stress of film formation, when the resists 12 and 14 and polyimide film 13 are removed. In the present embodiment, the lengths of the plate spring parts 24 and 25 are the same; accordingly, the film formation conditions of the film 7 and film 27 are set as the same conditions. As a result, the degrees of bending of the plate spring parts 24 and 25 can be made the same.

Basically, advantages similar to those of the above-mentioned sixth embodiment can also be obtained in this embodiment. However, in the present embodiment, since the end portions of the plate spring parts 24 and 25 are connected to each other by a connecting part 46 that has no rising part, the possibility of gaining height of the mirror 2 is correspondingly reduced compared to the above-mentioned sixth embodiment, in which the end portions of the plate spring parts 24 and 25 are connected to each other by a connecting part 26 that has a rising part. On the other hand, the manufacturing process of the mirror device constituting the present embodiment can be greatly simplified compared to the manufacturing process of the mirror device constituting the above-mentioned sixth embodiment.

Furthermore, when the supporting part 3A shown in FIG. 1 is replaced by the supporting part 43A shown in FIGS. 11 and 12, the positions of the leg part 9 and connecting part 10 may be reversed; similarly, when the supporting parts 3B and 3C shown in FIG. 1 are respectively replaced by supporting parts which have the same structure as that of the supporting part 43A shown in FIGS. 11 and 12, the positions of the leg parts 9 and connecting parts 10 may be reversed. Furthermore, the supporting parts 3A through 3C shown in FIG. 5, the supporting parts 3A through 3C shown in FIG. 6, and the supporting part 3A shown in FIG. 8, may also be replaced by the supporting part 43A shown in FIGS. 11 and 12, or by supporting parts which have the same structure as this supporting part 43A.

[Eighth Embodiment]

Figure 14:
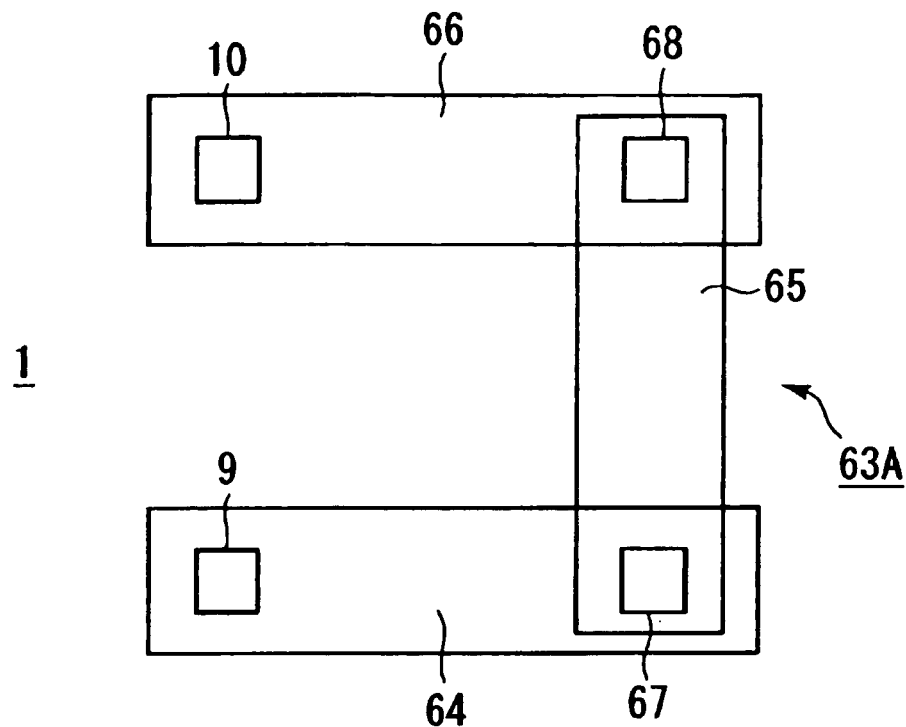
FIG. 14 is a schematic plan view which shows in model form the supporting part of a unit element of a mirror device constituting an eighth embodiment of the present invention.

FIG. 14 is a schematic plan view which shows in model form the supporting part 63A of a unit element of a mirror device constituting an eighth embodiment of the present invention. In FIG. 14, elements that are the same as elements shown in FIGS. 1 through 3, or that correspond to elements shown in FIGS. 1 through 3, are labeled with the same symbols, and a redundant description is omitted.

The present embodiment differs from the above-mentioned first embodiment only in that the supporting part 3A shown in FIG. 1 is replaced by the supporting part 63A shown in FIG. 14, and in that the supporting parts 3B and 3C shown in FIG. 1 are respectively replaced by supporting parts (not shown in the figures) which have the same structure as that of the supporting part 63A shown in FIG. 14. The supporting part 63A constitutes a thin-film elastic structural body.

While the supporting part 3A shown in FIGS. 1 and 2 has only one plate spring part 5, the supporting part 63A shown in FIG. 14 has three plate spring parts 64, 65 and 66 that are mechanically connected to each other in series. As is shown in FIG. 14, each of the plate spring parts 64 through 66 is constructed in a rectilinear shape as seen in a plan view from the normal direction of the plane of the substrate 1.

One end portion of the plate spring part 64 corresponding to one end portion of the mechanical connection route formed by the three plate spring parts 64 through 66 is mechanically connected to the substrate 1 via a leg part 9 which has a rising part that rises from the substrate 1 via a wiring pattern 8 formed on the substrate 1. One end portion of the plate spring part 66 corresponding to the other end portion of the mechanical connection route formed by the three plate spring parts 64 through 66 is mechanically connected to the mirror 2 via a connecting part 10 which has a rising part that rises from this end portion of the plate spring part 66.

In the present embodiment, one end portion of the plate spring part 65 is mechanically connected to the other end portion of the plate spring part 64 via a connecting part 67 which has a rising part that rises from this other end portion of the plate spring part 64. The other end portion of the plate spring part 66 is mechanically connected to the other end portion of the plate spring part 65 via a connecting part 68 which has a rising part that rises from this other end portion of the plate spring part 65. In the present embodiment, as is shown in FIG. 14, the plate spring parts 64 through 66 are connected so that these plate spring parts form a "C" shape as seen in a plan view. All of the plate spring parts 64 through 66 have the same structure as that of the supporting part 3A shown in FIG. 2, and are bent upward. The connecting parts 67 and 68 both have the same structure as that of the leg part 9 shown in FIG. 2.

It goes without saying that the mirror device of the present embodiment can be manufactured by a method based on the manufacturing method of the mirror device constituting the above-mentioned sixth embodiment.

Basically, advantages similar to those of the above-mentioned first embodiment can also be obtained in the present embodiment. Furthermore, in the present embodiment, since the end portions of the plate spring parts 64 through 66 are mechanically connected to each other via the connecting parts 67 and 68 that have rising parts, height of the mirror 2 can be gained by means of this connection as well. Accordingly, even if the mirror 2 is relatively large, the angle at which the mirror can be inclined can be increased even further. Moreover, in the present embodiment, since the plate spring parts 64 through 66 form a "C" shape as seen in a plan view, the length on the substrate 1 occupied by the plate spring parts 64 through 66 can be reduced.

In the present embodiment, since all of the plate spring parts 64 through 66 are bent upward, the end portion of the plate spring part 66, this end portion being mechanically connected to the mirror 2 via the connecting part 10, is inclined by a relatively large amount from the plane of the substrate 1. As a result, the stress that is applied to the connecting part 10 is relatively large.

Accordingly, for example, it is desirable that the present embodiment be modified as follows: specifically, the structure extending from the leg part 9 to the connecting part 10 (but excluding the connecting part 10) in FIG. 9 or FIG. 10 is used as the structure extending from the leg part 9 to the connecting part 67 (but excluding the connecting part 67) in FIG. 14, the structure extending from the leg part 9 to the connecting part 10 (but excluding the connecting part 10) in FIG. 9 or FIG. 10 is used as the structure extending from the connecting part 67 to the connecting part 68 (but excluding the connecting part 68) in FIG. 14, and the structure extending from the leg part 9 to the connecting part 10 in FIG. 9 or FIG. 10 is used as the structure extending from the connecting part 68 to the connecting part 10 in FIG. 14. In this case, since the plate spring parts in the vicinity of the connecting part 10 are substantially parallel to the plane of the substrate 1, the stress that is applied to the connecting part 10 can be reduced.

Furthermore, when the supporting part 3A shown in FIG. 1 is replaced by the supporting part 63A shown in FIG. 14, the positions of the leg part 9 and connecting part 10 may be reversed; similarly, when the supporting parts 3B and 3C shown in FIG. 1 are respectively replaced by supporting parts which have the same structure as that of the supporting part 63A shown in FIG. 14, the positions of the leg parts 9 and connecting parts 10 may be reversed. Moreover, the supporting parts 3A through 3C shown in FIG. 5, the supporting parts 3A through 3C shown in FIG. 6, and the supporting part 3A shown in FIG. 8, may be replaced by supporting part 63A shown in FIG. 14, or by supporting parts which have the same structure as this supporting part 63A.

[Ninth Embodiment]

Figure 15:
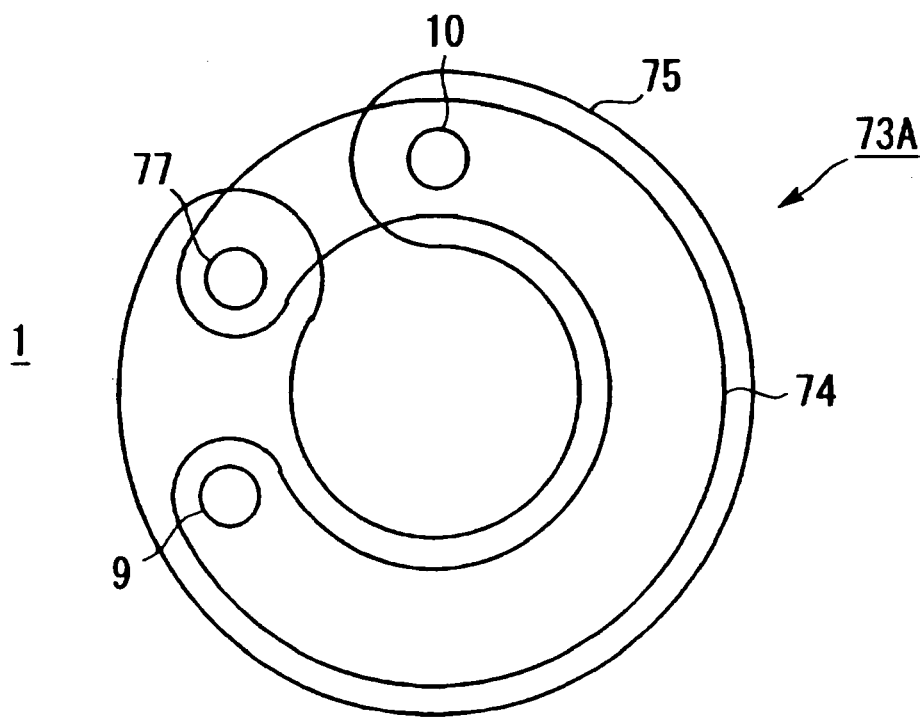
FIG. 15 is a schematic plan view which shows in model form the supporting part of a unit element of a mirror device constituting a ninth embodiment of the present invention.

FIG. 15 is a schematic plan view which shows in model form the supporting part 73A of a unit element of a mirror device constituting a ninth embodiment of the present invention. In FIG. 15, elements that are the same as elements shown in FIGS. 1 through 3, or that correspond to elements shown in FIGS. 1 through 3, are labeled with the same symbols, and a redundant description is omitted.

The present embodiment differs from the above-mentioned first embodiment only in that the supporting part 3A shown in FIG. 1 is replaced by the supporting part 73A shown in FIG. 15, and in that the supporting parts 3B and 3C shown in FIG. 1 are respectively replaced by supporting parts (not shown in the figures) which have the same structure as the supporting part 73A shown in FIG. 15. The supporting part 73A constitutes a thin-film elastic structural body.

While the supporting part 3A shown in FIGS. 1 and 2 has only one plate spring part 5, the supporting part 73A shown in FIG. 15 has two plate spring parts 74 and 75 that are mechanically connected to each other in series. As is shown in FIG. 15, each of the plate spring parts 74 and 75 is constructed in a curvilinear shape (more concretely, in a "C" shape) as seen in a plan view from the normal direction of the plane of the substrate 1.

One end portion of the plate spring part 74 corresponding to one end portion of the mechanical connection route formed by the two plate spring parts 74 and 75 is mechanically connected to the substrate 1 via a leg part 9 which has a rising part that rises from the substrate 1 via a wiring pattern 8 formed on the substrate 1. One end portion of the plate spring part 75 corresponding to the other end portion of the mechanical connection route formed by the two plate spring parts 74 and 75 is mechanically connected to the mirror 2 via a connecting part 10 which has a rising part that rises from this end portion of the plate spring part 75.

In the present embodiment, the other end portion of the plate spring part 75 is mechanically connected to the other end portion of the plate spring part 74 so that the plate spring part 75 is added to the plate spring part 74 as an extension in the direction of length of the plate spring part 74 in a circular shape. Both of the plate spring parts 74 and 75 are bent upward. Accordingly, the shape formed by the plate spring parts 74 and 75 as a whole is a spiral shape which forms a circular shape as seen in a plan view from the normal direction of the plane of the substrate 1.

It goes without saying that the mirror device of the present embodiment can be manufactured by a method based on the manufacturing method of the mirror device constituting the above-mentioned sixth embodiment. Advantages similar to those of the above-mentioned eighth embodiment can also be obtained in this embodiment.

Furthermore, when the supporting part 3A shown in FIG. 1 is replaced by the supporting part 73A shown in FIG. 15, the positions of the leg part 9 and connecting part 10 may be reversed; similarly, when the supporting parts 3B and 3C shown in FIG. 1 are respectively replaced by supporting parts which have the same structure as that of the supporting part 73A shown in FIG. 15, the positions of the leg parts 9 and connecting parts 10 may be reversed. Furthermore, the supporting parts 3A through 3C shown in FIG. 5, the supporting parts 3A through 3C shown in FIG. 6, and the supporting part 3A shown in FIG. 8, may be replaced by the supporting part 73A shown in FIG. 15, or by supporting parts which have the same structure as that of the supporting part 73A.

[Tenth Embodiment]

Figure 16:
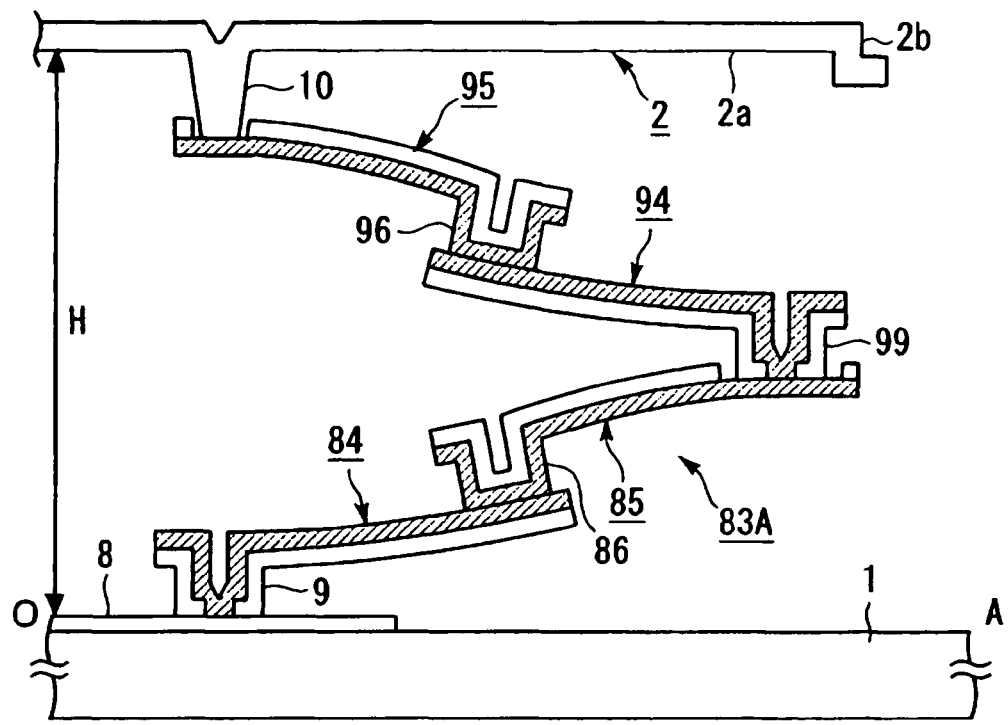
FIG. 16 is a schematic sectional view which shows in model form the supporting part of a unit element of a mirror device constituting a tenth embodiment of the present invention.

FIG. 16 is a schematic sectional view which shows in model form the supporting part 83A of a unit element of a mirror device constituting a tenth embodiment of the present invention. In FIG. 16, elements that are the same as elements shown in FIGS. 1 through 3, or that correspond to elements shown in FIGS. 1 through 3, are labeled with the same symbols, and a redundant description is omitted.

The present embodiment differs from the above-mentioned first embodiment only in that the supporting part 3A shown in FIG. 1 is replaced by the supporting part 83A shown in FIG. 16, and in that the supporting parts 3B and 3C shown in FIG. 1 are respectively replaced by supporting parts (not shown in the figures) which have the same structure as that of the supporting part 83A shown in FIG. 16. The supporting part 83A constitutes a thin-film elastic structural body.

While the supporting part 3A shown in FIGS. 1 and 2 has only one plate spring part 5, the supporting part 83A shown in FIG. 16 has four plate spring parts 84, 85, 94 and 95 that are mechanically connected to each other in series. As is shown in FIG. 16, specified end portions of these plate spring parts are mechanically connected to each other via connecting parts 86, 99 and 96 which have rising parts. The portion of the structure consisting of the leg part 9, plate spring part 84, connecting part 86 and plate spring part 85 shown in FIG. 16, and the portion of the structure consisting of the connecting part 99, plate spring part 94, connecting part 96 and plate spring part 95 shown in FIG. 16, are completely the same as the portion of the structure consisting of the leg part 9, plate spring part 24, connecting part 26 and plate spring part 25 shown in FIG. 9. The shape formed by the plate spring parts 84, 85, 94 and 95 as a whole is a shallow "V" shape as seen in a side view of the entire assembly from the direction perpendicular to the page in FIG. 16. This portion forms a single straight line as seen in a plan view.

In the present embodiment, even if the height H of the mirror 2 varies, the end portion of the plate spring part 84, this end portion being mechanically connected to the substrate 1 via the leg part 9, and the end portion of the plate spring part 95, this end portion being mechanically connected to the mirror 2, are always positioned in substantially the same position as seen in a plan view from the normal direction of the plane of the substrate 1. In other words, in the present embodiment, as a result of the structure with a shallow "V" shape, variation in the height H of the mirror 2 is converted only into variation in the flexing of the plate spring parts 84, 85, 94 and 95. In the present embodiment, furthermore, the end portion of the plate spring part 95, this end portion being mechanically connected to the mirror 2 (i.e., the end portion in the vicinity of the connecting part 10), and the end portion of the plate spring part 85 corresponding to the turning point of the above-mentioned shape formed by the plate spring parts 84, 85, 94 and 95 seen in a side view (i.e., the end portion in the vicinity of the connecting part 99) are substantially parallel to the plane of the substrate 1. In the present embodiment, the bending directions and lengths of the respective plate spring parts 84, 85, 94 and 95 are set so that such a substantially parallel orientation is obtained.

Accordingly, in the present embodiment, not only is it possible to obtain advantages similar to those of the above-mentioned first embodiment, but the additional advantage of almost no load on the connecting part 10 is obtained.

Furthermore, when the supporting part 3A shown in FIG. 1 is replaced by the supporting part 83A shown in FIG. 16, the positions of the leg part 9 and connecting part 10 may be set in any of the positions indicated by the symbols 9 and 10 in FIG. 1, and the same is true when the supporting parts 3B and 3C shown in FIG. 1 are respectively replaced by supporting parts which have the same structure as that of the supporting part 83A shown in FIG. 16. Furthermore, the supporting pats 3A through 3C shown in FIG. 5, the supporting parts 3A through 3C shown in FIG. 6, and the supporting part 3A shown in FIG. 8, may be replaced by the supporting part 83A shown in FIG. 16, or by supporting parts which have the same structure as this supporting part 83A. The same is true in regard to the eleventh embodiment described below.

[Eleventh Embodiment]

Figure 17:
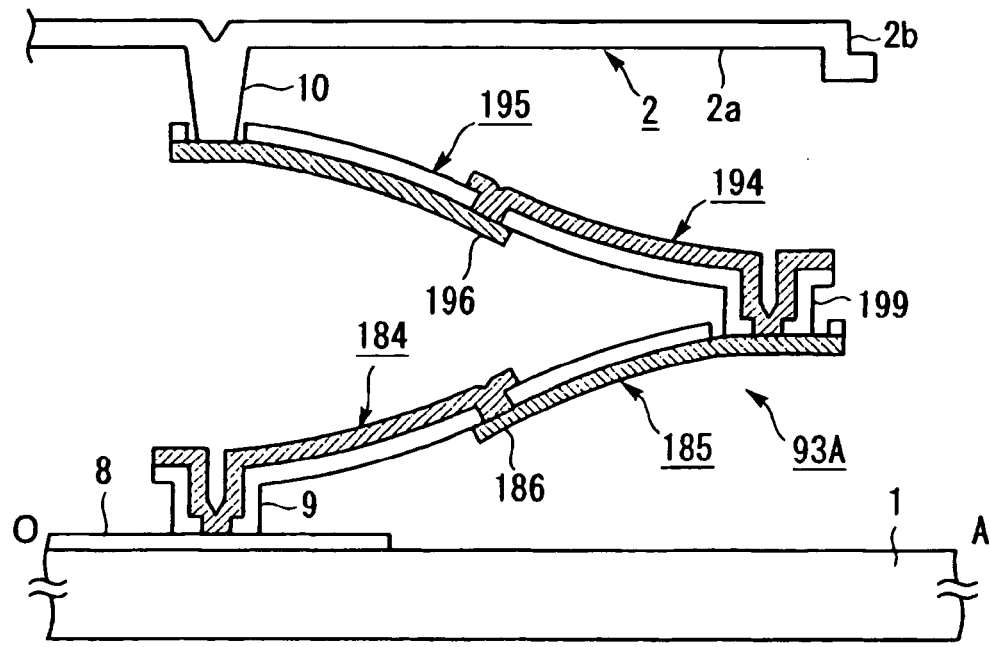
FIG. 17 is a schematic sectional view which shows in model form the supporting part of a unit element of a mirror device constituting an eleventh embodiment of the present invention.

FIG. 17 is a schematic sectional view which shows in model form the supporting part 93A of a unit element of a mirror device constituting an eleventh embodiment of the present invention. In FIG. 17, elements that are the same as elements in FIGS. 1 through 3, or that correspond to elements in FIGS. 1 through 3, are labeled with the same symbols, and a redundant description is omitted.

The present embodiment differs from the above-mentioned first embodiment only in that the supporting part 3A shown in FIG. 1 is replaced by the supporting part 93A shown in FIG. 17, and in that the supporting parts 3B and 3C shown in FIG. 1 are respectively replaced by supporting parts (not shown in the figures) which have the same structure as that of the supporting part 93A shown in FIG. 17. The supporting part 93A constitutes a thin-film elastic structural body.

While the supporting part 3A shown in FIGS. 1 and 2 has only one plate spring part 5, the supporting part 93A shown in FIG. 17 has four plate spring parts 184, 185, 194 and 195 that are mechanically connected to each other in series. As is shown in FIG. 17, specified end portions of these plate spring parts are mechanically connected to each other via connecting parts 186, 199 and 196 which have rising parts. The portion of the structure consisting of the leg part 9, plate spring part 184, connecting part 186 and plate spring part 185 shown in FIG. 17, and the portion of the structure consisting of the connecting part 199, plate spring part 194, connecting part 196 and plate spring part 195 shown in FIG. 17, are completely the same as the portion of the structure consisting of the leg part 9, plate spring part 24, connecting part 46 and plate spring part 25 shown in FIG. 11. The shape formed by the plate spring parts 184, 185, 194 and 195 as a whole is a shallow "V" shape as seen in a side view of the entire assembly from the direction perpendicular to the page in FIG. 17. This portion forms a single straight line as seen in a plan view.

Advantages similar to those of the above-mentioned tenth embodiment can also be obtained in the present embodiment.

In the above-mentioned tenth and eleventh embodiments, the shape formed by the plate spring parts as a whole was a single shallow "V" shape as seen in a side view. In the present invention, two or more such structural portions with a shallow "V" shape as shown in FIG. 16 or FIG. 17 may also be connected in series. For example, in a case where two such structural portions are connected, the height of the mirror 2 may be raised in FIG. 16 or FIG. 17, and a structure which is the same as the structure extending from the leg part 9 to the plate spring part may be connected between the connecting part 10 and the plate spring part 95 or 195 shown in FIG. 16 or FIG. 17. In this case, the structural portion with a shallow "V" shape that is inserted may be disposed in a position that is rotated by an arbitrary angle about the normal of the plane of the substrate 1 passing through the leg part 9 and connecting part 10 shown in FIG. 16 or FIG. 17. In such a case, the shape formed by the plate spring parts as a whole is a connected shape of shallow "V" shapes as seen in side views of the respective portions from an appropriate specified direction.

[Twelfth Embodiment]

Figure 18:
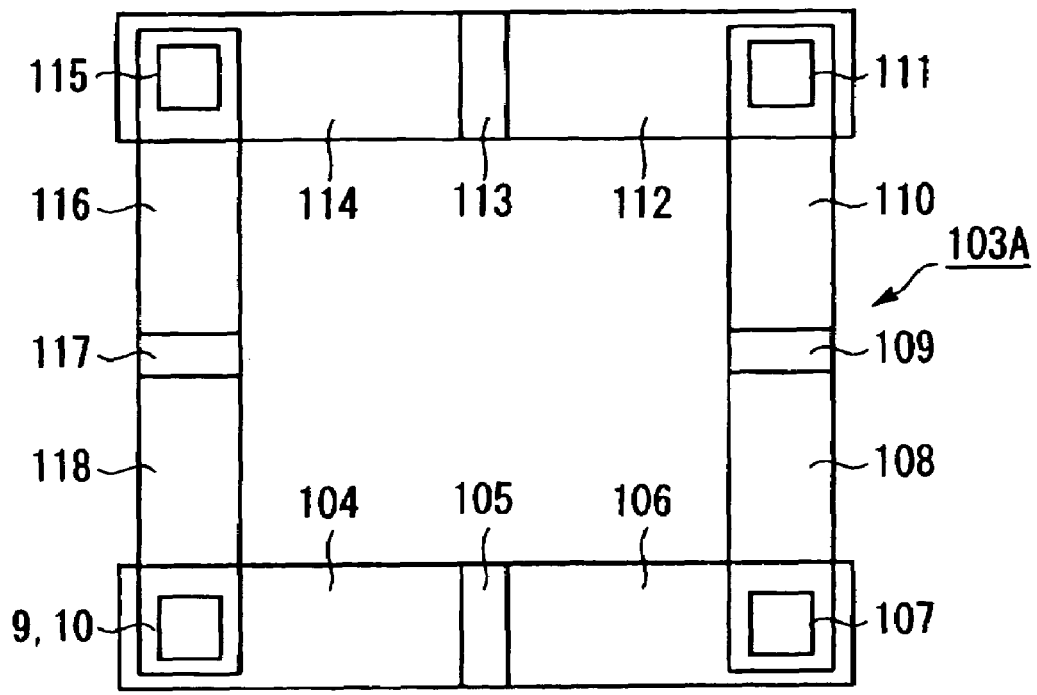
FIG. 18 is a schematic plan view which shows in model form the supporting part of a unit element of a mirror device constituting a twelfth embodiment of the present invention.

FIG. 18 is a schematic plan view which shows in model form the supporting part 103A of a unit element of a mirror device constituting a twelfth embodiment of the present invention. In FIG. 18, elements that are the same as elements shown in FIGS. 1 through 3, or that correspond to elements shown in FIGS. 1 through 3, are labeled with the same symbols, and a redundant description is omitted. In FIG. 18, the leg part 9 is seen as overlapping with the connecting part 10; however, this leg part 9 is located in a deeper position with respect to the plane of the page than the connecting part 10.

The present embodiment differs from the above-mentioned first embodiment only in that the supporting part 3A shown in FIG. 1 is replaced by the supporting part 103A shown in FIG. 18, and in that the supporting parts 3B and 3C shown in FIG. 1 are respectively replaced by supporting parts (not shown in the figures) which have the same structure as that of the supporting part 103A shown in FIG. 18. The supporting part 103A constitutes a thin-film elastic structural body.

While the supporting part 3A shown in FIGS. 1 and 2 has only one plate spring part 5, the supporting part 103A shown in FIG. 18 has eight plate spring parts 104, 106, 108, 110, 112, 114, 116 and 118 that are mechanically connected to each other in series. As is shown in FIG. 18, specified end portions of these plate spring parts are mechanically connected to each other via connecting parts 107, 111 and 115 that have rising parts, and connecting parts 105, 109, 113 and 117 that do not have rising parts. The portion of the structure consisting of the leg part 9, plate spring part 104, connecting part 105 and plate spring part 106 shown in FIG. 18, the portion of the structure consisting of the connecting part 107, plate spring part 108, connecting part 109 and plate spring part 110 shown in FIG. 18, the portion of the structure consisting of the connecting part 111, plate spring part 112, connecting part 113 and plate spring part 114 shown in FIG. 18, and the portion of the structure consisting of the connecting part 115, plate spring part 116, connecting part 117 and plate spring part 118 shown in FIG. 18, are completely the same as the portion of the structure consisting of the leg part 9, plate spring part 24, connecting part 46 and plate spring part 25 shown in FIG. 11 (these structural portions may also be the same as the corresponding structure shown in FIG. 9). The shape formed by the above-mentioned eight plate spring parts as a whole is a spiral shape which forms a square shape as seen in a plan view from the normal direction of the plane of the substrate 1. In the present embodiment, the mechanical connection route formed by the above-mentioned eight plate spring parts makes one circuit about this normal direction; however, this connection route may also make more than one circuit.

In the present embodiment, even if the height of the mirror 2 varies, the end portion of the plate spring part 104, this end portion being mechanically connected to the substrate 1 via the leg part 9, and the end portion of the plate spring part 118, this end portion being mechanically connected to the mirror 2, are always positioned in substantially the same position as seen in a plan view from the normal direction of the plane of the substrate 1. In the present embodiment, furthermore, the end portion of the plate spring part 118 in which this end portion is mechanically connected to the mirror 2 (i.e., the end portion in the vicinity of the connecting part 10) is substantially parallel to the plane of the substrate 1. In the present embodiment, the bending directions and lengths of the respective plate spring parts are set so that such a substantially parallel orientation is obtained.

Accordingly, advantages similar to those of the above-mentioned tenth and eleventh embodiments can also be obtained in the present embodiment.

[Thirteenth Embodiment]

Figure 20:
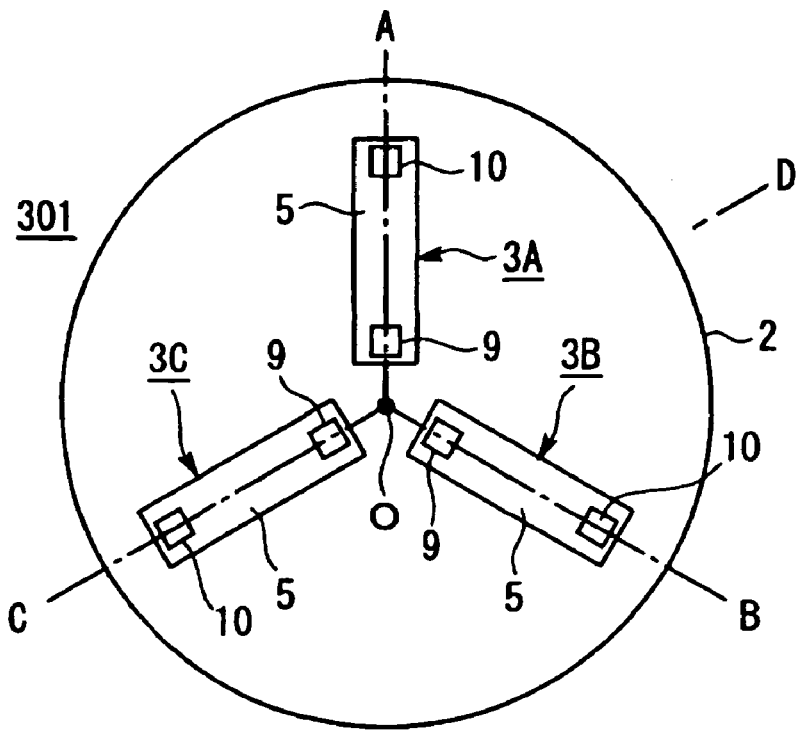
FIG. 20 is a schematic plan view which shows in model form a unit element of a mirror device constituting the thirteenth embodiment of the present invention.
Figure 21:
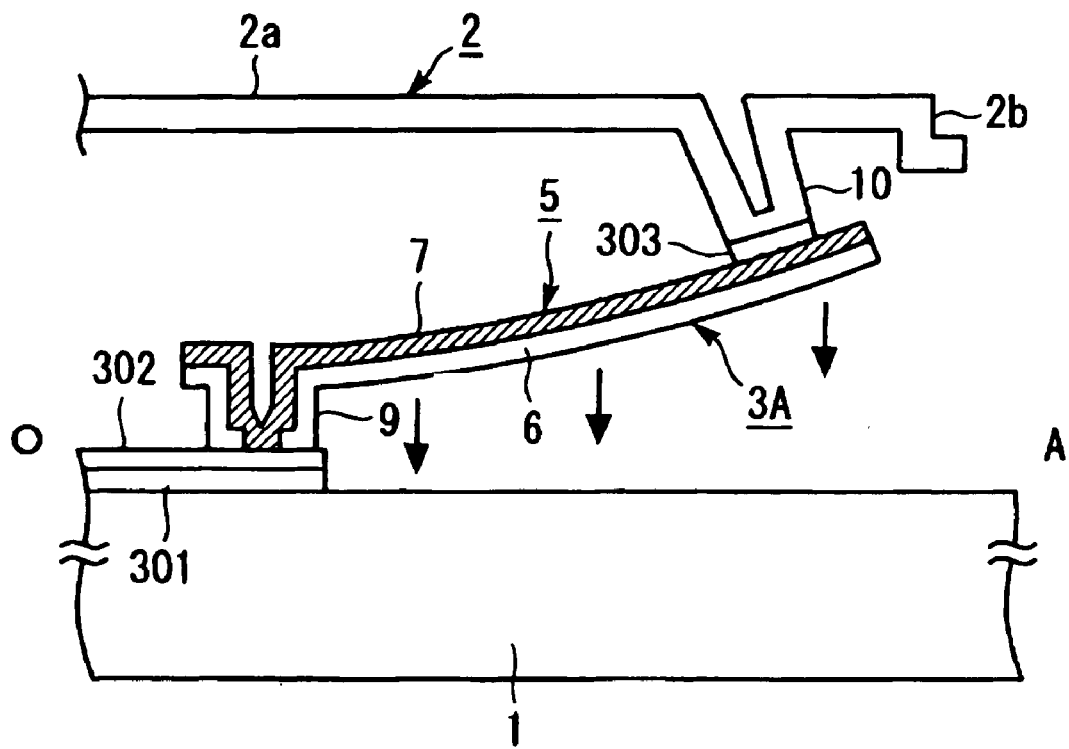
FIG. 21 is a schematic sectional view along line O–A in FIG. 20.

FIG. 20 is a schematic plan view which shows in model form a unit element of a mirror device constituting a thirteenth embodiment of the present invention. FIG. 21 is a schematic sectional view along line O–A in FIG. 20. Although this is not shown in the figures, the schematic sectional view along line O–B in FIG. 20 and the schematic sectional view along line O–C in FIG. 20 are similar to FIG. 21. In FIGS. 20 and 21, elements that are the same as elements in FIGS. 1 through 3, or that correspond to elements in FIGS. 1 through 3, are labeled with the same symbols, and a redundant description is omitted. Furthermore, in the following description, the vertical direction is in accordance with FIG. 21.

The present embodiment differs from the above-mentioned first embodiment only in the respects described below.

The above-mentioned first embodiment is constructed so that the electrostatic force which acts as a driving force used to incline the mirror 2 is caused to act between the mirror 2 and the electrodes 4a, 4b and 4c on the substrate 1. In the present embodiment, on the other hand, the device is constructed so that the electrostatic force used as the above-mentioned driving force (indicated by the arrows in FIG. 21) is caused to act between the plate spring parts 5 of the respective supporting parts 3A through 3C and the substrate 1.

Specifically, in the present embodiment, the electrodes 4a, 4b and 4c on the substrate 1 (see FIG. 1) are eliminated. An Si substrate is used as the substrate 1, and the substrate 1 forms a common electrode on the fixed side, which is used to generate the above-mentioned electrostatic force. Meanwhile, the upper-side Al films 7 of the plate spring parts 5 of the respective supporting parts 3A through 3C constitute electrodes that are used to cause this electrostatic force to act between these electrodes and the substrate 1. In the present embodiment, an insulating film 303 consisting of an SiN film, etc., is formed between the connecting part 10 of the mirror 2 and the Al films 7, so that the mirror 2 does not contribute to the generation of the electrostatic force.

An insulating film 301 consisting of an SiN film, etc., is formed on the substrate 1; however, this insulating film 301 is not formed on the undersides of the Al films 7 of the plate spring parts 5 of the respective supporting parts 3A through 3C. The portions of the substrate 1 beneath the Al films 7 of the plate spring parts 5 constitute the other electrodes that face the Al films constituting electrodes. Furthermore, it would also be possible to use a glass substrate as the substrate 1 instead of an Si substrate, and to form fixed-side electrodes on the facing portions of the glass substrate beneath the Al films 7. In the present embodiment, the lower-side SiN films 6 of the plate spring parts 5 also function as insulating layers in order to prevent electrical contact between the Al films 7 and the substrate 1.

The Al films 7 are electrically connected to the wiring patterns 302 (not shown in FIG. 20) via openings formed in the SiN films 6 in the leg parts 9. The wiring patterns 302 are formed on the insulating film 301, and are thus electrically insulated from the substrate 1. The wiring patterns 302 of the respective supporting parts 3A through 3C are insulated from each other, so that voltages of arbitrary levels can be independently applied via the wiring patterns 302 of the respective supporting parts 3A through 3C to the Al films (electrodes) 7 of the plate spring parts 5 of the respective supporting parts 3A through 3C between these Al films 7 and the substrate 1.

In the present embodiment, the substrate 1 is grounded, and potentials of arbitrary levels with reference to the substrate 1 can be independently applied to the Al films 7 of the plate spring parts 5 of the supporting parts 3A through 3C. An electrostatic force of a magnitude corresponding to the levels of the potentials that are applied to the electrodes of the Al films 7 of the respective supporting parts 3A through 3C acts between the Al films 7 of the plate spring parts 5 of the respective supporting parts 3A through 3C and the portions of the substrate 1 that face these Al films 7.

Since the magnitude of the electrostatic force is inversely proportional to the square of the distance between the electrodes, the electrostatic force is also larger closer to the leg parts 9, given the fact that the gap between the Al films 7 of the plate spring parts 5 and the substrate 1 is narrower in areas close to the leg parts 9 in FIG. 21. Accordingly, the plate spring parts 5 are successively drawn toward the substrate 1 from the portions of the plate spring parts 5 that are close to the leg parts 9, so that the plate spring parts 5 are deformed. Then, the deformation of the plate spring parts 5 also stops in a state in which the spring force (recovery force) of the plate spring parts 5 and the electrostatic force are in equilibrium, so that the mirror 2 is inclined. Since the two plate spring parts 5 of the other supporting parts are connected to a given plate spring part 5 via the mirror 2, the spring forces (recovery forces) of the other two plate spring parts 5 also naturally affect the state of equilibrium between the electrostatic force and this given plate spring part 5. Accordingly, the potential levels (with reference to the substrate 1) that are applied to the Al films 7 (electrodes) of the plate spring parts 5 of the respective supporting parts 3A through 3C act as driving signals that determine the direction of inclination and amount of inclination of the mirror 2.

It goes without saying that the mirror device of the present embodiment can be manufactured by a method based on the manufacturing method of the mirror device constituting the above-mentioned first embodiment.

Advantages similar to those of the above-mentioned first embodiment can also be obtained in the present embodiment. Furthermore, in the present embodiment, since the electrostatic force acts between the Al films 7 of the plate spring parts 5 and the substrate 1, the inter-electrode distance can be made narrower than in the above-mentioned first embodiment, in which the electrostatic force acts between the electrodes 4a through 4c on the surface of the substrate 1 and the mirror 2. Accordingly, in the present embodiment, the mirror can be driven (i.e., inclined) with a low electric power.

[Fourteenth Embodiment]

Figure 22:
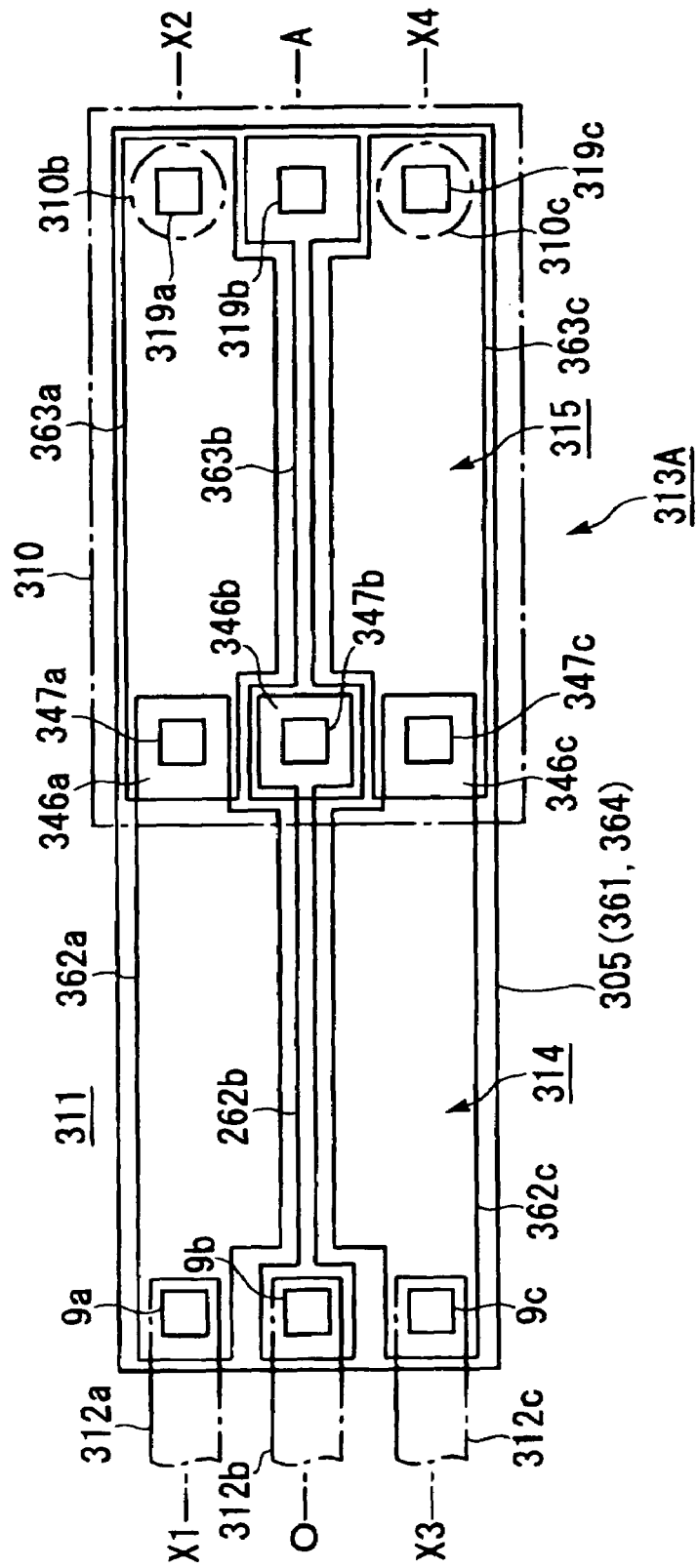
FIG. 22 is a schematic plan view which shows in model form the intermediate plate and portion on the lower side of this intermediate plate in a unit element of a mirror device constituting a fourteenth embodiment of the present invention.
Figure 23:
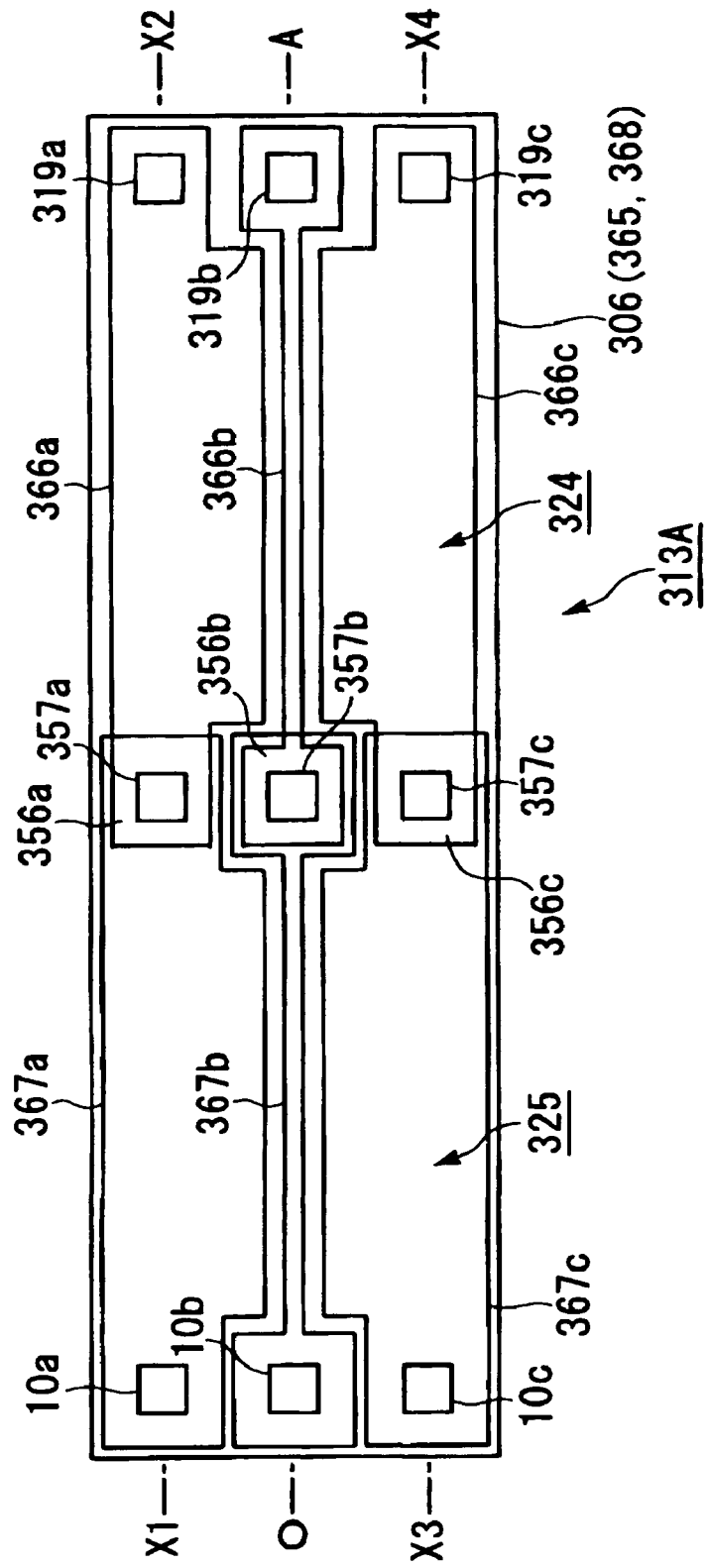
FIG. 23 is a schematic plan view showing in model form the portion on the upper side of the intermediate plate in the unit element of the mirror device constituting the fourteenth embodiment of the present invention.
Figure 24:
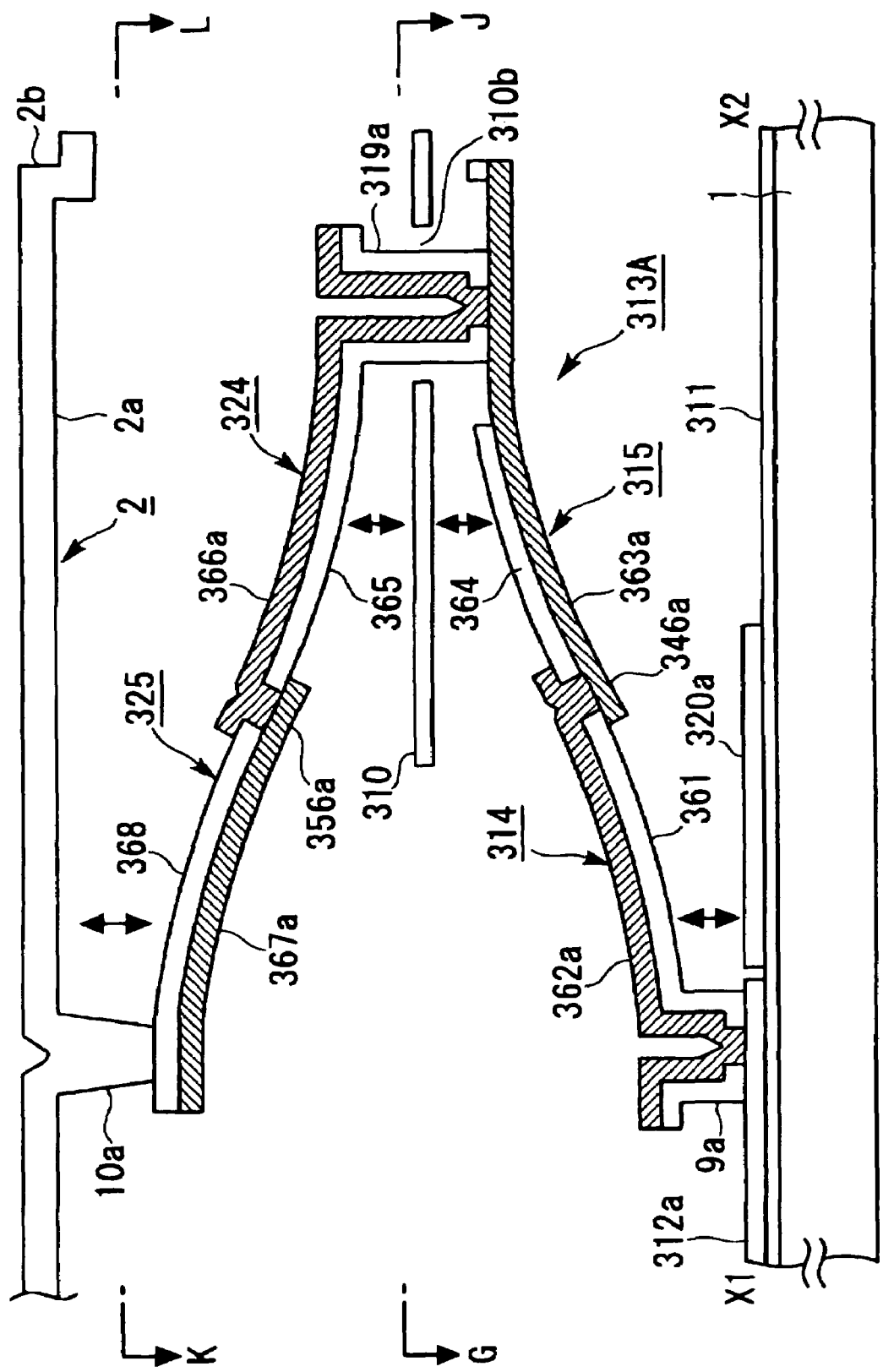
FIG. 24 is a schematic sectional view along line X1–X2 in FIGS. 22 and 23.
Figure 25:
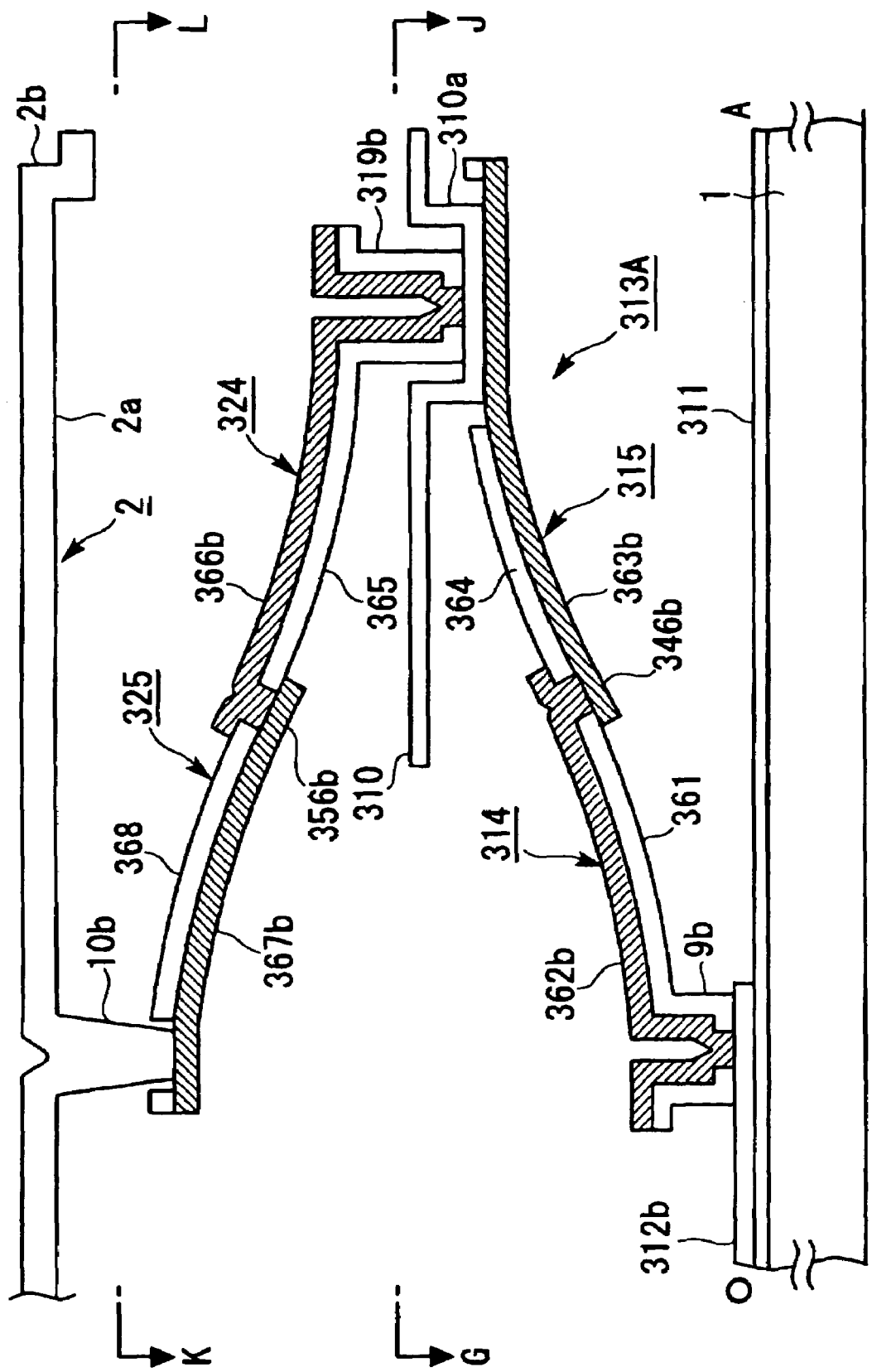
FIG. 25 is a schematic sectional view along line O–A in FIGS. 22 and 23.
Figure 26:
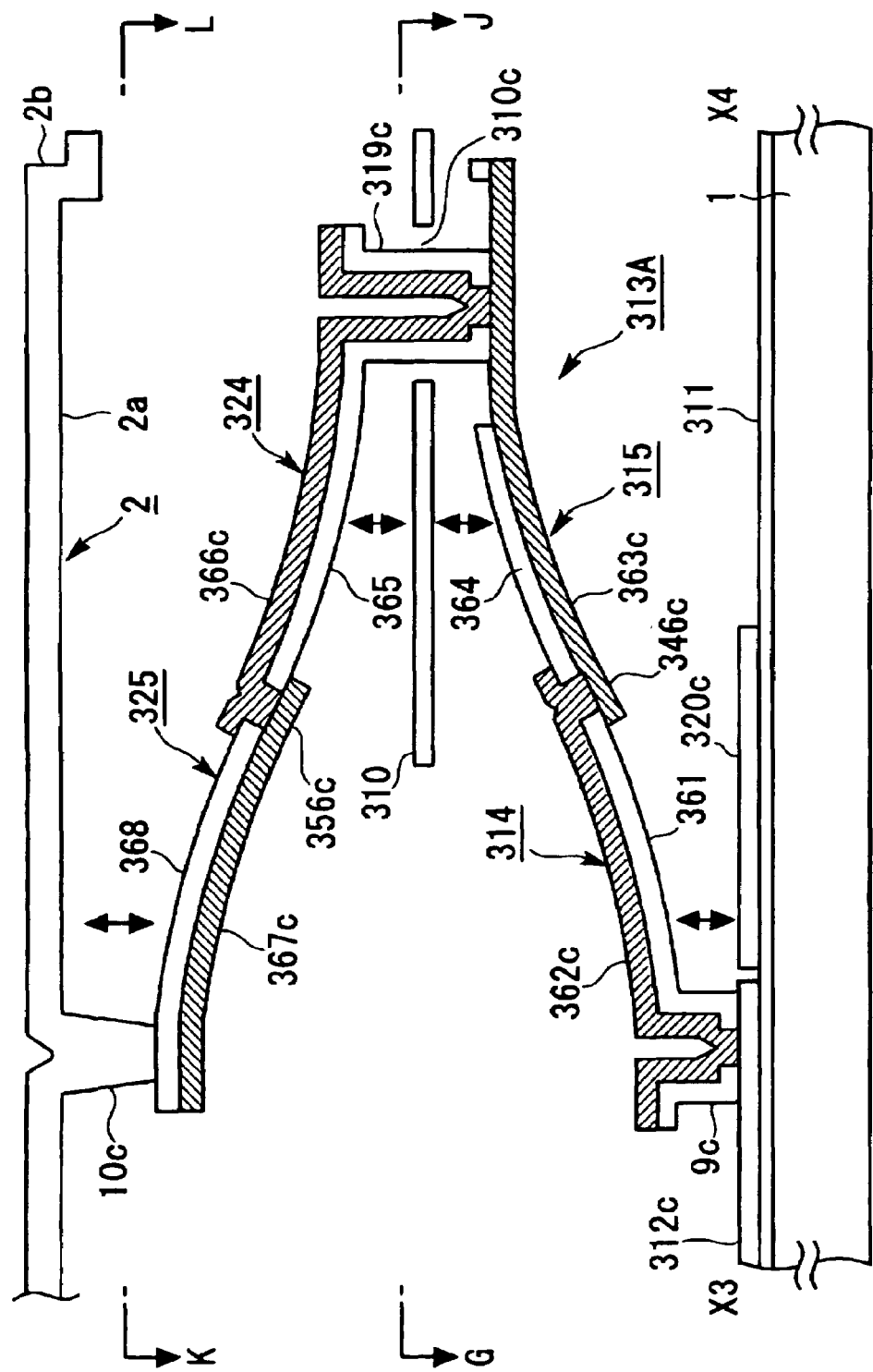
FIG. 26 is a schematic sectional view along line X3–X4 in FIGS. 22 and 23.

FIG. 22 is a schematic plan view which shows a model form the intermediate plate 310 and the area below this intermediate plate 310 (i.e., the area on the side of the substrate 1) in a unit element of a mirror device constituting a fourteenth embodiment of the present invention; this figure corresponds to the arrow views along the line G-J in FIGS. 24 through 26. In FIG. 22, for convenience of graphic illustration, a portion of the element is indicated by imaginary lines. FIG. 23 is a schematic plan view which shows in model form the area above the intermediate plate 310 (on the opposite side from the substrate 1, excluding the mirror 2) of the above-mentioned unit element of the mirror device constituting a fourteenth embodiment of the present invention; this figure corresponds to the arrow views along the line K-L in FIGS. 24 through 26. FIG. 24 is a schematic sectional view along the line X1-X2 in FIGS. 22 and 23. FIG. 25 is a schematic sectional view along the line O-A in FIGS. 22 and 23 (corresponding to the line O-A in FIG. 20). FIG. 26 is a schematic sectional view along the line X3-X4 in FIGS. 22 and 23.

In FIGS. 22 through 26, elements that are the same as elements shown in FIGS. 20 and 21, or that correspond to elements shown in FIGS. 20 and 21, are labeled with the same symbols, and a redundant description is omitted.

The present embodiment differs from the above-mentioned thirteenth embodiment only in that the supporting part 3A shown in FIG. 20 is replaced by the supporting part 313A shown in FIGS. 22 through 26, in that the supporting parts 3B and 3C shown in FIG. 20 are respectively replaced by supporting parts (not shown in the figures) which have the same structure as that of the supporting part 313A shown in FIGS. 22 through 26, in that an insulating film 311 consisting of SiN, etc., is formed over the entire surface of the substrate 1, and in that wiring patterns 312a through 312c that are electrically insulated from each other, and Al films 320a and 320c used as electrodes on the side of the substrate 1, etc., are formed on the insulating film 311. The supporting part 313A constitutes a thin-film elastic structural body.

The supporting part 313A has basically the same structure as the supporting part 93A of the mirror device constituting the above-mentioned eleventh embodiment shown in FIG. 17. This structure is modified so that the electrostatic force used as a driving force to incline the mirror 2 acts on respective plate spring parts 314, 315, 324 and 325.

The plate spring parts 314, 315, 324 and 325 respectively correspond to the plate spring parts 184, 185, 194 and 195 shown in FIG. 17, and the mechanical connection relationship, upper and lower relationship of the Al films and SiN films, and setting of the bending and lengths, etc., are also the same. The Al films are conductive thin films. The main differences between the two embodiments are as follows: namely, the respective Al films that form respective parts of the plate spring parts 314, 315, 324 and 325 are divided into three parts in the direction of width; accordingly, three leg parts 9a through 9c corresponding to the leg part 9 shown in FIG. 17, three connecting parts 346a through 346c corresponding to the connecting part 186 shown in FIG. 17, three connecting parts 319a through 319c corresponding to the connecting part 199 shown in FIG. 17, three connecting parts 356a through 356c corresponding to the connecting part 196 shown in FIG. 17, and three connecting parts 10a through 10c corresponding to the connecting part 10 shown in FIG. 17, are provided.

The plate spring part 314 is constructed from a thin film of two layers (only one layer in locations where the Al films 362a through 362c are not formed) in which a lower-side SiN film 361 and upper-side Al films 362a through 362c divided into three parts are laminated.

The leg part 9a is constructed by extending "as is" the SiN film 361 and Al film 362a constituting the plate spring part 314. The Al film 362a is electrically connected to a wiring pattern 312a via an opening formed in the SiN film 361 in the leg part 9a. The leg part 9b is constructed by extending "as is" the SiN film 361 and Al film 362b constituting the plate spring part 314. The Al film 362b is electrically connected to a wiring pattern 312b via an opening formed in the SiN film 361 in the leg part 9b. The leg part 9c is constructed by extending "as is" the SiN film 361 and Al film 362c constituting the plate spring part 314. The Al film 362c is electrically connected to a wiring pattern 312c via an opening formed in the SIN film 361 in the leg part 9c.

The Al films 362a and 362c form electrodes that are used to cause an electrostatic force to act on the plate spring part

314 that has these Al films. The Al film 362*b* constitutes a simple wiring pattern which is used to maintain the potential of the mirror 2 and intermediate plate 310 (described later) at a specified potential, and is formed with a narrower width than the Al films 362*a* and 362*c*.

Furthermore, the SiN film 361 of the plate spring part 314 and the SIN film 364 of the plate spring part 315 (described later) form a single continuous SIN film; accordingly, in FIG. 22, this single continuous SIN film is indicated by the symbol 305.

The plate spring part 315 is constructed from a thin film of two layers (only one layer in locations where the Al films 363*a* through 363*c* are not formed) in which lower-side Al films 363*a* through 363*c* split into three parts and an upper-side SiN film 364 are laminated. The connecting part 346*a* is the portion where the Al films 362*a* and 363*a* overlap with each other; the Al films 362*a* and 363*a* are electrically connected via an opening 347*a* formed in the SiN film 305 in the connecting part 346*a*. The connecting part 346*b* is the portion where the Al films 362*b* and 363*b* overlap with each other; the Al films 362*b* and 363*b* are electrically connected via an opening 347*b* formed in the SiN film 305 in the connecting part 346*b*. The connecting part 346*c* is the portion where the Al films 362*c* and 363*c* overlap with each other; the Al films 362*c* and 363*c* are electrically connected via an opening 347*c* formed in the SiN film 305 in the connecting part 346*c*.

The Al films 363*a* and 363*c* form electrodes which are used to cause an electrostatic force to act on the plate spring part 315 that has these Al films. The Al film 363*b* constitutes a simple wiring pattern which is used to maintain the potential of the mirror 2 and intermediate plate 310 (described later) at a specified potential, and is formed with a narrower width than the Al films 363*a* and 363*c*.

The plate spring part 324 is constructed from a thin film of two layers (only one layer in locations where the Al films 366*a* through 366*c* are not formed) in which a lower-side SiN film 365 and upper-side Al films 366*a* through 366*c* split into three parts are laminated. The Al films 366*a* and 366*c* form electrodes which are used to cause an electrostatic force to act on the plate spring part 324 that has these Al films. The Al film 366*b* constitutes a simple wiring pattern which is used to maintain the potential of the mirror 2 at a specified potential, and is formed with a narrower width than the Al films 366*a* and 366*c*.

As is seen from the above description, the end portions of the pair of plate spring parts 315 and 324 are mechanically connected to each other by the connecting parts 319*a* through 319*c*, so that these plate spring parts face each other. These plate spring parts 315 and 324 respectively have Al films 363*a* and 366*a* as electrode parts which are used to cause an electrostatic force corresponding to the respective driving signals to act on these plate spring parts 315 and 324. Furthermore, in the present embodiment, an intermediate plate 310 used as a plate-form part that has an electrode part is mechanically connected to the end portions of the above-mentioned pair of plate spring parts 315 and 324 that are mechanically connected to each other, and is interposed between this pair of plate spring parts 315 and 324. More concretely, in the present embodiment, the intermediate plate 310 has a base part 310*a* which drops in the form of a cup in a location at one end corresponding to the connecting part 319*b*, and this base part 310*a* is fastened between the connecting part 319*b* and a portion of the Al film 363 that extends from the plate spring part 315. The intermediate plate 310 is constructed from an Al film formed overall (including the base part 310*a*) as a conductive thin film, and forms an electrode part which is used to cause an electrostatic force corresponding to the driving signals to act between this intermediate plate 310 and the plate spring part 315, and between this intermediate plate 310 and the plate spring part 324. Furthermore, in the present embodiment, the intermediate plate 310 is disposed exactly in the middle between the plate spring parts 315 and 324. Of course, the construction and disposition of the intermediate plate are not necessarily limited to the construction and disposition described above. As is seen from the above description, the intermediate plate 310 is electrically connected to the Al film 363*b* of the plate spring part 315. In the present embodiment, furthermore, escape holes 310*b* and 310*c* which allow the escape of the connecting part 319*a* and the connecting part 319*c* are respectively formed in the intermediate plate 310.

The connecting part 319*a* is constructed by extending "as is" the SiN film 365 and Al film 366*a* that constitute the plate spring part 324. The Al film 366*a* is electrically connected to the Al film 363*a* of the plate spring part 315 via an opening formed in the SiN film 365 in the connecting part 319*a*. The connecting part 319*b* is constructed by extending "as is" the SiN film 365 and Al film 366*b* that constitute the plate spring part 324. The connecting part 319*b* is fastened to one end portion of the plate spring part 315 via the base part 310*a* of the intermediate plate 310, which consists of an Al film (described later). The Al film 366*b* is electrically connected to the base part 310*a* of the intermediate plate 310 via an opening formed in the SiN film 365 in the connecting part 319*b*, and is electrically connected to the Al film 363*b* via this base part 310*a*. The connecting part 319*c* is constructed by extending "as is" the SiN film 365 and Al film 366*c* that constitute the plate spring part 324. The Al film 366*c* is electrically connected to the Al film 363*c* of the plate spring part 315 via an opening formed in the SiN film 365 in the connecting part 319*c*.

The SiN film 365 of the plate spring part 324 and the SiN film 368 of the plate spring part 325 (described later) form a single continuous SIN film; accordingly, this single continuous SiN film is indicated by the symbol 306 in FIG. 23.

The plate spring part 325 is constructed from a thin film of two layers (only one layer in locations where the Al films 367*a* through 367*c* are not formed) in which lower-side Al films 367*a* through 367*c* split into three parts and an upper-side SiN film 368 are laminated. The connecting part 356*a* is the portion where the Al films 366*a* and 367*a* overlap with each other, and the Al films 366*a* and 367*a* are electrically connected via an opening 357*a* formed in the SIN film 306 in the connecting part 356*a*. The connecting part 356*b* is the portion where the Al films 366*b* and 367*b* overlap with each other, and the Al films 366*b* and 367*b* are electrically connected via an opening 357*b* formed in the SiN film 306 in the connecting part 356*b*. The connecting part 356*c* is the portion where the Al films 366*c* and 367*c* overlap with each other, and the Al films 366*c* and 367*c* are electrically connected via an opening 357*c* formed in the SiN film 306 in the connecting part 356*c*.

The connecting parts 10*a* and 10*c* are respectively fastened to the surface of the SiN film 368 of the plate spring part 325, and the mirror 2 is electrically insulated from the Al films 367*a* and 367*c* of the plate spring part 325 by the SiN film 368. Meanwhile, the connecting part 10*b* is fastened to the surface of the Al film 367*b* of the plate spring part 325 via an opening formed in the SiN film 368, so that the mirror 2 is electrically connected to the Al film 367*b*. As a result, the mirror 2 is also used as an electrode which generates an electrostatic force between the Al films 367a and 367c constituting the electrodes of the plate spring part 325.

Furthermore, Al films 320a and 320b used as electrode parts that respectively generate an electrostatic force between these electrode parts and the Al films 362a and 362c constituting the electrodes of the plate spring part 314 are respectively formed on the insulating film 311 of the substrate 1 in locations beneath the Al films 362a and 362c that face these Al films 362a and 362c. The Al films 320a and 320c are electrically connected to the wiring pattern 312b via wiring patterns not shown in the figures. Furthermore, the Al films 320a and 320c may also be formed as a continuous film without being separated.

As is seen from the above description, the Al films 362a, 363a, 366a and 367a are electrically connected to the wiring pattern 312a, so that these Al films are at the same potential. Independently from these connections in electrical terms, the Al films 362b, 363b, 366b, 367b, 320a and 320c, the intermediate plate 310 and the mirror 2 are electrically connected to the wiring pattern 312b, so that these parts are at the same potential. Furthermore, independently from all of these connections in electrical terms, the Al films 362c, 363c, 366c and 367c are electrically connected to the wiring pattern 312c, so that these Al films are at the same potential. Furthermore, the wiring patterns 312a and 312c may also be electrically connected to each other.

The system is arranged so that voltages (i.e., driving signals) of arbitrary levels can be independently applied across the wiring patterns 312b and wiring patterns 312a and 312c of the respective supporting parts 313A through 313C.

In the present embodiment, for example, the wiring patterns 312b of the respective supporting parts 313A through 313C are grounded, so that potentials of arbitrary levels can be independently applied to each of the respective supporting parts 313A through 313C (though the potential is the same in the wiring patterns 312a and 312c).

Assuming that the potential of the wiring pattern 312b is set at 0 V and that the potentials of the wiring patterns 312a and 312c are set at +V1 in the supporting part 313A, then, since the electrical connection relationship described above has been constructed, respective potential differences (voltages) of +V1 are applied across the Al films 362a and 362c (+V1) constituting the electrodes of the plate spring part 314 and the Al films 320a and 320c (0 V) constituting the electrodes on the substrate 1, across the Al films 363a and 363c (+V1) constituting the electrodes of the plate spring part 315 and the intermediate plate 310 (0 V), across the intermediate plate 310 (0 V) and the Al films 366a and 366c (+V1) constituting the electrodes of the plate spring part 324, and across the Al films 367a and 367c (+V1) constituting the electrodes of the plate spring part 325 and the mirror (0 V). Accordingly, a first electrostatic force acts between the plate spring part 314 and the substrate 1, a second electrostatic force acts between the plate spring part 315 and the intermediate plate 310, a third electrostatic force acts between the intermediate plate 310 and the plate spring part 324, and a fourth electrostatic force acts between the plate spring part 325 and the mirror 2. Furthermore, in FIGS. 24 and 26, the locations on which these electrostatic forces act are indicated by black arrows.

As a result of these electrostatic forces, the respective plate spring parts 314, 315, 324 and 325 are successively attracted from portions where the gaps are narrow, as in the case of the above-mentioned thirteenth embodiment. The supporting part 313A undergoes deformation, and when the electrostatic force and the spring forces (recovery forces) of the plate spring parts 314, 315, 324 and 325 reach an equilibrium, the deformation of the supporting part 313A stops. In the present embodiment, furthermore, since the positional relationships between the portions acting as the above-mentioned counter electrodes, and the areas of these portions, are set so that these values are more or less the same, the magnitudes of the above-mentioned first through fourth electrostatic forces are also more or less the same. Accordingly, the manner in which the plate spring parts are successively attracted from the portions where the gaps are narrow is more or less similar in all four places.

It goes without saying that the mirror device of the present embodiment can be manufactured by a method based on the manufacturing method of the mirror device constituting the above-mentioned seventh embodiment.

Advantages similar to those of the above-mentioned eleventh embodiment can also be obtained in the present embodiment. In the present embodiment, furthermore, since the above-mentioned first through fourth electrostatic forces act, the inter-electrode distance can be narrowed compared to the above-mentioned eleventh embodiment, in which an electrostatic force acts between the electrodes 4a through 4c on the substrate 1 and the mirror 2. Accordingly, in the present embodiment, the mirror 2 can be driven (i.e., inclined) by a low electric power. In the present embodiment, furthermore, since the magnitudes of the above-mentioned first through fourth electrostatic forces are more or less the same, the manner in which the plate spring parts are successively attracted from the portions where the gaps are narrow is more or less similar in all four locations. Accordingly, there is almost no load on the connecting parts 10a, 10b and 10c.

Furthermore, in cases where the supporting part structure of the present embodiment is used, if the mirror 2 is supported by a single supporting part as in the fifth embodiment shown in FIG. 8, then the mirror 2 will only move upward and downward, and will not tilt, even if a driving signal is supplied. Accordingly, in cases where the mirror 2 is to be inclined, it is desirable to install two or more supporting parts when the mirror 2 is to be inclined in one dimension, and to install three or more supporting parts when the mirror 2 is to be inclined in three dimensions.

[Fifteenth Embodiment]

Figure 27:
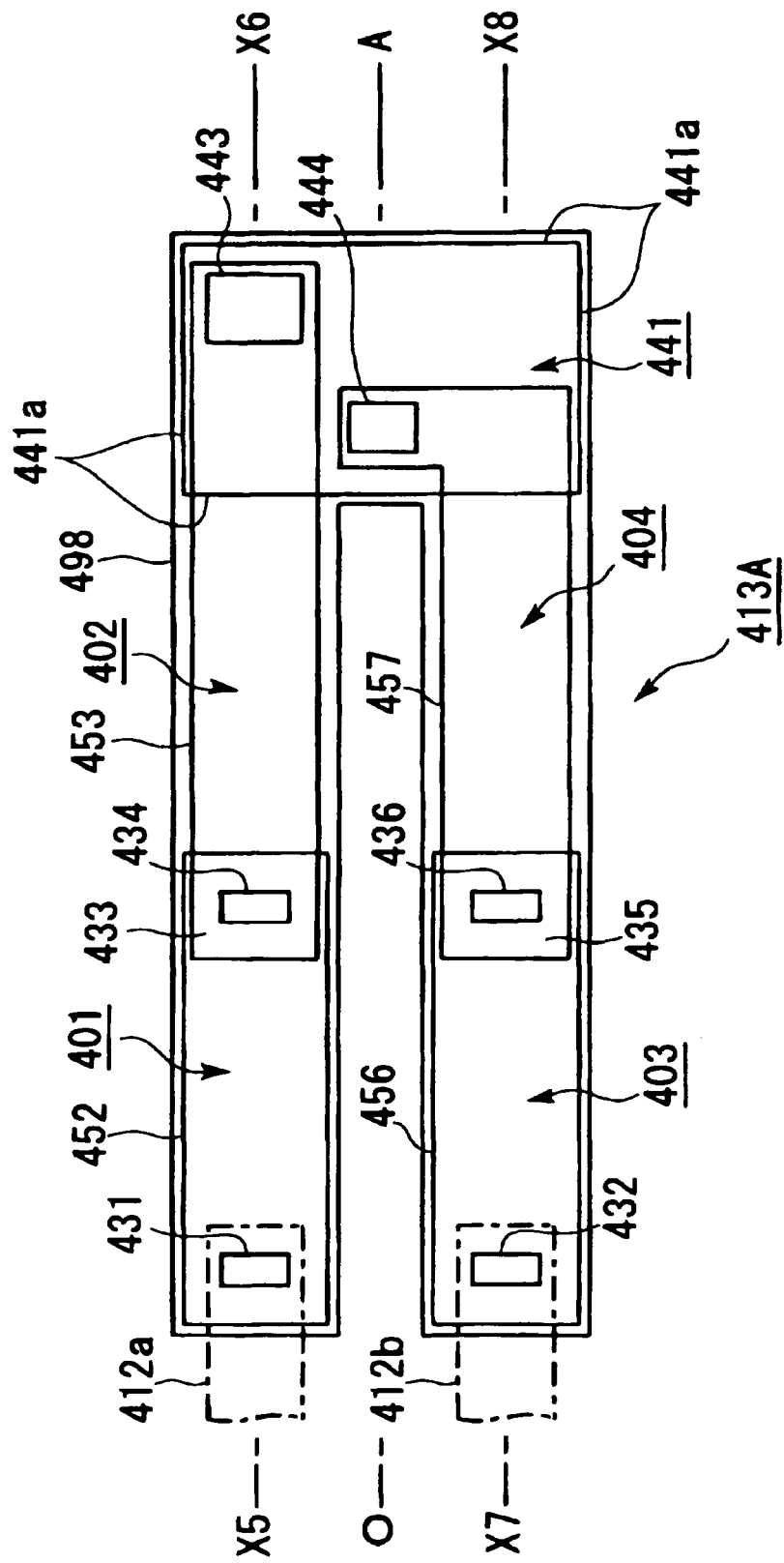
FIG. 27 is a schematic plan view which shows in model form the lower part of a unit element of a mirror device constituting a fifteenth embodiment of the present invention.
Figure 28:
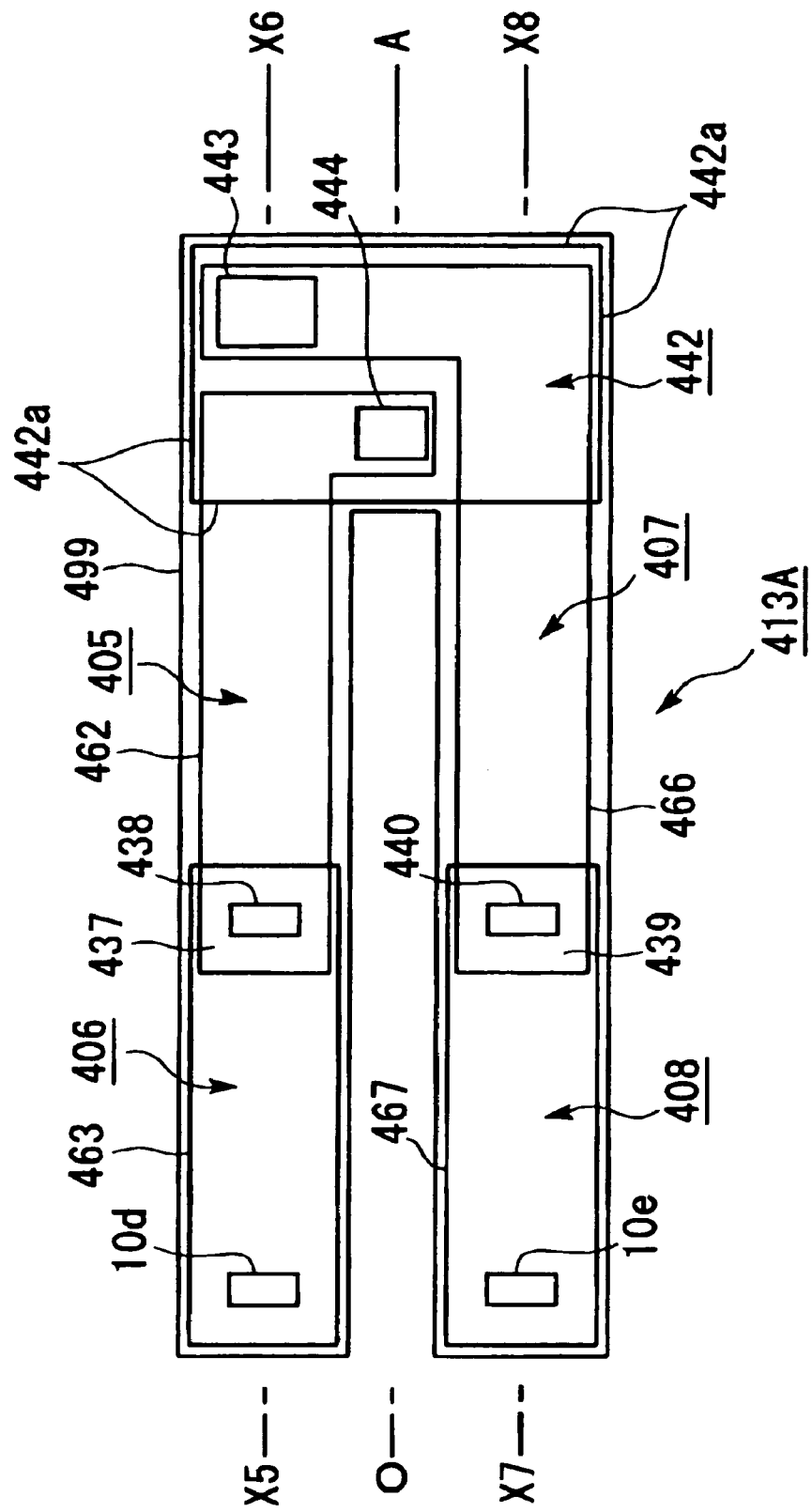
FIG. 28 is a schematic plan view which shows in model form the upper part of the unit element of the mirror device constituting the fifteenth embodiment of the present invention.
Figure 29:
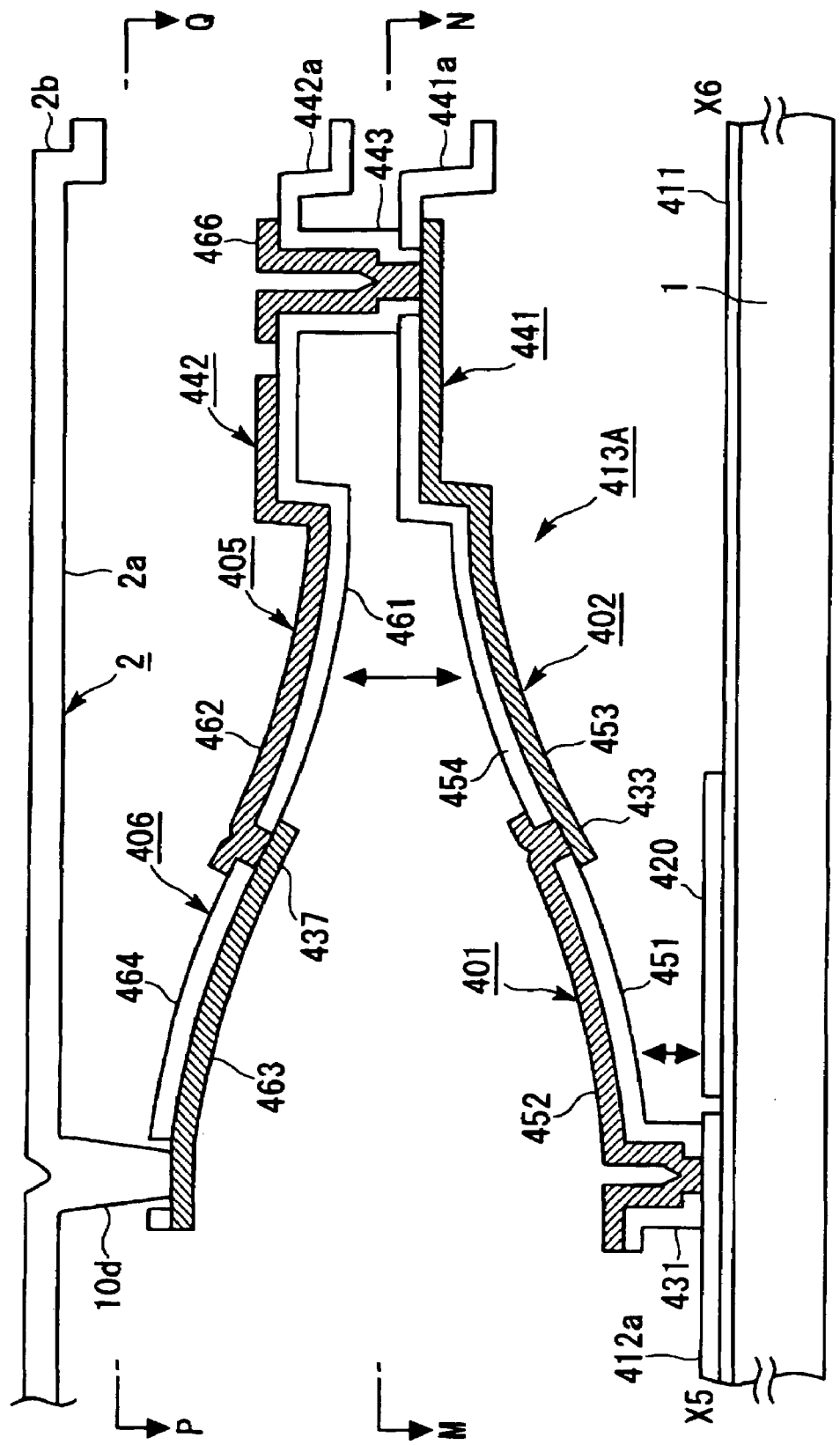
FIG. 29 is a schematic sectional view along line X5–X6 in FIGS. 27 and 28.
Figure 30:
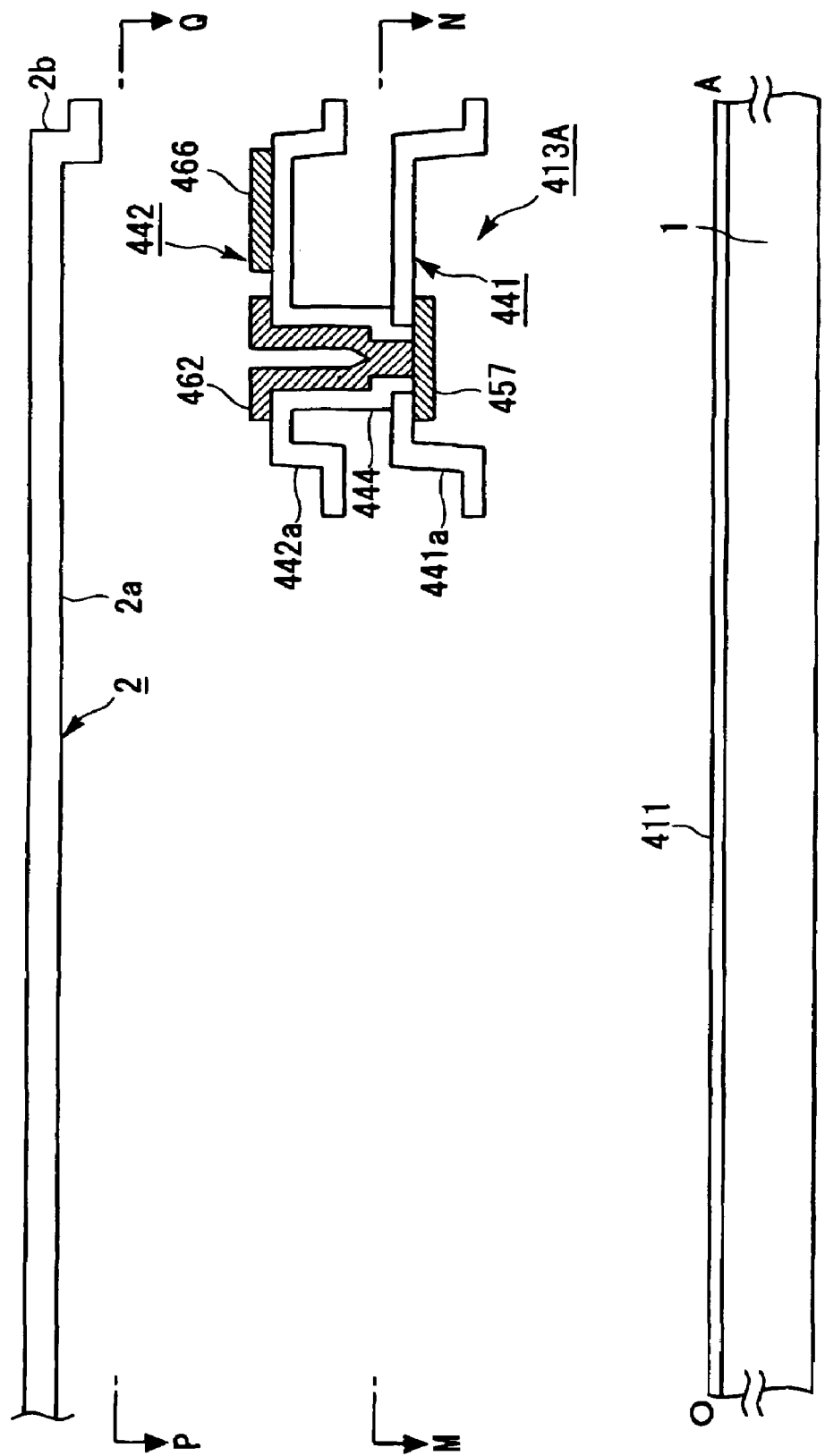
FIG. 30 is a schematic sectional view along line O–A in FIGS. 27 and 28 (corresponding to line O–A in FIG. 20).
Figure 31:
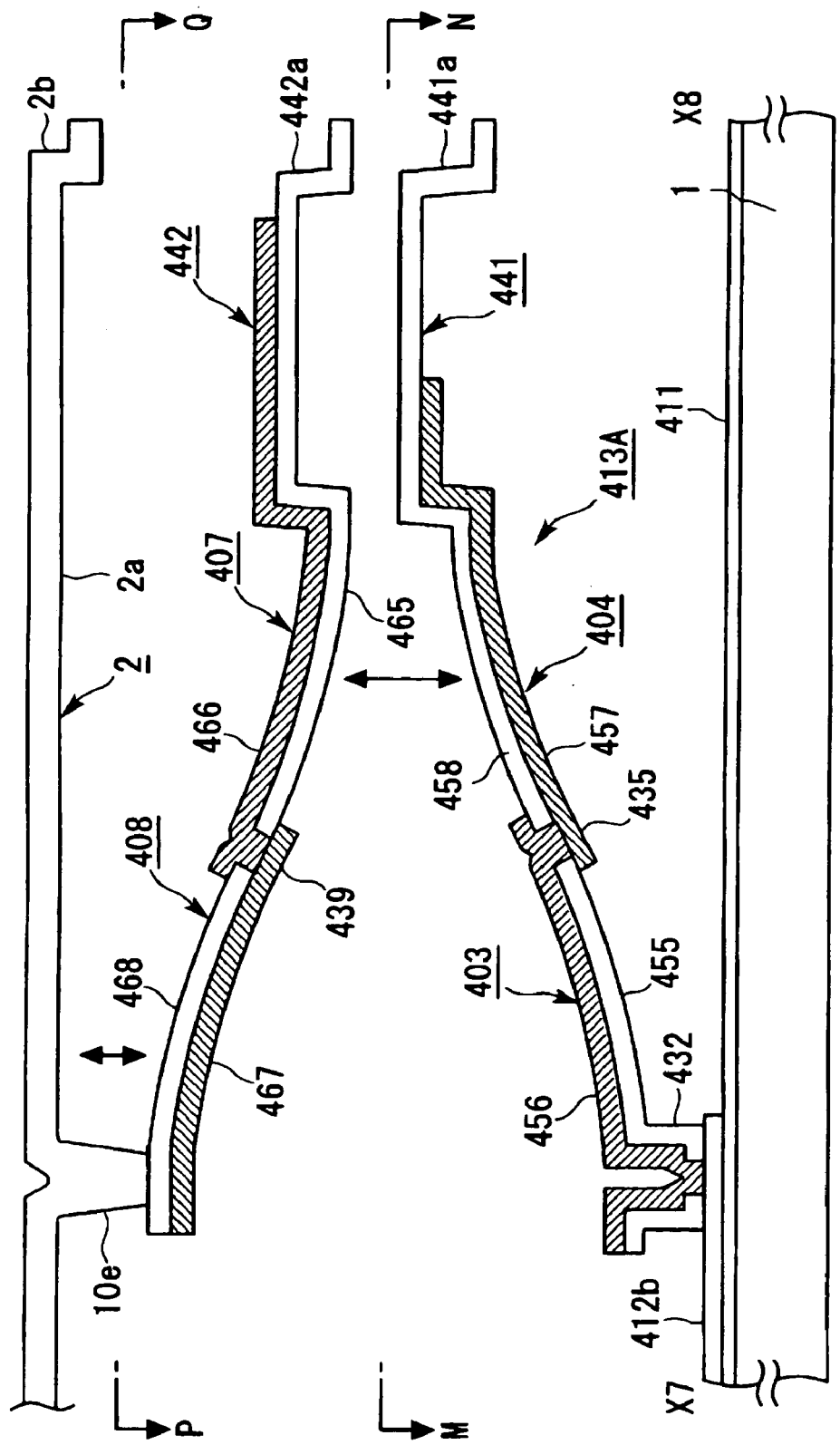
FIG. 31 is a schematic sectional view along line X7–X8 in FIGS. 27 and 28.

FIG. 27 is a schematic plan view which shows in model form the lower-side portion (portion on the side of the substrate 1) of a unit element of a mirror device constituting a fifteenth embodiment of the present invention. This figure corresponds to the arrow view along line M-N in FIGS. 29 through 31. For convenience of graphic illustration, a portion of the element is indicated by imaginary lines in FIG. 27. FIG. 28 is a schematic plan view which shows in model form the upper-side portion (portion on the opposite side from the substrate 1, excluding the mirror 2) of the above-mentioned unit element of the mirror device constituting a fifteenth embodiment of the present invention. This figure corresponds to the arrow view along line P–Q in FIGS. 29 through 31. FIG. 29 is a schematic sectional view along the line X5–X6 in FIGS. 27 and 28. FIG. 30 is a schematic sectional view along the line O–A in FIGS. 27 and 28 (corresponding to the line O–A in FIG. 20). FIG. 31 is a schematic sectional view along the line X7–X8 in FIGS. 27 and 28.

In FIGS. 27 through 31, elements that are the same as elements in FIGS. 20 and 21, or that correspond to elements in FIGS. 20 and 21, are labeled with the same symbols, and a redundant description is omitted.

The present embodiment differs from the above-mentioned thirteenth embodiment only in that the supporting part 3A shown in FIG. 20 is replaced by the supporting part 413A shown in FIGS. 27 through 31, in that the supporting parts 3B and 3C shown in FIG. 20 are respectively replaced by supporting parts (not shown in the figures) which have the same structure as that of the supporting part 413A shown in FIGS. 27 through 31, in that an insulating film 411 consisting of SiN, etc., is formed over the entire surface of the substrate 1, and in that wiring patterns 412a and 412b which are electrically insulated from each other, and an Al film 420 which is used as an electrode on the side of the substrate 1, etc., are formed on the insulating film 411. The supporting part 413A constitutes a thin-film elastic structural body.

Both the present embodiment and the above-mentioned fourteenth embodiment have in common the fact that an electrostatic force used as a driving force to incline the mirror 2 is caused to act on the plate spring parts; however, while an intermediate plate 310 is used in the above-mentioned fourteenth embodiment, no intermediate plate 310 is used in the present embodiment.

The basic structure of the supporting part 413A is a structure that is similar to that of the supporting part 93A of the mirror device constituting the above-mentioned eleventh embodiment shown in FIG. 17. Furthermore, a parallel mechanical connecting structure of the plate spring parts is also incorporated into this, and this structure is constructed so that the electrostatic force used as a driving force to incline the mirror 2 is caused to act on specified plate spring parts among the respective plate spring parts 401 through 408.

The two plate spring parts 401 and 402 and two plate spring parts 403 and 404 are mechanically connected in parallel, and the two plate spring part 405 and 406 and two plate spring parts 407 and 408 are mechanically connected in parallel; here, the two plate spring parts 401 and 402 and two plate spring parts 403 and 404 respectively correspond to the plate spring parts 184 and 185 shown in FIG. 17, and the two plate spring parts 405 and 406 and two plate spring parts 407 and 408 respectively correspond to the plate spring parts 194 and 195 shown in FIG. 17. The other mechanical connection relationships (except for the parallel mechanical connection relationships), the upper and lower relationship of the Al films and SiN films, and the setting of the manner of bending and lengths, etc., are the same. The leg parts 431 and 432 respectively correspond to the leg part 9 shown in FIG. 17, the connecting parts 433 and 435 respectively correspond to the connecting part 186 shown in FIG. 17, the connecting parts 437 and 439 respectively correspond to the connecting part 196 shown in FIG. 17, and the connecting parts 10d and 10e respectively correspond to the connecting part 10 shown in FIG. 17.

The plate spring part 401 is constructed from a two-layer thin film in which a lower-side SiN film 451 and an upper-side Al film 452 are laminated. The Al film 452 forms an electrode which is used to cause an electrostatic force to act on the plate spring part 401 that has this film. The leg part 431 is constructed by extending "as is" the SiN film 451 and Al film 452 that constitute the plate spring part 401. The Al film 452 is electrically connected to the wiring pattern 412a via an opening formed in the SiN film 451 in the leg part 431.

Furthermore, since the SiN film 451 of the plate spring part 401, the SIN films 454, 455 and 458 of the plate spring parts 402, 403 and 404 (described later) and the SIN film that constitutes the connecting part 441 (described later) consist of a single continuous SiN film, this single continuous SiN film is indicated by the symbol 498 in FIG. 27.

The plate spring part 402 is constructed from a two-layer thin film in which a lower-side Al film 453 and an upper-side SiN film 454 are laminated. The Al film 453 forms an electrode which is used to cause an electrostatic force to act on the plate spring part 402 that has this film. The connecting part 433 is the portion where the Al films 452 and 453 overlap with each other; the Al films 452 and 453 are electrically connected via an opening 434 formed in the SIN film 498 in the connecting part 433.

The plate spring part 403 is constructed from a two-layer thin film in which a lower-side SIN film 455 and an upper-side Al film 456 are laminated. The leg part 432 is constructed by extending "as is" the SiN film 455 and Al film 456 that constitute the plate spring part 403. The Al film 456 is electrically connected to the wiring pattern 412b via an opening formed in the SiN film 455 in the leg part 432.

The plate spring part 404 is constructed from a two-layer thin film in which a lower-side Al film 457 and an upper-side SiN film 458 are laminated. The Al film 457 forms an electrode which is used to cause an electrostatic force to act on the plate spring part 404 that has this film. The connecting part 435 is the portion where the Al films 456 and 457 overlap with each other; the Al films 456 and 457 are electrically connected via an opening 436 formed in the SiN film 498 in the connecting part 435.

The end portion of the plate spring part 402 on the opposite end from the connecting part 433 and the end portion of the plate spring part 404 on the opposite end from the connecting part 435 are mechanically connected by a connecting part 441. The connecting part 441 is constructed in the form of a flat plate by extending "as is" the SiN film 454 that constitutes the plate spring part 402 and the SiN film 458 that constitutes the plate spring part 404. A dropping part 441a is formed around the entire periphery of the connecting part 441; as a result, the rigidity of the connecting part 441 is increased.

The plate spring part 405 is constructed from a two-layer thin film in which a lower-side SiN film 461 and an upper-side Al film 462 are laminated. The Al film 462 forms an electrode which is used to cause an electrostatic force to act on the plate spring part 405 that has this film.

Furthermore, since the SiN film 461 of the plate spring part 405, the SiN films 464, 465 and 468 of the plate spring parts 406, 407 and 408 (described later) and the SiN film that constitutes the connecting part 442 consist of a single continuous SiN film, this single continuous SiN film is indicated by the symbol 499 in FIG. 28.

The plate spring part 406 is constructed from a two-layer thin film in which a lower-side Al film 463 and an upper-side SiN film 464 are laminated. The connecting part 437 is the portion where the Al films 462 and 463 overlap with each other; the Al films 462 and 463 are electrically connected via an opening 438 formed in the SiN film 499 in the connecting part 437.

The connecting part 10d is fastened to the surface of the Al film 463 of the plate spring part 406 via an opening formed in the SiN film 464, so that the mirror 2 is electrically connected to the Al film 463. In this way, the mirror 2 is also used as an electrode which generates an electrostatic force between itself and the Al film 467 constituting an electrode of the plate spring part 408 (described later).

The plate spring part 407 is constructed from a two-layer thin film in which a lower-side SiN film 465 and an upper-side Al film 466 are laminated. The Al film 466 forms an electrode which is used to cause an electrostatic force to act on the plate spring part 407 that has this film.

The plate spring part 408 is constructed from a two-layer thin film in which a lower-side Al film 467 and an upper-side SiN film 468 are laminated. The Al film 467 forms an electrode which is used to cause an electrostatic force to act on the plate spring part 408 that has this film. The connecting part 439 is the portion where the Al films 466 and 467 overlap with each other; the Al films 466 and 467 are electrically connected via an opening 440 formed in the SiN film 499 in the connecting part 439.

The connecting part 10e is fastened to the surface of the SiN film 468 of the plate spring part 408, so that the mirror 2 is electrically insulated from the Al film 467 of the plate spring part 408 by the SiN film 468.

The end portion of the plate spring part 405 on the opposite end from the connecting part 437 and the end portion of the plate spring part 407 on the opposite end from the connecting part 439 are mechanically connected by a connecting part 442. The connecting part 442 is constructed in the form of a flat plate by extending "as is" the SiN film 461 that constitutes the plate spring part 405 and the SiN film 465 that constitutes the plate spring part 407. A dropping part 442a is formed around the entire periphery of the connecting part 442; as a result, the rigidity of the connecting part 442 is increased.

The connecting part 441 and connecting part 442 are mechanically connected by connecting parts 443 and 444 so that the connecting part 441 and connecting part 442 face each other across a gap. The connecting part 443 is constructed by extending "as is" the SiN film that constitutes the connecting part 442 and the Al film 466 that constitutes the plate spring part 407. The Al film 453 that constitutes the plate spring part 402 extends to the location of the connecting part 443 on the connecting part 441. The Al films 466 and 453 are electrically connected via an opening formed in the SiN film in the connecting part 443. The connecting part 444 is constructed by extending "as is" the SiN film that constitutes the connecting part 442 and the Al film 462 that constitutes the plate spring part 406. The Al film 457 that constitutes the plate spring part 404 extends to the location of the connecting part 444 on the connecting part 441. The Al films 462 and 457 are electrically connected via an opening formed in the SiN film in the connecting part 444.

Furthermore, an Al film 420 used as an electrode part which respectively generates an electrostatic force between this electrode part and the Al film 452 is formed on the insulating film 411 of the substrate 1 in a location facing the Al film 452 constituting the electrode of the plate spring part 401 beneath this Al film 452. The Al film 420 is electrically connected to the wiring pattern 412b via a wiring pattern not shown in the figures.

As is seen from the above description, the Al films 452, 453, 466 and 467 are electrically connected to the wiring pattern 412a, so that these films are at the same potential. Independently from this in electrical terms, the Al films 456, 457, 462 and 463, the mirror 2 and the Al film 420 are electrically connected to the wiring pattern 412b, so that these parts are at the same potential.

The system is constructed so that voltages (i.e., driving signals) of arbitrary levels can be applied across the wiring patterns 412a and wiring patterns 412b of the respective supporting parts 413A through 413C independently of each other.

In the present embodiment, for example, the wiring patterns 412b of the respective supporting parts 413A through 413C are grounded, so that potentials of arbitrary levels can be applied to the wiring patterns 412a independently for each of the respective supporting parts 413A through 413C.

Assuming that the potential of the wiring pattern 412b is set at 0 V and that the potential of the wiring pattern 412a is set at +V2 in the supporting part 413A, then, since the above-mentioned electrical connection relationship is constructed, respective potential differences (voltages) of +V2 are applied across the Al film 452 (+V2) constituting the electrode of the plate spring part 401 and the Al film 420 (0 V) constituting the electrode on the substrate 1, across the Al film 453 (+V2) constituting the electrode of the plate spring part 402 and the Al film 462 (0 V) constituting the electrode of the plate spring part 405, across the Al film 457 (0 V) constituting the electrode of the plate spring part 404 and the Al film 466 (+V2) constituting the electrode of the plate spring part 407, and across the Al film 467 (+V2) constituting the electrode of the plate spring part 408 and the mirror (0 V).

Accordingly, a first electrostatic force acts between the plate spring part 401 and the substrate 1, a second electrostatic force acts between the plate spring part 402 and the plate spring part 405, a third electrostatic force acts between the plate spring part 404 and the plate spring part 407, and a fourth electrostatic force acts between the plate spring part 408 and the mirror 2. Furthermore, in FIGS. 29 and 30, the locations on which these electrostatic forces act are indicated by black arrows.

As in the above-mentioned thirteenth embodiment, the respective plate spring parts 401, 402, 404, 405, 407 and 408 are successively attracted by these electrostatic forces from the portions where the gaps are narrow. The supporting part 413A undergoes deformation, and when the electrostatic force and the spring forces (recovery forces) of the plate spring parts 401 through 408 reach an equilibrium, the deformation of the supporting part 413A stops. In this case, because of the above-mentioned mechanical connection relationships, the pairs of plate spring parts that are in a mutually parallel relationship in each hierarchical level (e.g., the plate spring part 401 and plate spring part 403, the plate spring part 405 and plate spring part 407) undergo deformation in the same manner; accordingly, there is no great twisting or warping of the supporting part 413A.

In the present embodiment, the positional relationships between the portions that serve as the above-mentioned respective counter electrodes are not necessarily the same (for example, the positional relationship of the electrode part 453 and electrode part 462 and the positional relationship of the electrode part 452 and electrode part 420 on the substrate 1 are different); however, if the widths of the respective plate spring parts are adjusted and the areas of the portions that serve as counter electrodes are appropriately adjusted, the conditions of the deformation of the plate spring parts in the vicinity of the connecting parts caused by the electrostatic force can be made more or less the same as in the case of the above-mentioned fourteenth embodiment.

It goes without saying that the mirror device of the present embodiment can be manufactured by a method based on the manufacturing method of the mirror device constituting the above-mentioned seventh embodiment.

Advantages similar to those of the above-mentioned eleventh embodiment can also be obtained in the present embodiment. In the present embodiment, since the above-mentioned first through fourth electrostatic forces act, the inter-electrode distance can be narrowed compared to the above-mentioned eleventh embodiment, in which an electrostatic force acts between the electrodes 4a through 4c on the substrate 1 and the mirror 2. Accordingly, in the present embodiment, the mirror 2 can be driven (i.e., inclined) using a low electric power.

In the present embodiment, furthermore, since the conditions of deformation of the plate spring parts by the electrostatic force in the vicinity of the connecting parts can be made more or less the same, the load on the connecting parts 10*d* and 10*e* can be almost eliminated.

[Sixteenth Embodiment]

Figure 32:
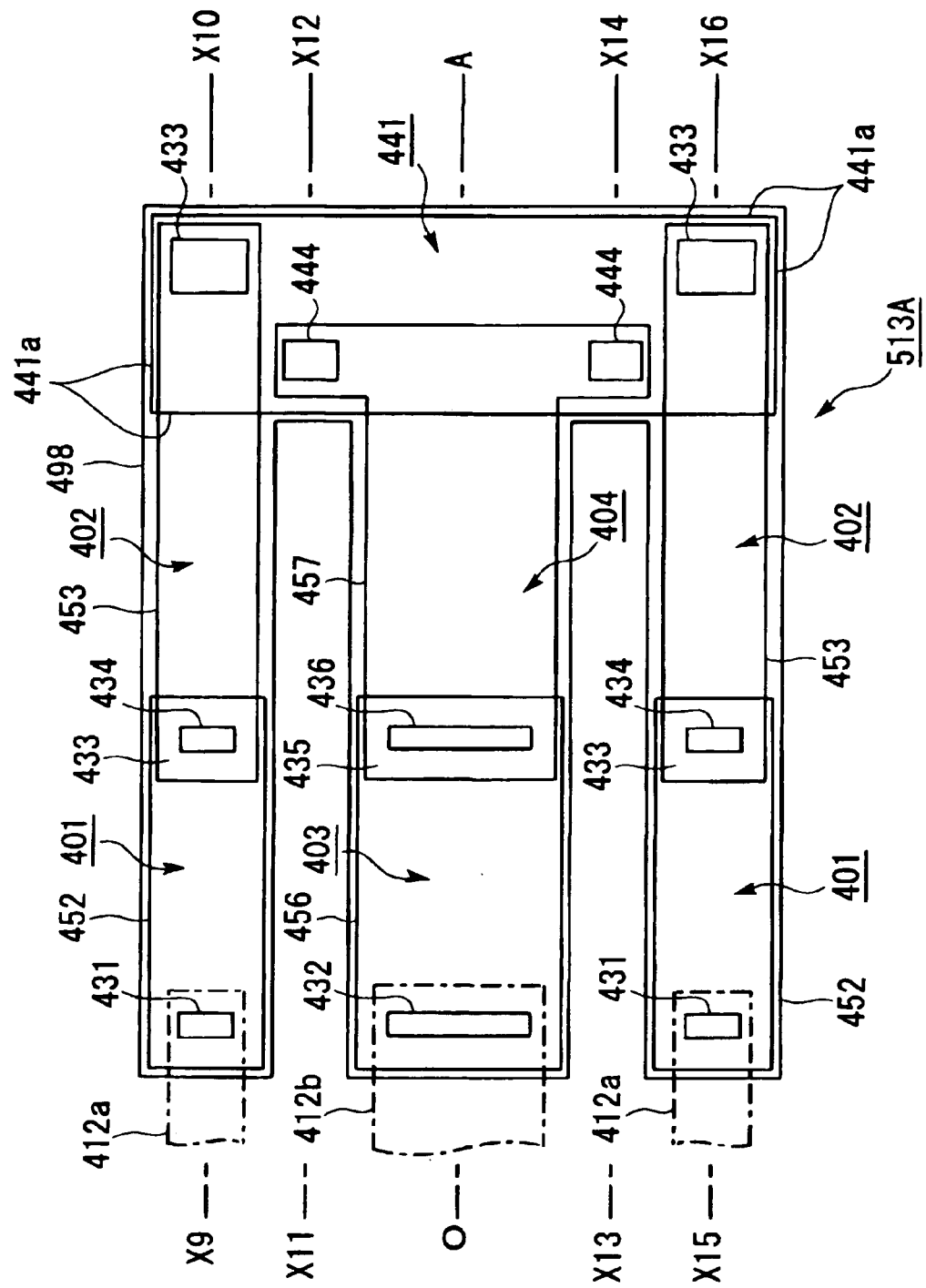
FIG. 32 is a schematic plan view which shows in model form the lower portion (on the side of the substrate 1) of a unit element of a mirror device constituting a sixteenth embodiment of the present invention.
Figure 33:
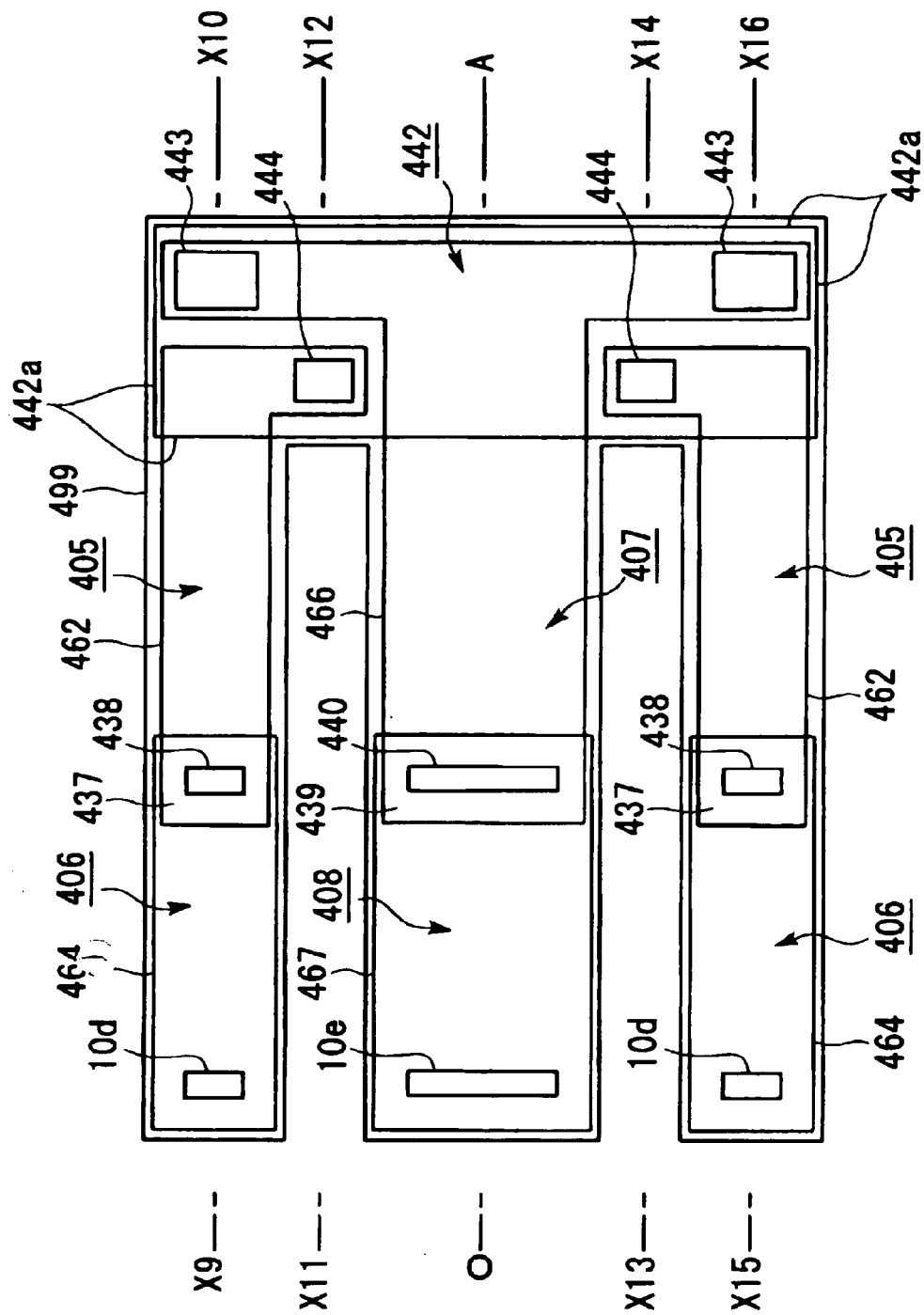
FIG. 33 is a schematic plan view which shows in model form the upper portion of the unit element of the mirror device constituting the sixteenth embodiment of the present invention.

FIG. 32 is a schematic plan view which shows in model form the lower-side portion (portion on the side of the substrate 1) of a unit element of a mirror device constituting a sixteenth embodiment of the present invention. This figure corresponds to FIG. 27. FIG. 33 is a schematic plan view which shows in model form the upper-side portion (portion on the opposite side from the substrate 1, excluding the mirror 2) of the above-mentioned unit element of the mirror device constituting the sixteenth embodiment of the present invention. This figure corresponds to FIG. 28. The schematic sectional view along the line X9–X10 in FIGS. 32 and 33 and the schematic sectional view along the line X15–X16 in FIGS. 32 and 33 are the same as FIG. 29. The schematic sectional view along the line X11–X12 in FIG. 32 and 33 and the schematic sectional view along the line X13–X14 in FIGS. 32 and 33 are the same as FIG. 30. The schematic sectional view along the line O–A in FIGS. 32 and 33 (corresponding to the line O–A in FIG. 20) is the same as FIG. 31.

In FIGS. 32 and 33, elements that are the same as elements in FIGS. 27 through 31, or that correspond to elements in FIGS. 27 through 31, are labeled with the same symbols, and a redundant description is omitted.

The present embodiment differs from the above-mentioned thirteenth embodiment only in that the supporting part 3A shown in FIG. 20 is replaced by the supporting part 513A shown in FIGS. 32 and 33, in that the supporting parts 3B and 3C shown in FIG. 20 are respectively replaced by supporting parts (not shown in the figures) which have the same structure as that of the supporting part 513A shown in FIGS. 32 and 33, in that as in the above-mentioned fifteenth embodiment, an insulating film 411 consisting of SiN, etc., is formed over the entire surface of the substrate 1, and in that wiring patterns 412*a* and 412*b* which are electrically insulated from each other, and an Al film 420 which is used as an electrode on the side of the substrate 1, etc., are formed on the surface of the insulating film 411. The supporting part 513A constitutes a thin-film elastic structural body.

In the supporting part 513A of the present embodiment, the portion on one side when the supporting part is cut along the line O–A in FIGS. 32 and 33 has essentially the same structure as that of the supporting part 413A shown in FIGS. 27 through 31, and the portion on the other side has essentially the same structure as a mirror image of that of the supporting part 413A shown in FIGS. 27 through 31.

Advantages similar to those of the above-mentioned fifteenth embodiment can also be obtained in the present embodiment. Furthermore, the possibility of the occurrence of torsion, etc., in the plate spring parts 401 through 408 during deformation cannot be ruled out in the case of the above-mentioned fifteenth embodiment; in the present embodiment, however, since the device has symmetry, the possibility of the occurrence of such torsion, etc., can be eliminated. In the present embodiment, furthermore, the conditions of deformation of the plate spring parts by the electrostatic force in the vicinity of the connecting parts can be made more or less the same by appropriately adjusting the widths of the middle plate spring parts 403, 404, 408 and 407 relative to the widths of the plate spring parts 401, 402, 405 and 406 on both sides, so that the load on the connecting parts 10*d* and 10*e* can be almost eliminated.

[Seventeenth Embodiment]

Figure 34:
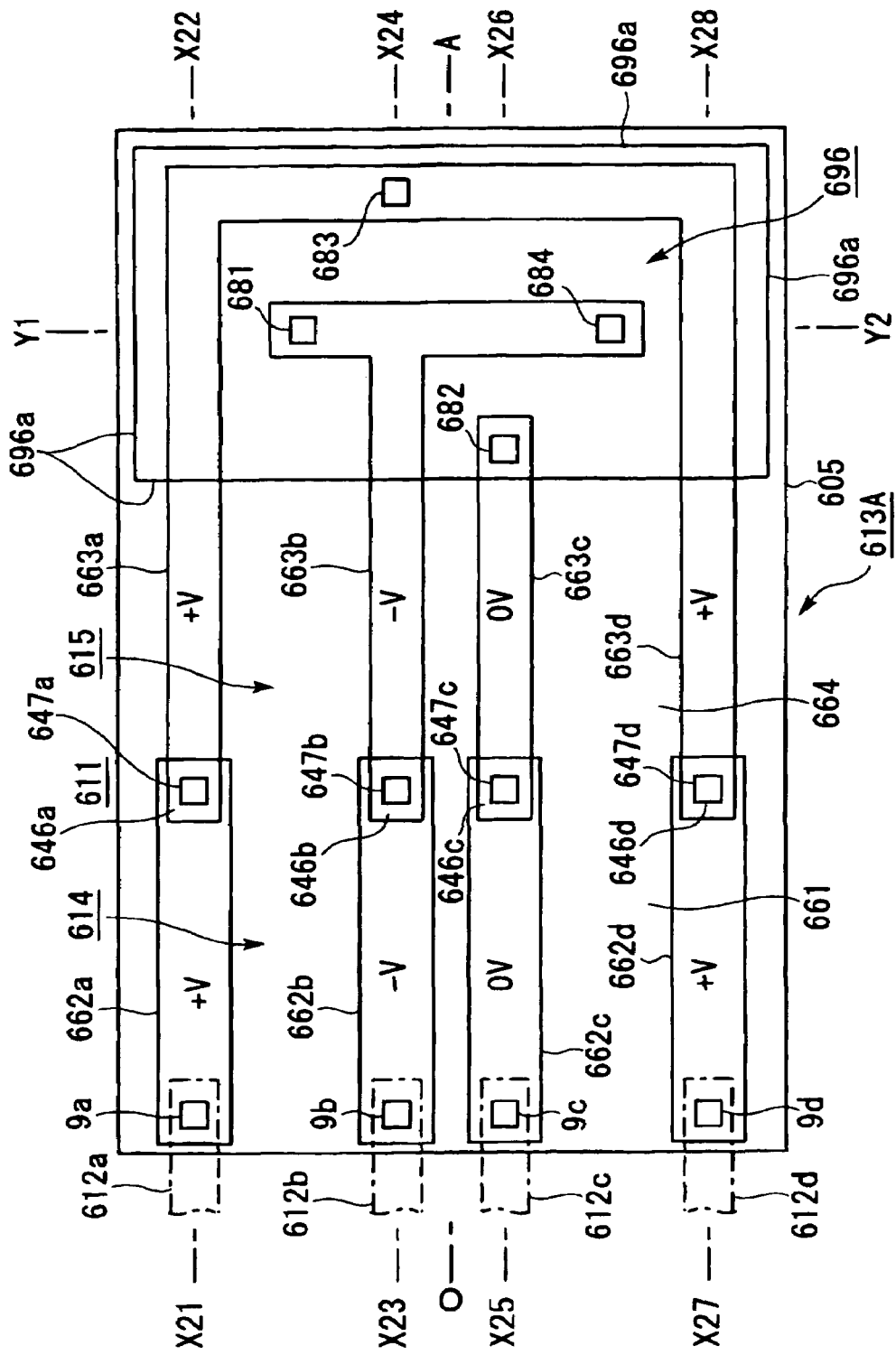
FIG. 34 is a schematic plan view which shows in model form the lower portion of a unit element of a mirror device constituting a seventeenth embodiment of the present invention.
Figure 35:
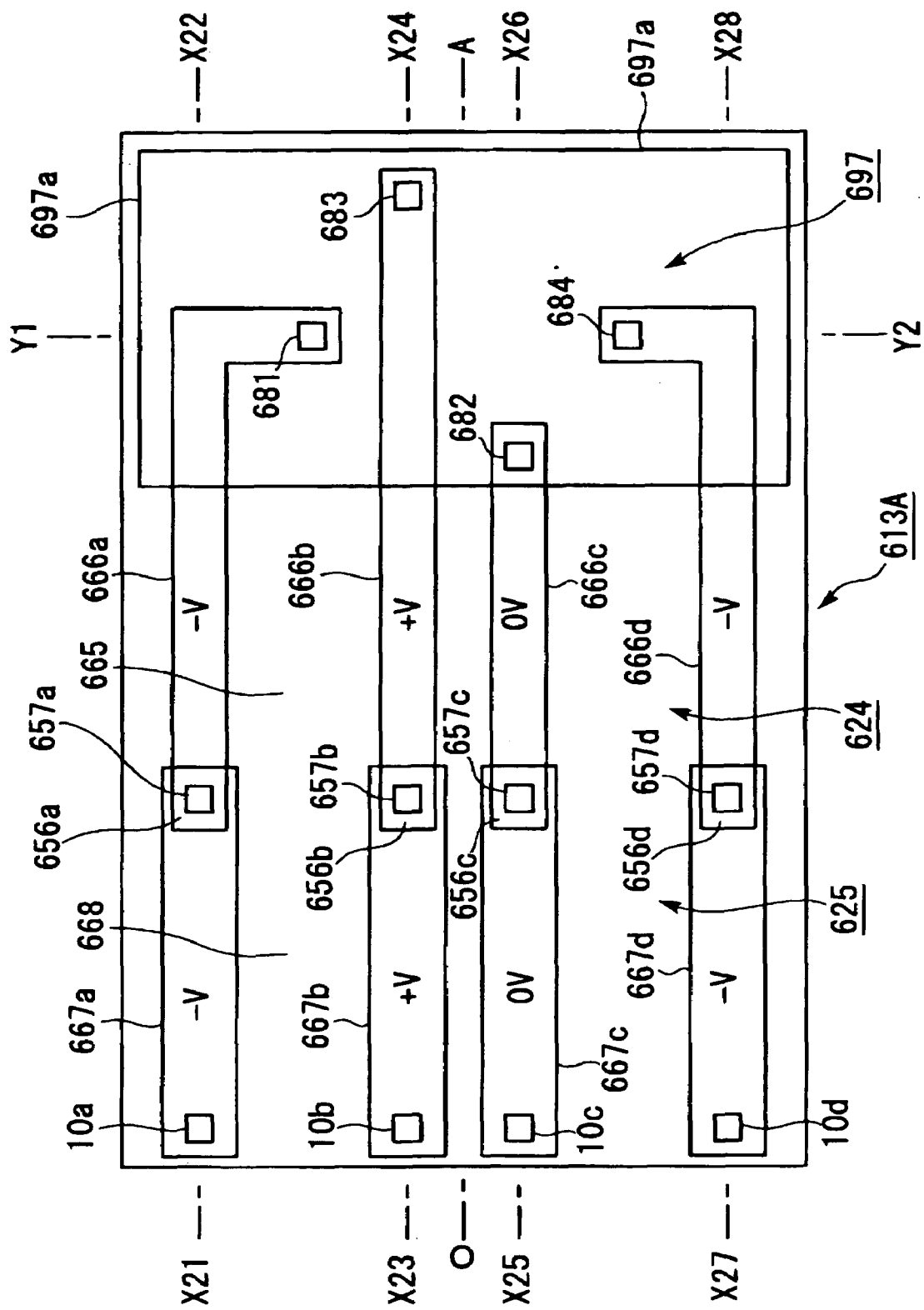
FIG. 35 is a schematic plan view showing in model form the upper portion of the unit element of the mirror device constituting the seventeenth embodiment of the present invention.
Figure 36:
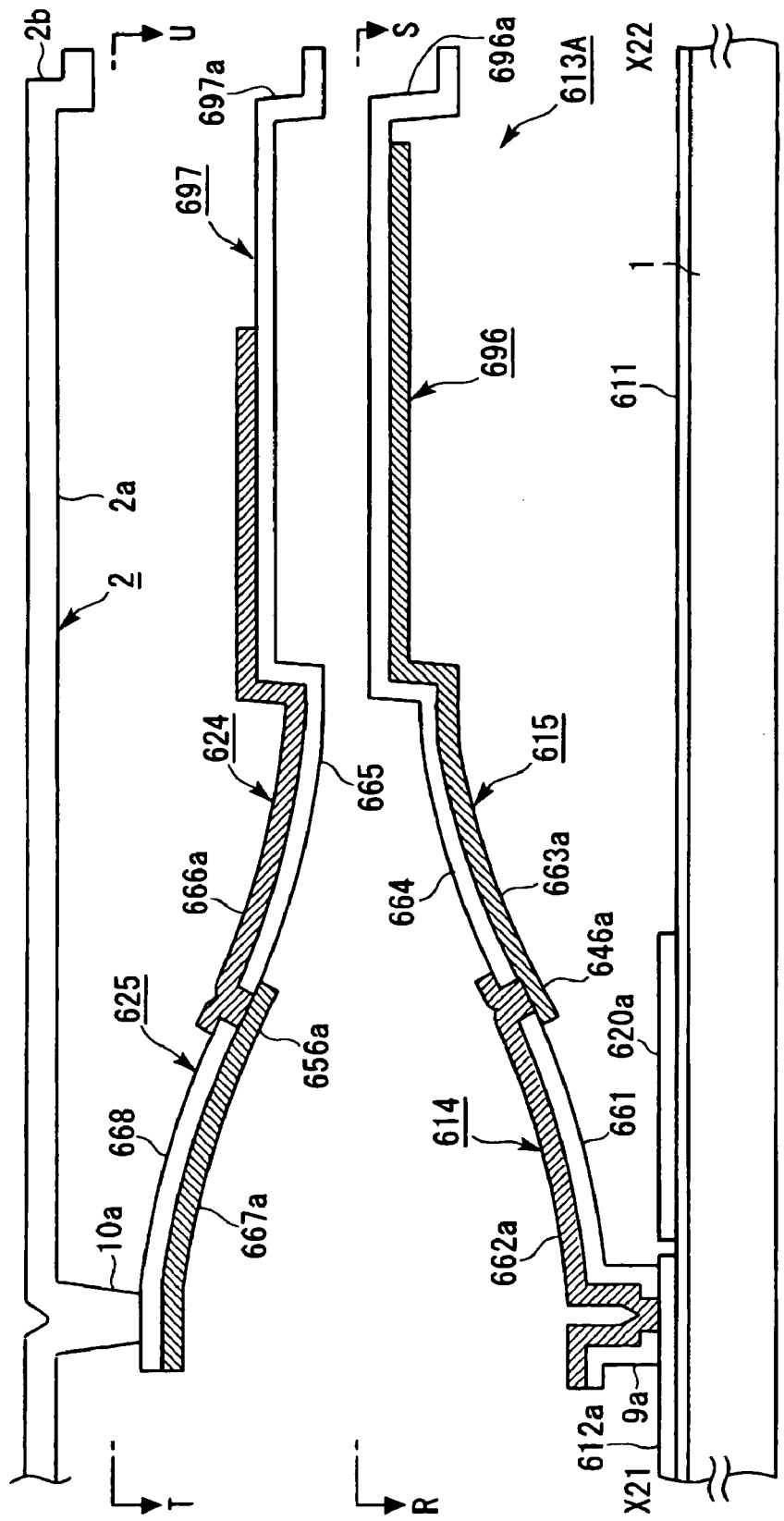
FIG. 36 is a schematic sectional view along line X21–X22 in FIGS. 34 and 35.
Figure 37:
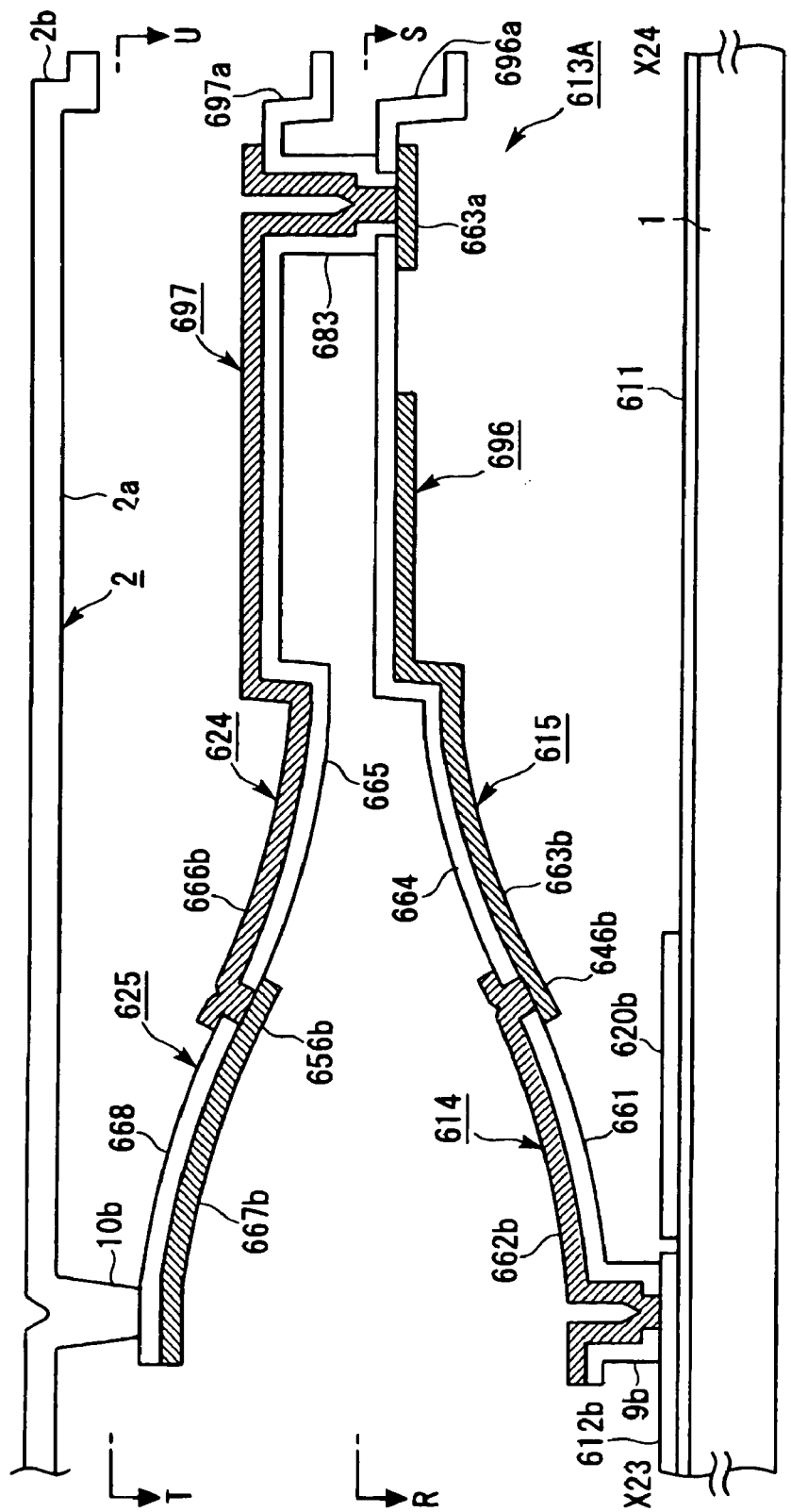
FIG. 37 is a schematic sectional view along line X23–X24 in FIGS. 34 and 35.
Figure 38:
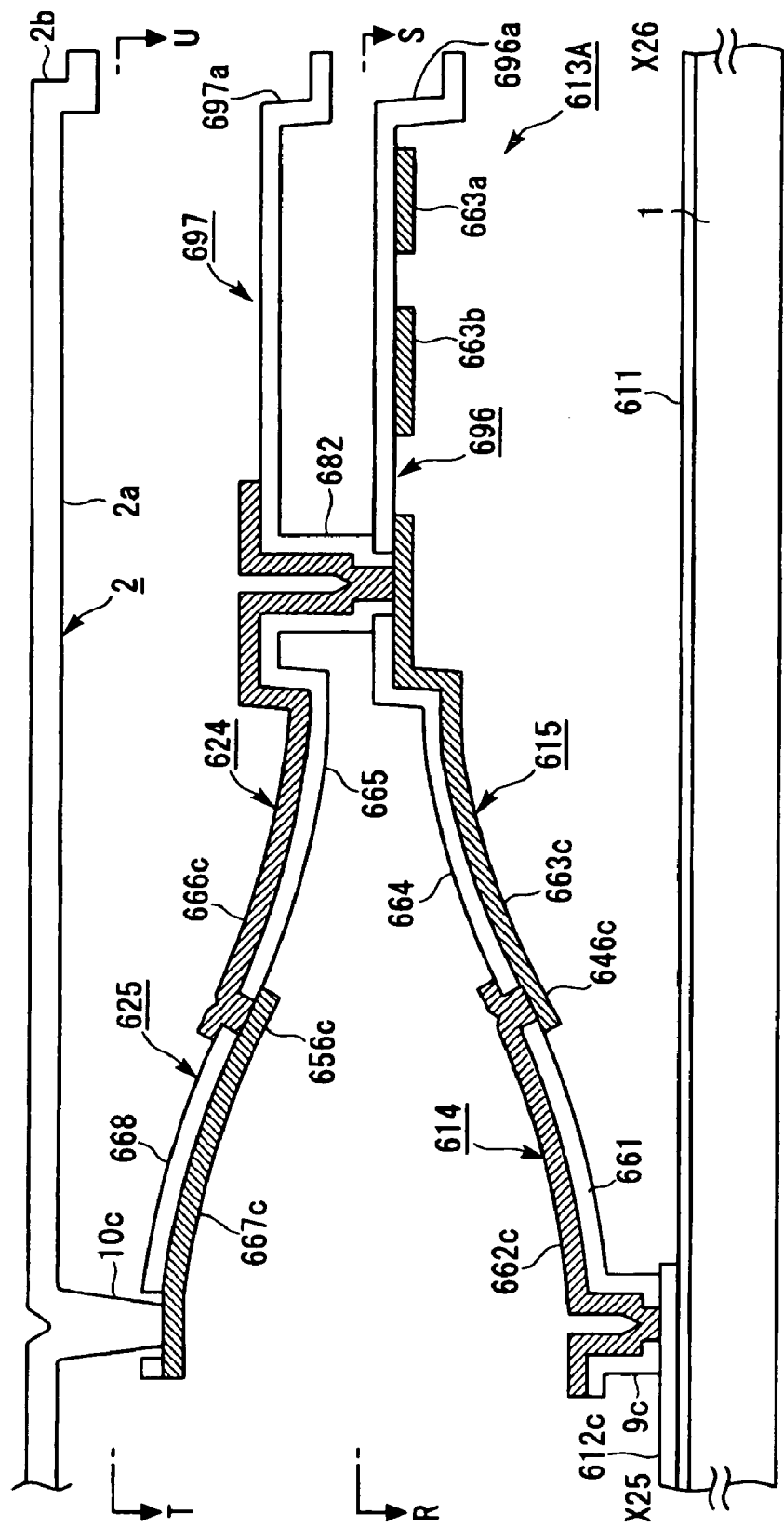
FIG. 38 is a schematic sectional view along line X25–X26 in FIGS. 34 and 35.
Figure 39:
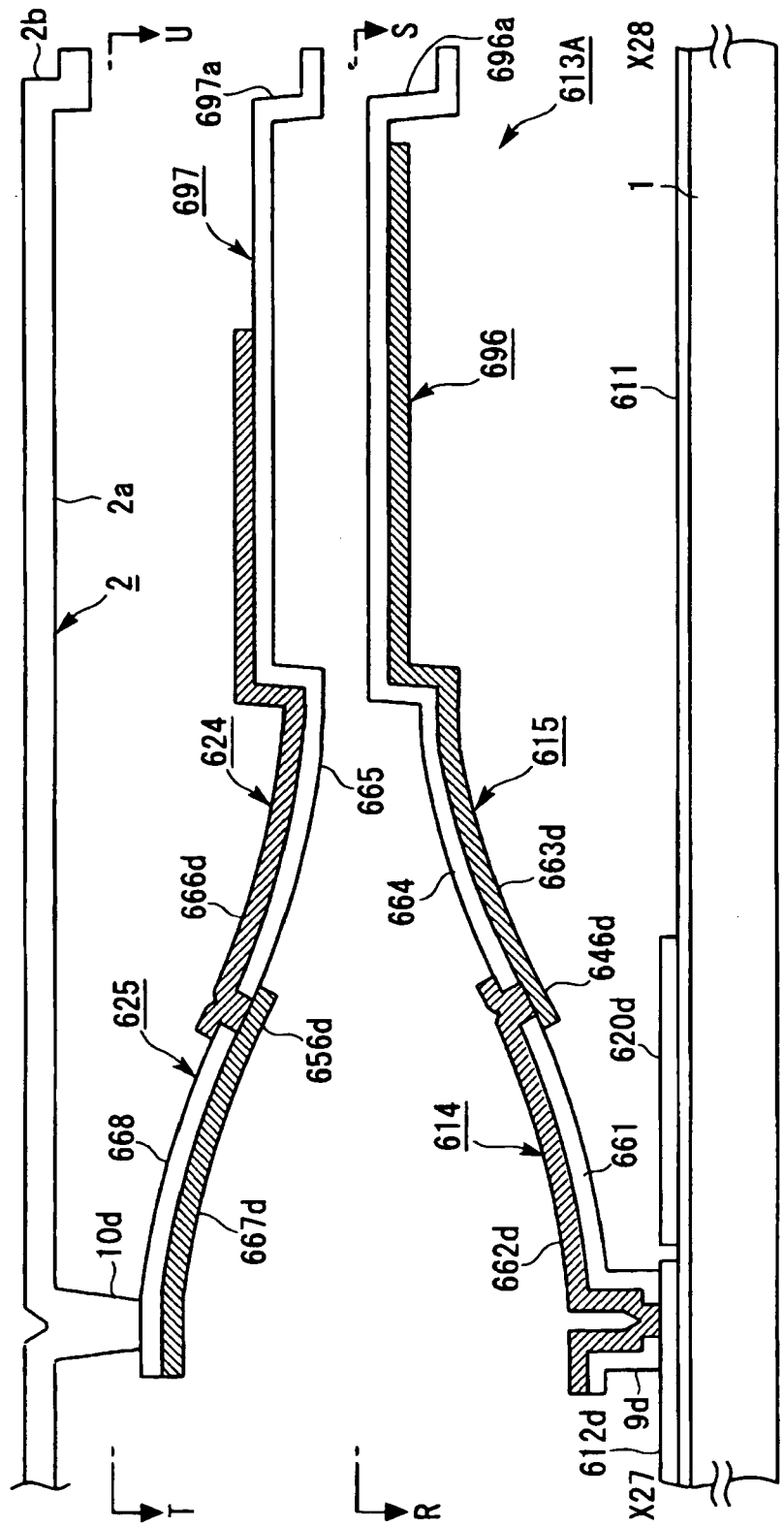
FIG. 39 is a schematic sectional view along line X27–X28 in FIGS. 34 and 35.
Figure 40:
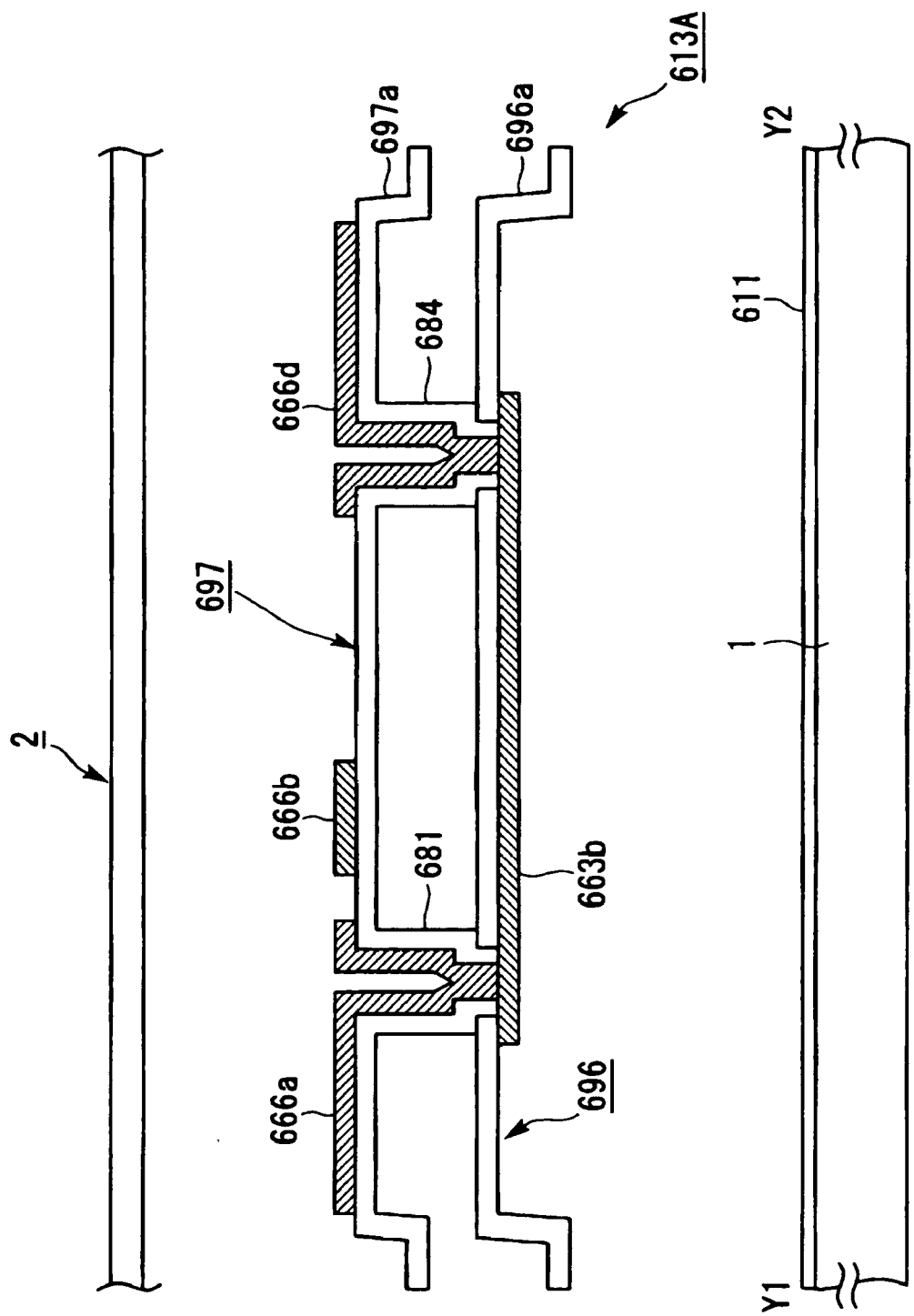
FIG. 40 is a schematic sectional view along line Y1–Y2 in FIGS. 34 and 35.

FIG. 34 is a schematic plan view which shows in model form the lower-side portion (portion on the side of the substrate 1) of a unit element of a mirror device constituting a seventeenth embodiment of the present invention. This figure corresponds to the arrow view along the line R-S in FIGS. 36 through 39. For convenience of graphic illustration, a portion of the element is indicated by imaginary lines in FIG. 34. FIG. 35 is a schematic plan view which shows in model form the upper-side portion (portion on the opposite side from the substrate 1, excluding the mirror 2) of the above-mentioned unit element of the mirror device constituting the seventeenth embodiment of the present invention. This figure corresponds to the arrow view along the line T-U in FIGS. 36 through 39. FIG. 36 is a schematic sectional view along the line X21–X22 in FIGS. 34 and 35. FIG. 37 is a schematic sectional view along the line X23–X24 in FIGS. 34 and 35. FIG. 38 is a schematic sectional view along the line X25–X26 in FIGS. 34 and 35. FIG. 39 is a schematic sectional view along the line X27–X28 in FIGS. 34 and 35. FIG. 40 is a schematic sectional view along the line Y1–Y2 in FIGS. 34 and 35.

In FIGS. 34 through 40, elements that are the same as elements in FIGS. 20 and 21, or that correspond to elements in FIGS. 20 and 21, are labeled with the same symbols, and a redundant description is omitted.

The present embodiment differs from the above-mentioned thirteenth embodiment only in that the supporting part 3A shown in FIG. 20 is replaced by the supporting part 613A shown in FIGS. 34 through 40, in that the supporting parts 3B and 3C shown in FIG. 20 are respectively replaced by supporting parts (not shown in the figures) which have the same structure as that of the supporting part 613A shown in FIGS. 34 through 40, in that an insulating film 611 consisting of SiN, etc., is formed over the entire surface of the substrate 1, and in that wiring patterns 612*a* through 612*d* which are electrically insulated from each other, and Al films 620*a*, 620*b* and 620*d* which are used as electrodes on the side of the substrate 1, etc., are formed on the surface of the insulating film 611. The supporting part 613A constitutes a thin-film elastic structural body.

The supporting part 613A has a structure that is basically the same as that of the supporting part 93A of the mirror device constituting the above-mentioned eleventh embodiment shown in FIG. 17. This structure is modified so that an electrostatic force used as a driving force to incline the mirror 2 is caused to act on the respective plate spring parts 614, 615, 624 and 625.

The plate spring parts 614, 615, 624 and 625 respectively correspond to the plate spring parts 184, 185, 194 and 195 shown in FIG. 17, and the mechanical connection relationships, upper and lower relationships of the Al films and SiN films, and setting of the bending and lengths, etc., are the same. The Al films are conductive thin films. The main differences between the two embodiments are as follows: the Al films constituting respective parts of the plate spring parts 614, 615, 624 and 625 are split into four parts in the direction of width, so that four leg parts 9*a* through 9*d* corresponding to the leg part 9 shown in FIG. 17, four connecting parts 646*a* through 646*d* corresponding to the connecting part 186 shown in FIG. 17, four connecting parts 656*a* through 656*d* corresponding to the connecting part 196 shown in FIG. 17, and four connecting parts 10a through 10d corresponding to the connecting part 10 shown in FIG. 17, are provided, and the end portions of the plate spring parts 615 and 624 are connected to each other.

The plate spring part 614 is constructed from a two-layer thin film (only one layer in locations where the Al films 662a through 662d are not formed) in which a lower-side SiN film 661 and upper side Al films 662a through 662d split into four parts are laminated.

The leg part 9a is constructed by extending "as is" the SiN film 661 and Al film 662a that constitute the plate spring part 614. The Al film 662a is electrically connected to the wiring pattern 612a via an opening formed in the SiN film 661 in the leg part 9a. The leg part 9b is constructed by extending "as is" the SiN film 661 and Al film 662b that constitute the plate spring part 614. The Al film 662b is electrically connected to the wiring pattern 612b via an opening formed in the SiN film 661 in the leg part 9b. The leg part 9c is constructed by extending "as is" the SIN film 661 and Al film 662c that constitute the plate spring part 614. The Al film 662c is electrically connected to the wiring pattern 612c via an opening formed in the SiN film 661 in the leg part 9c. The leg part 9d is constructed by extending "as is" the SiN film 661 and Al film 662d that constitute the plate spring part 614. The Al film 662d is electrically connected to the wiring pattern 612d via an opening formed in the SiN film 661 in the leg part 9d.

The Al films 662a, 662b and 662d form electrodes which are used to cause an electrostatic force to act on the plate spring part 614 that has these Al films. The Al film 662c forms a simple wiring pattern which is used to maintain the potential of the mirror 2 at a specified potential.

Furthermore, since the SiN film 661 of the plate spring part 614, the SIN film 664 of the plate spring part 615 (described later) and the SiN film that constitutes the connecting part 696 (described later) form a single continuous SIN film, this single continuous SiN film is indicated by the symbol 605 in FIG. 34.

The plate spring part 615 is constructed from a two-layer thin film (only one layer in locations where the Al films 663a through 663d are not formed) in which lower-side Al films 663a through 663d split into four parts and an upper-side SiN film 664 are laminated. The connecting part 646a is the portion where the Al films 662a and 663a overlap with each other; the Al films 662a and 663a are electrically connected via an opening 647a formed in the SiN film 605 in the connecting part 646a. The connecting part 646b is the portion where the Al films 662b and 663b overlap with each other; the Al films 662b and 663b are electrically connected via an opening 647b formed in the SIN film 605 in the connecting part 646b. The connecting part 646c is the portion where the Al films 662c and 663c overlap with each other; the Al films 662c and 663c are electrically connected via an opening 647c formed in the SiN film 605 in the connecting part 646c. The connecting part 646d is the portion where the Al films 662d and 663d overlap with each other; the Al films 662d and 663d are electrically connected via an opening 647d formed in the SiN film 605 in the connecting part 646d.

The Al films 663a, 663b and 663d form electrodes which are used to cause an electrostatic force to act on the plate spring part 615 that has these films. The Al film 663c forms a simple wiring pattern which is used to maintain the mirror 2 at a specified potential.

A connecting part 696 is mechanically connected to the opposite end portion of the plate spring part 615 from the connecting parts 646a through 646d. The connecting part 696 is constructed in the form of a flat plate by extending "as is" the SiN film 664 that constitutes the plate spring part 615. A dropping part 696a is formed around the entire periphery of the connecting part 696; as a result, the rigidity of the connecting part 696 is increased.

The plate spring part 624 is constructed from a two-layer thin film (only one layer in locations where the Al films 666a through 666d are not formed) in which a lower-side SiN film 665 and upper-side Al films 66a through 666d split into four parts are laminated. The Al films 666a, 666b and 666d form electrodes which are used to cause an electrostatic force to act on the plate spring part 624 that has these Al films. The Al film 666c forms a simple wiring pattern which is used to maintain the potential of the mirror 2 at a specified potential.

The plate spring part 625 is constructed from a two-layer thin film (only one layer in locations where the Al films 667a through 667d are not formed) in which lower-side Al films 667a through 667d split into four parts and an upper-side SiN film 668 are laminated. The Al films 667a, 667b and 667d form electrodes which are used to cause an electrostatic force to act on the plate spring part 625 that has these Al films. The Al film 667c forms a simple wiring pattern which is used to maintain the potential of the mirror 2 at a specified potential.

The connecting part 656a is the portion where the Al films 666a and 667a overlap with each other; the Al films 666a and 667a are electrically connected via an opening 657a formed in the SiN film 605 in the connecting part 656a. The connecting part 656b is the portion where the Al films 666b and 667b overlap with each other; the Al films 666b and 667b are electrically connected via an opening 657b formed in the SiN film 605 in the connecting part 656b. The connecting part 656c is the portion where the Al films 666c and 667c overlap with each other; the Al films 666c and 667c are electrically connected via an opening 657c formed in the SiN film 605 in the connecting part 656c. The connecting part 656d is the portion where the Al films 666d and 667d overlap with each other; the Al films 666d and 667d are electrically connected via an opening 657d formed in the SiN film 605 in the connecting part 656d.

The connecting parts 10a, 10b and 10d are respectively fastened to the surface of the SiN film 668 of the plate spring part 625, so that the mirror 2 is electrically insulated from the Al films 667a, 667b and 667d of the plate spring part 625 by the SiN film 668. Meanwhile, the connecting part 10c is fastened to the surface of the Al film 667c of the plate spring part 625 via an opening formed in the SiN film 668, so that the mirror 2 is electrically connected to the Al film 667c. As a result, the mirror 2 is also used as an electrode which generates an electrostatic force between itself and the Al films 667a, 667b and 667d constituting the electrodes of the plate spring part 625.

A connecting part 697 is mechanically connected to the opposite end portion of the plate spring part 624 from the connecting parts 656a through 656d. The connecting part 697 is constructed in the form of a flat plate by extending "as is" the SiN film 665 that constitutes the plate spring part 624. A dropping part 697a is formed around the entire periphery of the connecting part 697; as a result, the rigidity of the connecting part 697 is increased.

The connecting part 696 and connecting part 697 are mechanically connected by connecting parts 681 through 684 so that the connecting part 696 and connecting part 697 face each other across a gap. The connecting part 681 is constructed by extending "as is" the SiN film that constitutes the connecting part 697 and the Al film 666a that constitutes the plate spring part 624. The Al film 663b that constitutes the plate spring part 615 extends to the location of the connecting part 681 in the connecting part 696. The Al films 666a and 663b are electrically connected via an opening formed in the SiN film in the connecting part 681.

The connecting part 682 is constructed by extending "as is" the SiN film that constitutes the connecting part 697 and the Al film 666c that constitutes the plate spring part 624. The Al film 663c that constitutes the plate spring part 615 extends to the location of the connecting part 682 in the connecting part 696. The Al films 666c and 663c are electrically connected via an opening formed in the SiN film in the connecting part 682.

The connecting part 683 is constructed by extending "as is" the SiN film that constitutes the connecting part 697 and the Al film 666b that constitutes the plate spring part 624. The Al films 663a and 663d that constitute the plate spring part 615 extend to the location of the connecting part 683 in the connecting part 696. The Al films 666b, 663a and 663d are electrically connected via an opening formed in the SiN film in the connecting part 683.

The connecting part 684 is constructed by extending "as is" the SiN film that constitutes the connecting part 697 and the Al film 666d that constitutes the plate spring part 624. The Al film 663b that constitutes the plate spring part 615 extends to the location of the connecting part 684 in the connecting part 696. The Al films 666d and 663b are electrically connected via an opening formed in the SiN film in the connecting part 684.

Furthermore, Al films 620a, 620b and 620d which are used as electrodes that respectively generate an electrostatic force between these electrodes and the Al films 662a, 662b and 662d used as the electrodes of the plate spring part 614 are formed on the surface of the insulating film 611 of the substrate 1 in locations that face the Al films 662a, 662b and 662d beneath the Al films 662a, 662b and 662d. The Al films 620a, 620b and 620d are electrically connected to the wiring pattern 612c via wiring patterns not shown in the figures.

As is seen from the above description, the Al films 662a, 663a, 662d, 663d, 667b and 666b are electrically connected to the wiring patterns 612a and 612d, so that these Al films are at the same potential. Independently from this in electrical terms, the Al films 662b, 663b, 666a, 667a, 666d and 667d are electrically connected to the wiring pattern 612b, so that these Al films are at the same potential. Independently from both of these connections in electrical terms, the Al films 662c, 663c, 666c and 667c, the mirror 2 and the Al films 620a, 620b and 620d on the substrate 1 are electrically connected to the wiring pattern 612c, so that these parts are at the same potential.

The system is arranged so that potentials of respective arbitrary positive and negative levels with reference to the wiring pattern 612c (0 V) can be applied to the wiring patterns 612a (and 612d) and wiring patterns 612b of the respective supporting parts 613A through 613C independently for each of the supporting parts 613A through 613C.

Assuming that the potential of the wiring pattern 612c is set at 0 V, the potential of the wiring patterns 612a and 612d is set at +V3 and the potential of the wiring pattern 612b is set at −V3 in the supporting part 613A, then, since the above-mentioned electrical connection relationships are constructed, respective potential differences of V3 are applied across the Al films 662a, 662b and 662d of the plate spring part 614 and the Al films 620a, 620b and 620d on the substrate 1, so that a first electrostatic force acts between the plate spring part 614 and the substrate 1. Furthermore, respective potential differences of 2V3 are applied across the Al films 663a, 663b and 663d of the plate spring part 615 and the Al films 666a, 666b and 666d of the plate spring part 624, so that a second electrostatic force acts between the plate spring part 615 and the plate spring part 624. Moreover, respective potential differences of V3 are applied across the Al films 667a, 667b and 667d of the plate spring part 625 and the mirror 2, so that a third electrostatic force acts between the plate spring part 625 and the mirror 2.

As is also seen from FIGS. 36 through 38, the distance between the Al films 662a, 662b and 662d constituting the electrodes of the plate spring part 614 and the Al films 620a, 620b and 620d constituting the electrodes on the substrate 1, and the distance between the Al films 667a, 667b and 667d constituting the electrodes of the plate spring parts 625 and the mirror 2, are more or less equal. Furthermore, the distance between the Al films 663a, 663b and 663d constituting the electrodes of the plate spring part 615 and the Al films 666a, 666b and 666d constituting the electrodes of the plate spring part 624 is approximately twice the above-mentioned distance. However, since the above-mentioned first and third electrostatic forces depend on the potential difference V3, while the above-mentioned second electrostatic force depends on the potential difference 2V3 which is twice the potential difference V3, the effect of distance and the effect of the potential difference cancel each other, so that the first through third electrostatic forces are more or less equal. Accordingly, the electrostatic forces that act on the respective plate spring parts 614, 615, 624 and 625 are more or less equal; as a result, the load on the connecting parts 10a through 10d of the mirror 2 can be almost eliminated.

Consequently, advantages similar to those of the above-mentioned fourteenth embodiment can also be obtained in the present embodiment.

[Eighteenth Embodiment]

Figure 19:
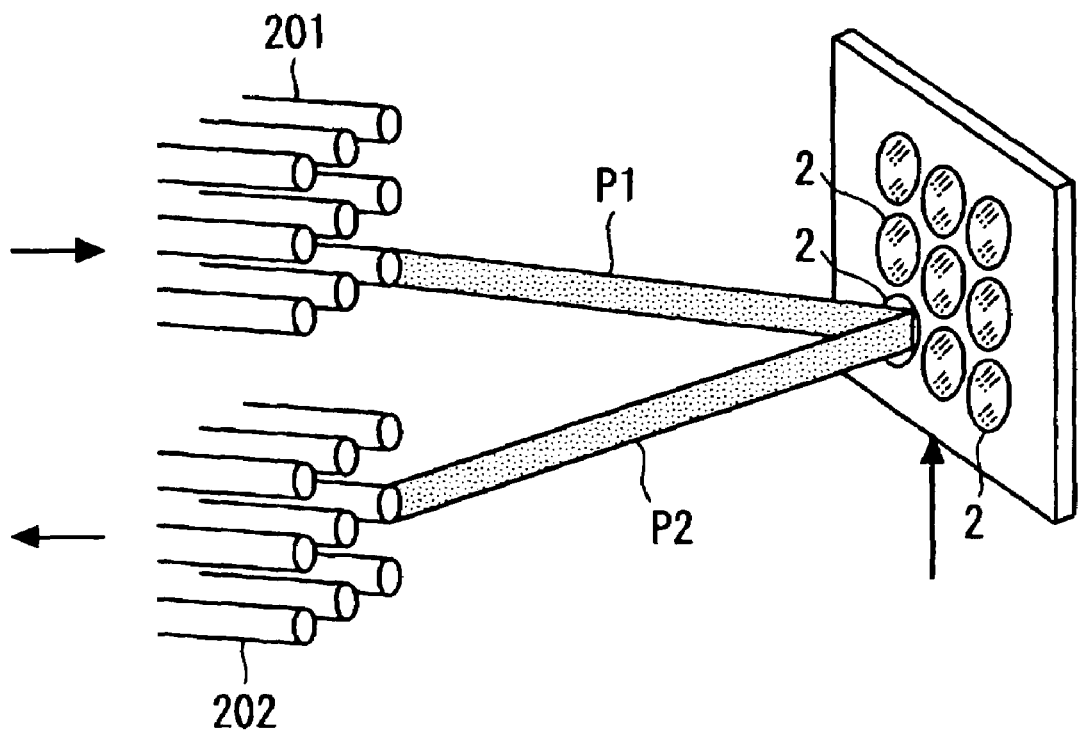
FIG. 19 is a schematic structural diagram which shows an optical switch constituting a thirteenth embodiment of the present invention.

FIG. 19 is a schematic structural diagram which shows an optical switch constituting an eighteenth embodiment of the present invention.

The optical switch of the present embodiment includes a mirror device 200 constituting one of the above-mentioned first through seventeenth embodiments; here, light that is emitted from a plurality of optical-input optical fibers 201 disposed in two dimensions may be caused to enter any of a plurality of optical-output optical fibers 202.

The light emitted from the plurality of optical-input optical fibers 201 is caused to be incident on the mirrors 2 of the respective elements of the mirror device 200. In order to effect this incidence of light, optical systems such as lenses may be disposed between the plurality of optical-input optical fibers 201 and the mirror device 200 as needed.

In the mirror device 200, driving signals (potential differences in the present embodiment) are applied across the mirrors 2 (used as electrodes) and electrodes 4a, 4b and 4c of the respective elements in accordance with control signals (indicated by the upward oriented arrow) designating the light-path switching state, and the above-mentioned mirrors are inclined with respect to the above-mentioned substrate in directions and by amounts corresponding to these driving signals. As a result, the direction of advance of the light following reflection by the mirrors 2 is deflected, so that the light is caused to enter the optical-output optical fibers 202 in the corresponding locations.

In FIG. 19, P1 indicates input light that is caused to be incident on the mirror 2 of a certain element from a certain optical-input optical fiber 201, and P2 indicates output light that is reflected by this mirror 2 and caused to enter a certain optical-output optical fiber 202.

In the present embodiment, since a mirror device 200 constituting one of the above-mentioned first through twelfth embodiments is used, switching to numerous output light paths can be accomplished using a number of mirrors 2 that is the same as the number of input light paths; for example, the switching of 1,000 input light paths to 1,000 output light paths can be accomplished using 1,000 mirrors 2. Accordingly, in the present embodiment, the number of mirrors 2 required can be reduced, so that compactness and mass production characteristics can be greatly improved compared to a mechanical-type optical switch using the above-mentioned conventional MEMS technology. Of course, since light paths are switched using mirrors 2, this optical switch is superior to electronic-type optical switches in terms of optical characteristics such as insertion loss and crosstalk.

Respective embodiments of the present invention have been described above; however, the scope of the present invention is not limited to these embodiments.

For example, in the respective embodiments described above, in cases where the supporting mechanism had a plurality of supporting parts, all of these supporting parts had the same structure; however, it is not absolutely necessary that the respective supporting parts have the same structure.

Furthermore, the use of the thin-film elastic structural body of the present invention is not limited to a mirror device. Moreover, the use of the mirror device of the present invention is not limited to an optical switch.

INDUSTRIAL APPLICABILITY

The optical switch of the present invention can be used, for example, in optical communication devices and light transmitting devices. Furthermore, the mirror device of the present invention can be used as a constituent part of the optical switch of the present invention. Moreover, the thin-film elastic structural body of the present invention can also be used as a constituent part of the optical switch of the present invention.

The invention claimed is:

1. A thin-film elastic structural body comprising:
   a plurality of plate spring parts constructed from thin films having one or more layers, and in which the plurality of plate spring parts are mechanically connected so that a single elastic body is formed
   one end portion of at least one of the plurality of plate spring parts being mechanically connected to a substrate via a leg part which has a rising part that extends from the substrate,
   an other end portion of the at least one plate spring part being mechanically connected to one end portion of at least one other plate spring part via a connecting part which extends from the other end portion of the at least one plate spring part,
   the other end portion of the at least one plate spring part being bent away from the substrate, and
   the one end of the at least one other plate spring part being bent toward the substrate,
   wherein the at least one other plate spring part extends in a direction away from the mechanical connection of the one end of the at least one plate spring rart to the substrate.

2. The thin-film elastic structural body according to claim 1, wherein the shape formed by the plurality of plate spring parts overall is a shallow "V" shape, or a shape including connected shallow "V" shapes, i.e., a zig-zag shape, as seen in a side view of the overall assembly from the same direction, or as seen in side views from appropriate specified directions for each portion of the assembly.

3. The thin-film elastic structural body according to claim 1 wherein the shape formed by the plurality of plate spring parts overall is a spiral shape which constitutes an arbitrary shape as seen in a plan view from the normal direction of the plane of the substrate.

4. A thin-film elastic structural body comprising:
   a plurality of plate spring parts constructed from thin films having one or more layers, and in which the plurality of plate spring parts are mechanically connected so that a single elastic body is formed,
   one end portion of at least one of the plurality of plate spring parts being mechanically connected to a substrate via a leg part which has a rising part that extends from the substrate,
   an other end portion of the at least one plate spring part being mechanically connected to one end portion of at least one other plate spring part via a connecting part which extends from the other end portion of the at least one plate spring part,
   the other end portion of the at least one plate spring part being bent away from the substrate, and
   the one end of the at least one other plate spring part being bent toward the substrate,
   wherein the at least one other plate spring part extends in a direction away from the mechanical connection of the one end of the at least one plate spring part to the substrate,
   wherein at least one plate spring part among the plurality of plate spring parts is deformed by a driving signal, and
   wherein the at least one plate spring part is bent away from the substrate when the driving signal is not supplied thereto.

5. The thin-film elastic structural body according to claim 4, wherein the shape formed by the plurality of plate spring parts overall is a shallow "V" shape, or a shape including connected shallow "V" shapes, i.e., a zig-zig shape, as seen in a side view of the overall assembly from the same direction, or as seen in side views from appropriate specified directions for each portion of the assembly.

6. The thin-film elastic structural body according to claim 4 or 5, wherein the shape formed by the plurality of plate spring parts overall is a spiral shape which constitutes an arbitrary shape as seen in a plan view from the normal direction of the plane of the substrate.

7. A method for manufacturing the thin-film elastic structural body according to any one of claims 1, 2, 3, 4 and 5 comprising:
   a step in which a thin film having one or more layers that is used to form at least one plate spring part of the plurality of plate spring parts is formed on a sacrificial layer that is formed on a substrate, and in which the thin film is formed under conditions which are such that the thin film bends when the sacrificial layer surrounding the thin film is removed, and
   a step in which the sacrificial layer is removed.

* * * * *